(12) United States Patent
Nakamura et al.

(10) Patent No.: US 12,382,555 B2
(45) Date of Patent: Aug. 5, 2025

(54) FUNCTIONAL PANEL, DISPLAY DEVICE, INPUT/OUTPUT DEVICE, AND DATA PROCESSING DEVICE

(71) Applicant: Semiconductor Energy Laboratory Co., Ltd., Kanagawa-ken (JP)

(72) Inventors: Daiki Nakamura, Kanagawa (JP); Tomoya Aoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 18/672,324

(22) Filed: May 23, 2024

(65) Prior Publication Data

US 2024/0314898 A1    Sep. 19, 2024

Related U.S. Application Data

(63) Continuation of application No. 17/762,505, filed as application No. PCT/IB2020/058977 on Sep. 25, 2020, now Pat. No. 11,997,766.

(30) Foreign Application Priority Data

Oct. 11, 2019  (JP) ................................ 2019-187631

(51) Int. Cl.
*G02F 1/1335*    (2006.01)
*G02F 1/1339*    (2006.01)
(Continued)

(52) U.S. Cl.
CPC ....... *H05B 33/14* (2013.01); *G02F 1/133526* (2013.01); *G02F 1/1339* (2013.01); *H05B 33/04* (2013.01)

(58) Field of Classification Search
CPC ........ H05B 33/14; H05B 33/04; H05B 33/02; H05B 33/06; H05B 33/22;
(Continued)

(56) References Cited

U.S. PATENT DOCUMENTS 5,107,175 A    4/1992  Hirano et al.
5,124,204 A    6/1992  Yamashita et al.
(Continued)

FOREIGN PATENT DOCUMENTS

CN    105280672 A    1/2016
CN    109388292 A    2/2019
(Continued)

OTHER PUBLICATIONS

English Machine Translation of WO 2009063779, Kikuchi et al, 9Abstract Only Availableo (Year: 2024).*
(Continued)

*Primary Examiner* — Donald L Raleigh
(74) *Attorney, Agent, or Firm* — Husch Blackwell LLP

(57) ABSTRACT

A functional panel comprises a convex lens, an insulating film, a first region configured to emit first light of a first light emitting element, and a second region configured to emit second light of a second light emitting element. The insulating film is interposed between the convex lens and at least one of the first region and the second region; the convex lens and the first region overlap each other; the convex lens and the second region overlap each other; the convex lens has a first length in a first direction; the convex lens has a second length in a second direction; the second direction is perpendicular to the first direction; the first length is larger than the second length; and the first region and the second region are aligned in the first direction.

16 Claims, 30 Drawing Sheets

(51) Int. Cl.
*H05B 33/04* (2006.01)
*H05B 33/14* (2006.01)

(58) Field of Classification Search
CPC ... G02F 1/133526; G02F 1/1339; G02B 3/00; G09F 9/00; G09F 9/30; H10K 59/121
See application file for complete search history.

(56) References Cited

U.S. PATENT DOCUMENTS

| | | | |
|---|---|---|---|
| 5,189,405 A | 2/1993 | Yamashita et al. | |
| 5,315,377 A | 5/1994 | Isono et al. | |
| 5,317,349 A | 5/1994 | Vanderwerf | |
| 5,686,360 A | 11/1997 | Harvey, III et al. | |
| 5,693,956 A | 12/1997 | Shi et al. | |
| 5,771,562 A | 6/1998 | Harvey, III et al. | |
| 5,811,177 A | 9/1998 | Shi et al. | |
| 5,952,778 A | 9/1999 | Haskal et al. | |
| 5,962,962 A | 10/1999 | Fujita et al. | |
| 6,144,426 A | 11/2000 | Yamazaki et al. | |
| 6,146,225 A | 11/2000 | Sheats et al. | |
| 6,150,187 A | 11/2000 | Zyung et al. | |
| 6,198,217 B1 | 3/2001 | Suzuki et al. | |
| 6,198,220 B1 | 3/2001 | Jones et al. | |
| 6,219,113 B1 | 4/2001 | Takahara | |
| 6,268,695 B1 | 7/2001 | Affinito | |
| 6,274,887 B1 | 8/2001 | Yamazaki et al. | |
| 6,407,785 B1 | 6/2002 | Yamazaki | |
| 6,771,021 B2 | 8/2004 | Cok | |
| 6,847,163 B1 | 1/2005 | Tsutsui et al. | |
| 6,856,304 B1 | 2/2005 | Hirakata et al. | |
| 6,965,195 B2 | 11/2005 | Yamazaki et al. | |
| 6,987,613 B2 | 1/2006 | Pocius et al. | |
| 7,002,659 B1 | 2/2006 | Yamazaki et al. | |
| 7,068,246 B2 | 6/2006 | Yamazaki et al. | |
| 7,144,752 B2 | 12/2006 | Yotsuya | |
| 7,182,481 B2 | 2/2007 | Shimura | |
| 7,202,504 B2 | 4/2007 | Ikeda et al. | |
| 7,245,429 B2 | 7/2007 | Yoshikawa et al. | |
| 7,473,928 B1 | 1/2009 | Yamazaki et al. | |
| 7,515,125 B2 | 4/2009 | Yamazaki et al. | |
| 7,554,263 B2 | 6/2009 | Takahashi | |
| 7,663,312 B2 | 2/2010 | Anandan | |
| 7,692,199 B2 | 4/2010 | Arai | |
| 7,722,965 B2 | 5/2010 | Juni et al. | |
| 7,755,097 B2 | 7/2010 | Kim | |
| 7,859,627 B2 | 12/2010 | Nishida et al. | |
| 7,956,349 B2 | 6/2011 | Tsutsui et al. | |
| 8,003,993 B2 | 8/2011 | Cho et al. | |
| 8,042,975 B2 | 10/2011 | Shyu et al. | |
| 8,455,884 B2 | 6/2013 | Ikeda et al. | |
| 8,496,341 B2 | 7/2013 | Kawata et al. | |
| 8,569,783 B2 | 10/2013 | Aoyama et al. | |
| 8,625,058 B2 | 1/2014 | Kozuma et al. | |
| 8,665,357 B2 | 3/2014 | Ishiguro et al. | |
| 8,686,630 B2 | 4/2014 | Hiyama et al. | |
| 8,764,504 B2 | 7/2014 | Hamatani et al. | |
| 8,853,724 B2 | 10/2014 | Seo et al. | |
| 9,142,802 B2 | 9/2015 | Miyamoto et al. | |
| 9,401,498 B2 | 7/2016 | Tanaka et al. | |
| 9,450,133 B2 | 9/2016 | Nakamura et al. | |
| 9,455,405 B2 | 9/2016 | Jung et al. | |
| 9,751,267 B2 | 9/2017 | Tanaka et al. | |
| 9,977,152 B2 | 5/2018 | Zhang et al. | |
| D857,068 S | 8/2019 | Hayakawa et al. | |
| 10,451,912 B2 | 10/2019 | Yamazaki et al. | |
| 10,644,083 B2 | 5/2020 | Lee et al. | |
| 10,683,233 B2 | 6/2020 | Nomura et al. | |
| 10,759,691 B2 | 9/2020 | Nomura et al. | |
| 11,024,651 B2 | 6/2021 | Matsusaki et al. | |
| 2001/0035713 A1 | 11/2001 | Kimura | |
| 2001/0053082 A1 | 12/2001 | Chipalkatti et al. | |
| 2002/0027229 A1 | 3/2002 | Yamazaki et al. | |
| 2003/0007359 A1 | 1/2003 | Sugawara et al. | |
| 2004/0169670 A1* | 9/2004 | Uehara | H04N 13/312 345/697 |
| 2004/0217702 A1 | 11/2004 | Garner et al. | |
| 2005/0142379 A1 | 6/2005 | Juni et al. | |
| 2005/0199599 A1 | 9/2005 | Li et al. | |
| 2005/0258436 A1 | 11/2005 | Arai | |
| 2006/0007552 A1 | 1/2006 | Takakuwa et al. | |
| 2006/0139953 A1 | 6/2006 | Chou et al. | |
| 2006/0237735 A1 | 10/2006 | Naulin et al. | |
| 2007/0222372 A1 | 9/2007 | Cok et al. | |
| 2008/0018231 A1 | 1/2008 | Hirakata | |
| 2008/0121918 A1 | 5/2008 | Denbaars et al. | |
| 2008/0129184 A1 | 6/2008 | Nishida et al. | |
| 2008/0129933 A1 | 6/2008 | Nishida et al. | |
| 2008/0130122 A1 | 6/2008 | Egi et al. | |
| 2008/0213931 A1 | 9/2008 | Asabe | |
| 2009/0079917 A1* | 3/2009 | Pan | G02F 1/136204 349/110 |
| 2009/0162623 A1 | 6/2009 | Foresti et al. | |
| 2010/0006882 A1 | 1/2010 | Arai | |
| 2010/0013372 A1 | 1/2010 | Oikawa et al. | |
| 2010/0019664 A1 | 1/2010 | Mishima | |
| 2010/0046236 A1 | 2/2010 | Nishiwaki | |
| 2010/0110551 A1 | 5/2010 | Lamansky et al. | |
| 2010/0134735 A1 | 6/2010 | Nakamura et al. | |
| 2010/0295443 A1 | 11/2010 | Roberts et al. | |
| 2011/0032409 A1 | 2/2011 | Rossi et al. | |
| 2011/0038028 A1 | 2/2011 | Dharmatilleke | |
| 2011/0134647 A1 | 6/2011 | Nishida et al. | |
| 2011/0147777 A1 | 6/2011 | Konno et al. | |
| 2011/0205468 A1 | 8/2011 | Hirakata et al. | |
| 2011/0210332 A1 | 9/2011 | Jintyou et al. | |
| 2012/0097982 A1 | 4/2012 | Wakimoto et al. | |
| 2012/0097991 A1 | 4/2012 | Ikeda et al. | |
| 2012/0099331 A1 | 4/2012 | Yamazaki et al. | |
| 2012/0126268 A1 | 5/2012 | Seo et al. | |
| 2012/0204566 A1 | 8/2012 | Hartzell et al. | |
| 2015/0084026 A1 | 3/2015 | Miyamoto et al. | |
| 2015/0124200 A1* | 5/2015 | Jiang | G02B 30/27 349/95 |
| 2015/0333108 A1 | 11/2015 | Miyamoto et al. | |
| 2016/0043145 A1 | 2/2016 | Choi et al. | |
| 2016/0132177 A1 | 5/2016 | Bae et al. | |
| 2017/0351364 A1 | 12/2017 | Kim et al. | |
| 2017/0355637 A1 | 12/2017 | Nomura et al. | |
| 2017/0372669 A1 | 12/2017 | Takesue et al. | |
| 2019/0051711 A1 | 2/2019 | Lee et al. | |
| 2019/0198573 A1 | 6/2019 | Kim et al. | |
| 2019/0329803 A1 | 10/2019 | Beier et al. | |
| 2019/0363107 A1 | 11/2019 | Matsusaki et al. | |
| 2020/0064528 A1 | 2/2020 | Uto et al. | |
| 2020/0365827 A1 | 11/2020 | Yamazaki et al. | |
| 2020/0388790 A1 | 12/2020 | Yamazaki et al. | |
| 2021/0335831 A1 | 10/2021 | Matsusaki et al. | |

FOREIGN PATENT DOCUMENTS

| | | | |
|---|---|---|---|
| EP | 1164641 A | 12/2001 | |
| EP | 3441858 A | 2/2019 | |
| JP | 2010-034074 A | 2/2010 | |
| JP | 2012-216454 A | 11/2012 | |
| JP | 2015-069700 A | 4/2015 | |
| JP | 2019-032811 A | 2/2019 | |
| KR | 2016-0010707 A | 1/2016 | |
| KR | 2019-0016635 A | 2/2019 | |
| TW | 201605028 | 2/2016 | |
| WO | WO-2009063779 A1 * | 5/2009 | ............ G02B 27/32 |
| WO | WO-2019/106480 | 6/2019 | |

OTHER PUBLICATIONS

International Search Report (Application No. PCT/IB2020/058977) Dated Dec. 22, 2020.
Written Opinion (Application No. PCT/IB2020/058977) Dated Dec. 22, 2020.
Reineke.S et al., "White organic light-emitting diodes with fluorescent tube efficiency", Nature, May 14, 2009, vol. 459, pp. 234-239.
Motoyama.Y et al., "High-efficiency OLED microdisplay with microlens array", J. Soc. Inf. Display (Journal of the Society for Information Display), Apr. 16, 2019, vol. 27, No. 6, pp. 354-360.

(56) References Cited

OTHER PUBLICATIONS

Park.Y et al., "A Highly Mass-producible Nano-lens Array Technology for Optically Efficient Full-color Organic Light Emitting Diode Display Applications", SID Digest '19 : SID International Symposium Digest of Technical Papers, May 12, 2019, vol. 50, No. 1, pp. 149-152.

Chen.C et al., "3D Pixel Configurations for Optical Out-Coupling of OLED Displays—Part II:Experimental Validation", SID Digest '19 : SID International Symposium Digest of Technical Papers, May 12, 2019, vol. 50, No. 1, pp. 145-148.

Hwang.C et al., "Unique Belt Plane Source Evaporation Techniques for the Mass Production of 2250ppi AMOLED and 77" QD OLED TV, SID Digest '19 : SID International Symposium Digest of Technical Papers, May 12, 2019, vol. 50, No. 1, pp. 949-952.

\* cited by examiner

FIG. 29A
FIG. 29B
FIG. 29C
FIG. 29D
FIG. 29E
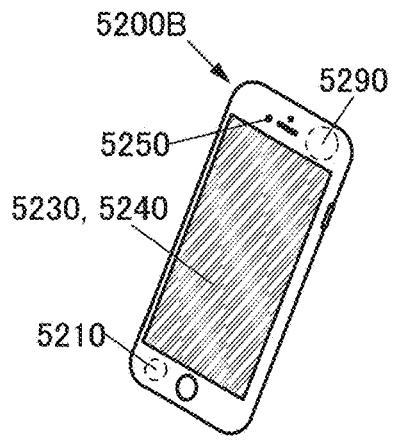
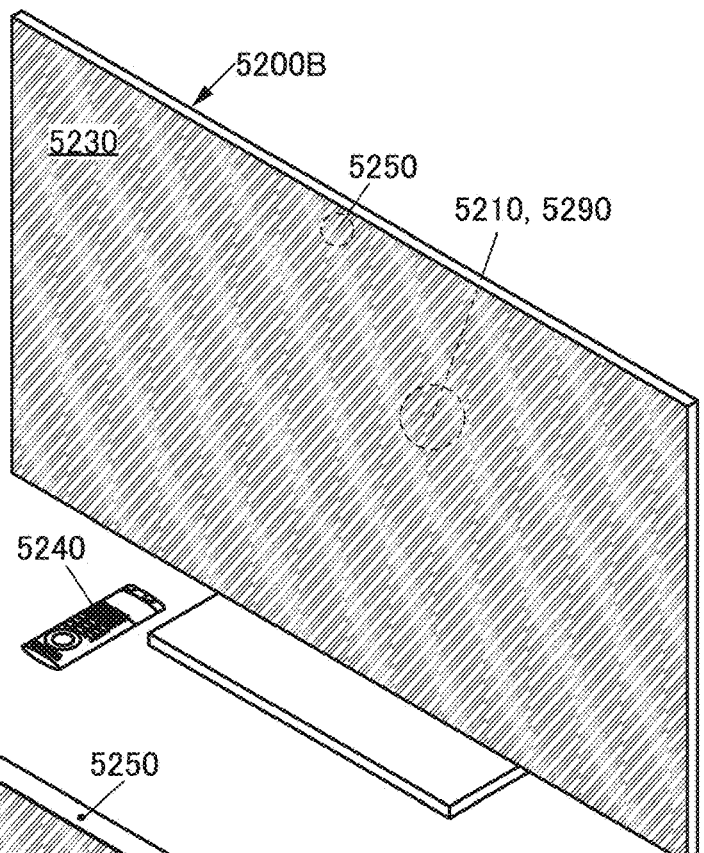
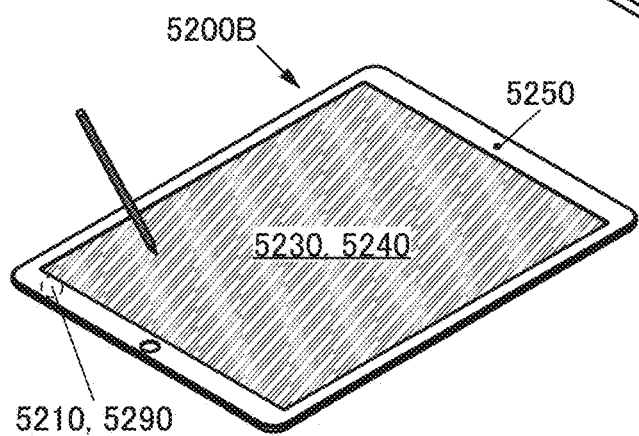
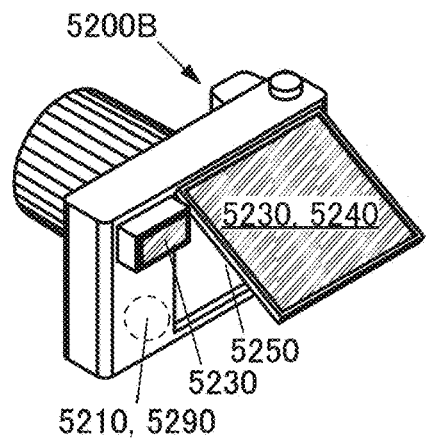
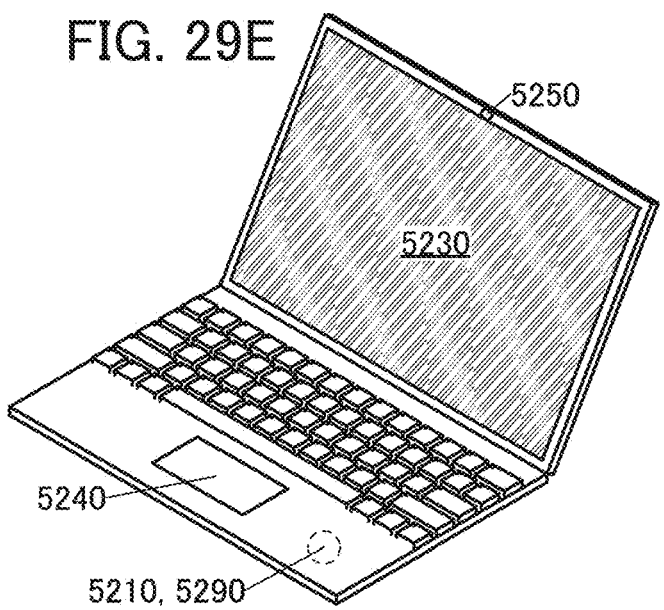

FUNCTIONAL PANEL, DISPLAY DEVICE, INPUT/OUTPUT DEVICE, AND DATA PROCESSING DEVICE

This application is a continuation of copending U.S. application Ser. No. 17/762,505, filed on Mar. 22, 2022 which is a 371 of international application PCT/IB2020/058977 filed on Sep. 25, 2020, which are all incorporated herein by reference.

TECHNICAL FIELD

One embodiment of the present invention relates to a functional panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A high-efficiency organic EL microdisplay that focuses on the increase in out-coupling efficiency using a microlens array and has an efficiency three times that of a conventional organic light-emitting diode is known (Non-Patent Document 1).

REFERENCE

Non-Patent Document

[Non-Patent Document 1] Yosuke Motoyama et al., Journal of the Society for Information Display, 2019, pp. 1-7.

SUMMARY OF THE INVENTION

Problems to be Solved by the Invention

An object of one embodiment of the present invention is to provide a novel functional panel that is highly convenient, useful, or reliable. Another object is to provide a novel display device that is highly convenient, useful, or reliable. Another object is to provide a novel input/output device that is highly convenient, useful, or reliable. Another object is to provide a novel data processing device that is highly convenient, useful, or reliable. Another object is to provide a novel functional panel, a novel display device, a novel input/output device, a novel data processing device, or a novel semiconductor device.

Note that the description of these objects does not preclude the existence of other objects. One embodiment of the present invention does not have to achieve all these objects. Other objects are apparent from the description of the specification, the drawings, the claims, and the like, and other objects can be derived from the description of the specification, the drawings, the claims, and the like.

Means for Solving the Problems (1) One embodiment of the present invention is a functional panel including an optical element, an insulating film, and a first region.

The optical element has a first refractive index N1, the optical element is a convex lens, and the optical element has a first surface and a second surface.

The optical element has a first cross section on a first plane, and the first surface forms a first curve in the first cross section. The first curve has a first radius of curvature R1.

The second surface faces the first surface, and the second surface is irradiated with first light.

The insulating film is interposed between the optical element and the first region, and the insulating film is in contact with the second surface.

The first region overlaps with the second surface, the first region faces the second surface, and the first region emits the first light. A distance L1 is a distance between the first region and the second surface.

The distance L1 has a relationship represented by Formula (i) with the first radius of curvature R1 and the first refractive index N1.

[Formula 1]

$$L1 \leq 5 \times R1/(N1-1) \tag{i}$$

Thus, light emitted from the first region can be collected toward the front direction of the first region where the first region and the optical element ML overlap with each other. Alternatively, light emitted from the first region can be used efficiently. As a result, a novel functional panel that is highly convenient, useful, or reliable can be provided.

(2) One embodiment of the present invention is a functional panel including an optical element, an insulating film, a sealant, and a first region.

The optical element has a first refractive index N1, the optical element is a convex lens, and the optical element has a first surface and a second surface.

The optical element has a first cross section on a first plane, the first surface forms a first curve in the first cross section, and the first curve has a first radius of curvature R1.

The second surface faces the first surface, and the second surface is irradiated with first light.

The insulating film is interposed between the optical element and the first region, and the insulating film is in contact with the second surface.

The sealant is in contact with the first surface, the sealant has a second refractive index N2, and the second refractive index N2 is lower than the first refractive index N1.

The first region overlaps with the second surface, the first region faces the second surface, and the first region emits the first light. A distance L1 is a distance between the first region and the second surface.

The distance L1 has a relationship represented by Formula (ii) with the first radius of curvature R1, the first refractive index N1, and the second refractive index N2.

[Formula 2]

$$L1 \leq 5 \times R1 \times N2/(N1 - N2) \qquad (ii)$$

Thus, with the use of the sealant, the optical element can be protected from breakage or damage associated with the use. Alternatively, the light emitted from the first region can be collected toward the front direction of the first region. Alternatively, the light emitted from the first region can be used efficiently. As a result, a novel functional panel that is highly convenient, useful, or reliable can be provided.

(3) One embodiment of the present invention is the above-described functional panel in which the second surface has a first area S1 and the first region has a second area S2. Note that the first area S1 is larger than or equal to the second area S2.

Thus, light emitted from the first region can enter the optical element efficiently. Alternatively, light emitted from the first region can be collected toward the front direction of the first region. Alternatively, light emitted from a first region AP can be used efficiently. As a result, a novel functional panel that is highly convenient, useful, or reliable can be provided.

(4) One embodiment of the present invention is the above-described functional panel including a first pixel.

Note that the first pixel includes a first element, and the first element emits second light. The first region includes the first element, and the first light includes the second light.

Thus, light emitted from the first pixel can enter the optical element efficiently. Alternatively, light emitted from the first region can be collected toward the front direction of a surface. Alternatively, light emitted from the first region can be used efficiently. As a result, a novel functional panel that is highly convenient, useful, or reliable can be provided.

(5) One embodiment of the present invention is a functional panel including a pixel set. The pixel set includes a first pixel and a second pixel, the second pixel includes a second element, and the second element emits third light.

The first region includes the second element, and the first light includes the third light.

Thus, the second light and the third light emitted from the pixel set can enter the optical element efficiently. Alternatively, the second light and the third light emitted from the first region can be collected toward the front direction of the first surface. Alternatively, the second light and the third light emitted from the first region can be used efficiently. As a result, a novel functional panel that is highly convenient, useful, or reliable can be provided.

(6) One embodiment of the present invention is the functional panel in which the optical element has a second cross section on a second plane. Note that the second plane intersects with the first plane at a certain axis.

In the second cross section, the first surface forms a second curve, and the second curve is longer than the first curve.

The second curve includes a second region, the second region is flat or has a second radius of curvature R2, and the second radius of curvature R2 is larger than the first radius of curvature R1.

Thus, as compared with microfabrication in the direction in which one axis X extends, microfabrication in the direction in which another axis Y extends is easy. Alternatively, the optical element ML can be formed easily. Alternatively, the light PH emitted from the first region AP can be collected toward the front direction of the first region AP. Alternatively, the light PH emitted from the first region AP can be efficiently used. As a result, a novel functional panel that is highly convenient, useful, or reliable can be provided.

(7) One embodiment of the present invention is the above-described functional panel including a functional layer. Note that the functional layer includes a first pixel circuit.

The first pixel includes the first element and the first pixel circuit, and the first element is electrically connected to the first pixel circuit.

(8) One embodiment of the present invention is the above-described functional panel including a third region.

The third region includes a first conductive film, a second conductive film, a group of pixel sets, and another group of pixel sets.

The group of pixel sets is arranged in a row direction, and the group of pixel sets includes a pixel set 703(*i,j*). The group of pixel sets is electrically connected to the first conductive film.

The another group of pixel sets is placed in a column direction intersecting with the row direction, and the another group of pixel sets includes a pixel set 703(*i,j*). The another group of pixel sets is electrically connected to the second conductive film.

Thus, imaging data can be obtained from a plurality of pixels. In addition, image data can be supplied to a plurality of pixels. As a result, a novel functional panel that is highly convenient, useful, or reliable can be provided.

(9) One embodiment of the present invention is a display device including a control portion and the above-described functional panel.

The control portion is supplied with image data and control data, the control portion generates data on the basis of the image data, and the control portion generates a control signal on the basis of the control data. The control portion supplies the data and the control signal.

The functional panel is supplied with the data and the control signal, and the pixel set performs display on the basis of the data.

Thus, the image data can be displayed using the element. As a result, a novel display device that is highly convenient, useful, or reliable can be provided.

(10) One embodiment of the present invention is an input/output device including an input portion and a display portion.

The display portion includes the functional panel, and the input portion includes a sensing region. The input portion senses an object approaching the sensing region, and the sensing region includes a region overlapping with the pixel.

Thus, the object approaching the region overlapping with the display portion can be sensed while image data is displayed using the display portion. A finger or the like approaching the display portion can be used as a pointer to input position data. Position data can be associated with image data displayed on the display portion. As a result, a novel input/output device that is highly convenient, useful, or reliable can be provided.

(11) One embodiment of the present invention is a data processing device including an arithmetic device and an input/output device.

The arithmetic device is supplied with input data or sensing data, the arithmetic device generates control data and image data on the basis of the input data or the sensing data, and the arithmetic device supplies the control data and the image data.

The input/output device supplies the input data and the sensing data, the input/output device is supplied with the control data and the image data, and the input/output device includes a display portion, an input portion, and a sensing portion.

The display portion includes the above functional panel, and the display portion displays the image data on the basis of the control data. The input portion generates the input data, and the sensing portion generates the sensing data.

Thus, the control data can be generated on the basis of the input data or the sensing data. The image data can be displayed on the basis of the input data or the sensing data. Thus, a novel data processing device that is highly convenient, useful, or reliable can be provided.

(12) One embodiment of the present invention is a data processing device including one or more of a keyboard, a hardware button, a pointing device, a touch sensor, an illuminance sensor, an imaging device, an audio input device, an eye-gaze input device, and an attitude detection device, and any one of the above-described functional panels.

Thus, the arithmetic device can generate the image data or the control data on the basis of the data supplied using a variety of input devices. Thus, a novel data processing device that is highly convenient or reliable can be provided.

Although a block diagram in which components are classified by their functions and shown as independent blocks is shown in the drawing attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relationship of a transistor is sometimes described assuming that the source and the drain are fixed; in reality, the names of the source and the drain interchange with each other according to the above relationship of the potentials.

In this specification, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel functional panel that is highly convenient, useful, or reliable can be provided. A novel display device that is highly convenient, useful, or reliable can be provided. A novel input/output device that is highly convenient, useful, or reliable can be provided. A novel data processing device that is highly convenient, useful, or reliable can be provided. A novel functional panel, a novel display device, a novel input/output device, a novel data processing device, or a novel semiconductor device can be provided.

Note that the descriptions of these effects do not preclude the existence of other effects. One embodiment of the present invention does not have to have all of these effects. Other effects are apparent from the descriptions of the specification, the drawings, the claims, and the like, and other effects can be derived from the descriptions of the specification, the drawings, the claims, and the like.

BRIEF DESCRIPTION OF THE DRAWINGS

FIG. 29A to FIG. 29E are diagrams illustrating structures of data processing devices of an embodiment.

MODE FOR CARRYING OUT THE INVENTION

Figure 1A:
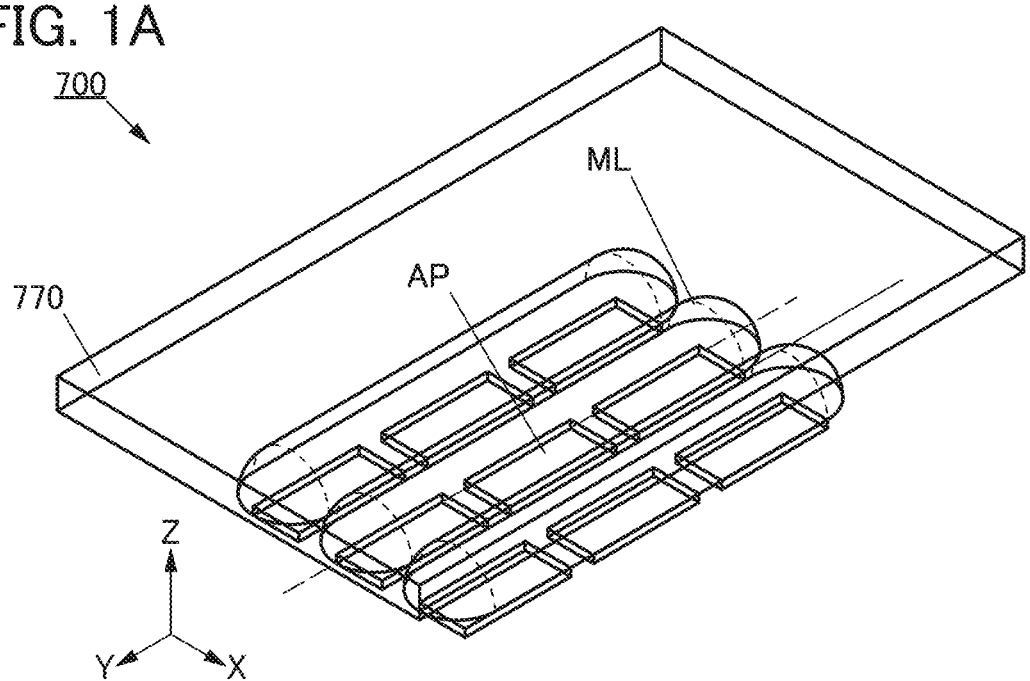
FIG. 1A to FIG. 1C are diagrams illustrating a structure of a functional panel of an embodiment.

A functional panel of one embodiment of the present invention includes an optical element, a first insulating film, and a region. The optical element has a first refractive index N1; the optical element is a convex lens; the optical element has a first surface and a second surface; the optical element has a first cross section on a first plane; the first surface forms a first curve in the first cross section; the first curve has a first radius of curvature R1; the second surface faces the first surface; the second surface is irradiated with first light; the first insulating film is interposed between the optical element and the region; the first insulating film is in contact with the second surface; the region overlaps with the second surface; the region faces the second surface; the region emits the first light; and a distance L1 is a distance between the region and the second surface. The distance L1 has a relationship with the first radius of curvature R1 and the first refractive index N1 represented by the following formula: $L1 \leq 5 \times R1/(N1-1)$.

Thus, light emitted from the region can be collected toward the front direction of the region with which the optical element overlaps. Alternatively, light emitted from the region can be used efficiently. As a result, a novel functional panel that is highly convenient, useful, or reliable can be provided.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments. Note that in structures of the invention described below, the same portions or portions having similar functions are denoted by the same reference numerals in different drawings, and a description thereof is not repeated.

Embodiment 1

In this embodiment, structures of a functional panel of one embodiment of the present invention will be described with reference to FIG. 1A to FIG. 6B.

Figure 1B:
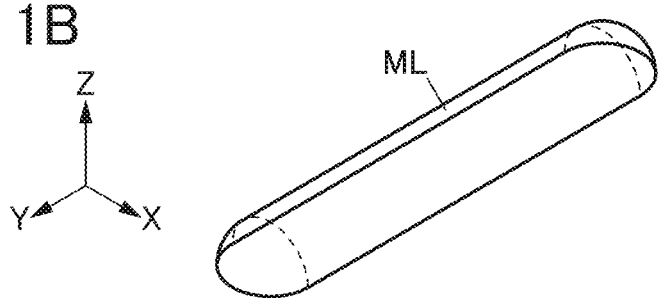
Figure 1C:
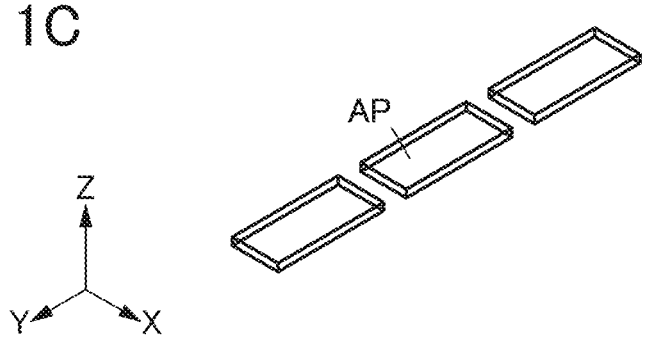

FIG. 1A is a perspective view illustrating the structure of a functional panel of one embodiment of the present invention, FIG. 1B is a perspective view illustrating part of FIG. 1A, and FIG. 1C is a perspective view illustrating another part of FIG. 1A.

Figure 2:
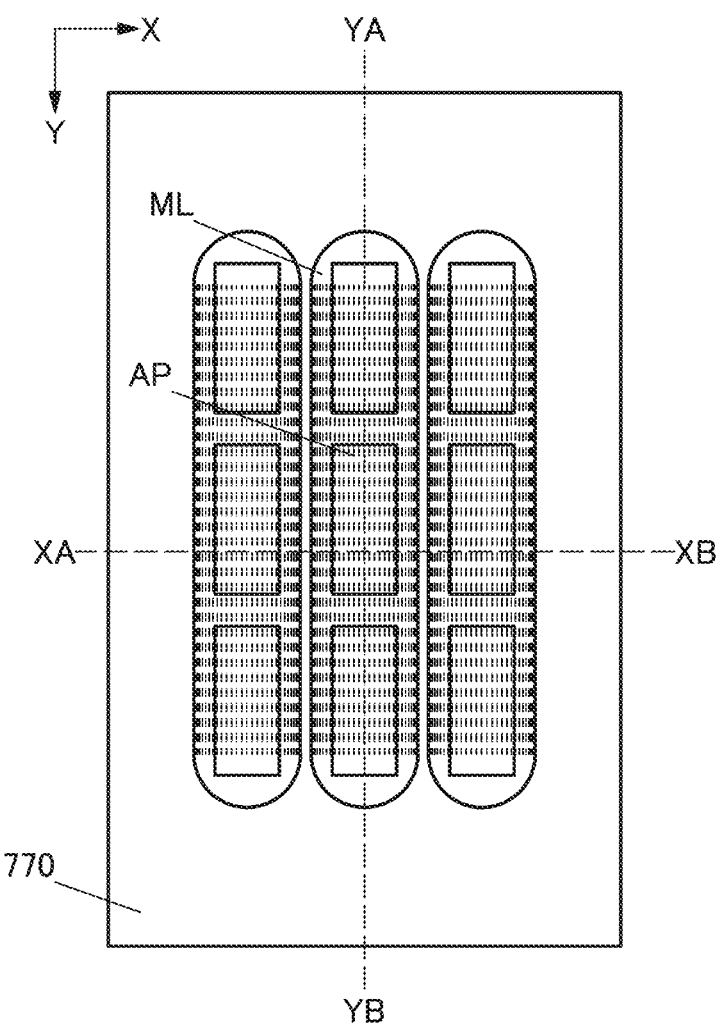
FIG. 2 is a diagram illustrating a structure of a functional panel of an embodiment.

FIG. 2 is a top view of a functional panel of one embodiment of the present invention.

Figure 3A:
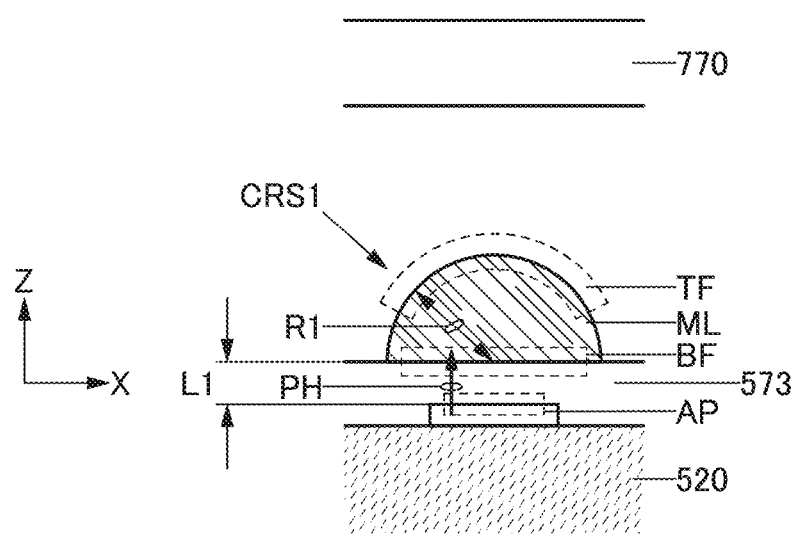
FIG. 3A and FIG. 3B are diagrams illustrating structures of functional panels of an embodiment.
Figure 3B:
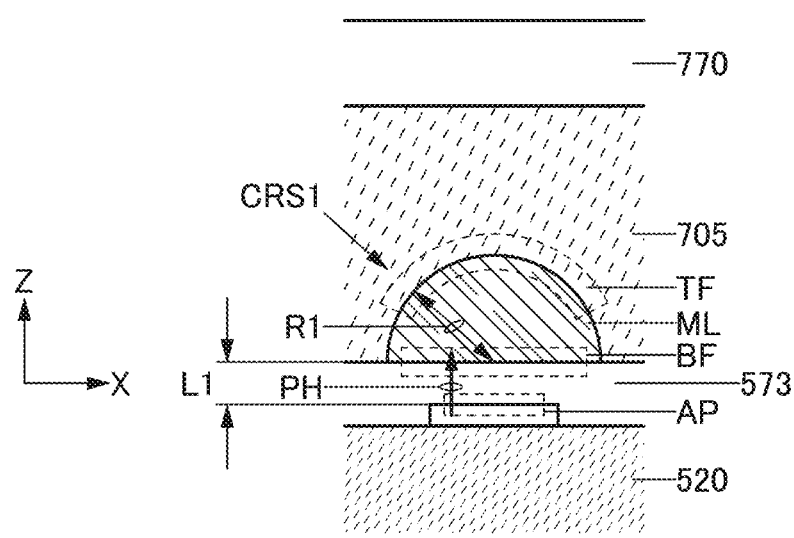

FIG. 3A is a cross-sectional view illustrating part of a functional panel of one embodiment of the present invention, FIG. 3B is a cross-sectional view illustrating part of a functional panel of one embodiment of the present invention which is different from the functional panel in FIG. 3A.

Figure 4A:
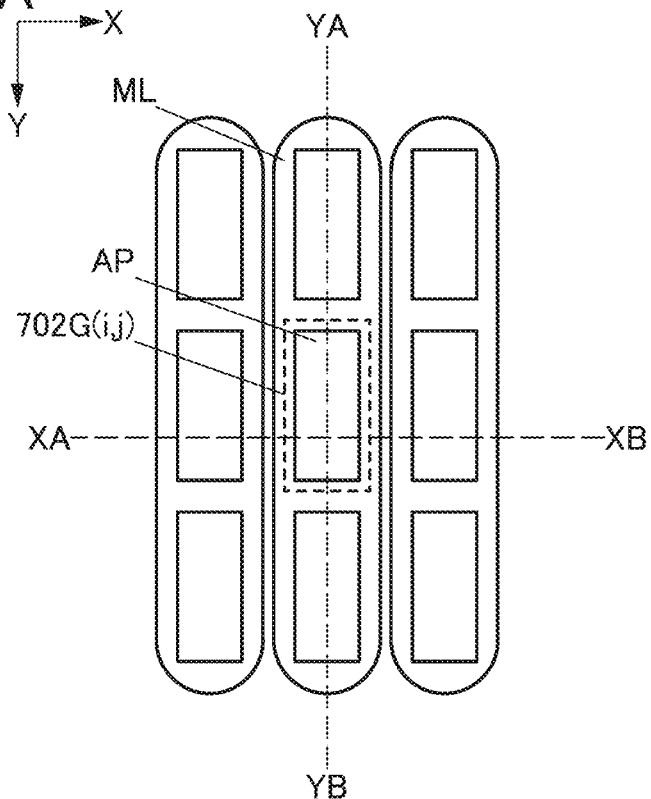
FIG. 4A to FIG. 4C are diagrams illustrating a structure of a functional panel of an embodiment.
Figure 4B:
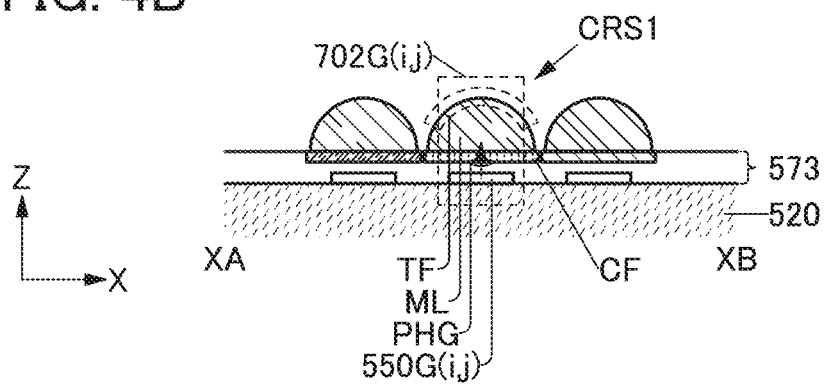
Figure 4C:
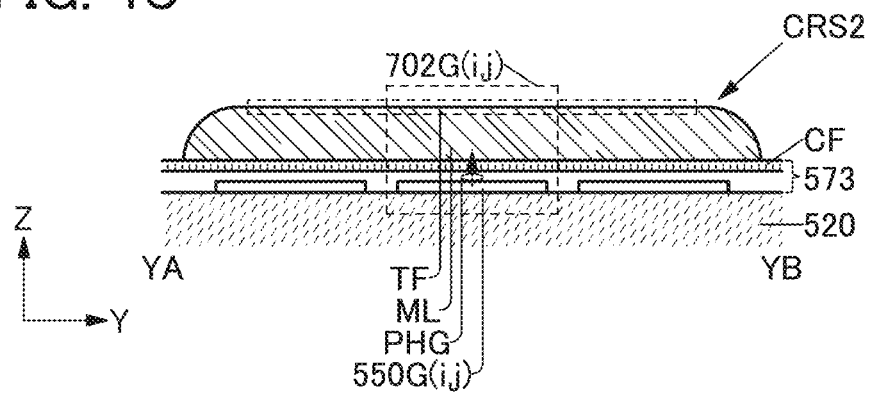

FIG. 4A is a top view illustrating part of a functional panel of one embodiment of the present invention, FIG. 4B is a cross-sectional view taken along the cutting-plane line XA-XB in FIG. 4A, and FIG. 4C is a cross-sectional view taken along the cutting-plane line YA-YB in FIG. 4A.

Figure 5A:
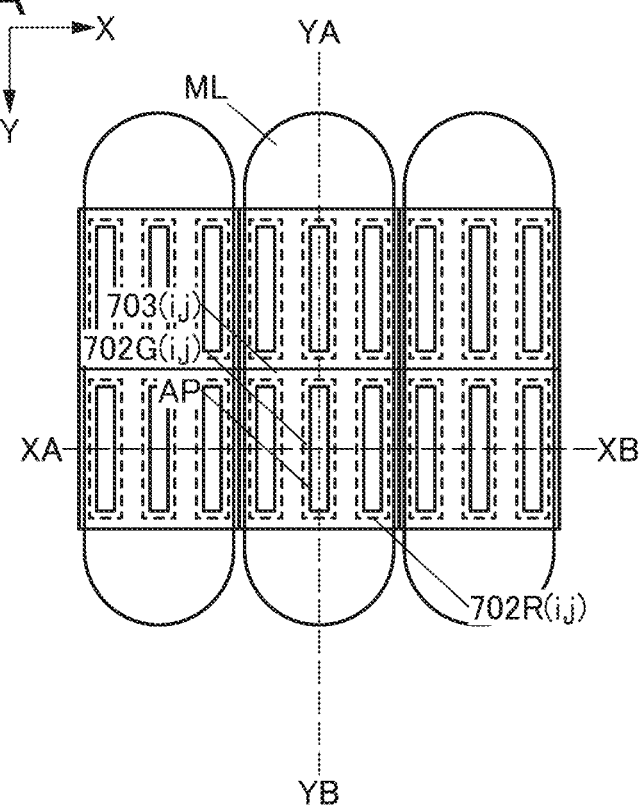
FIG. 5A to FIG. 5C are diagrams illustrating a structure of a functional panel of an embodiment.
Figure 5B:
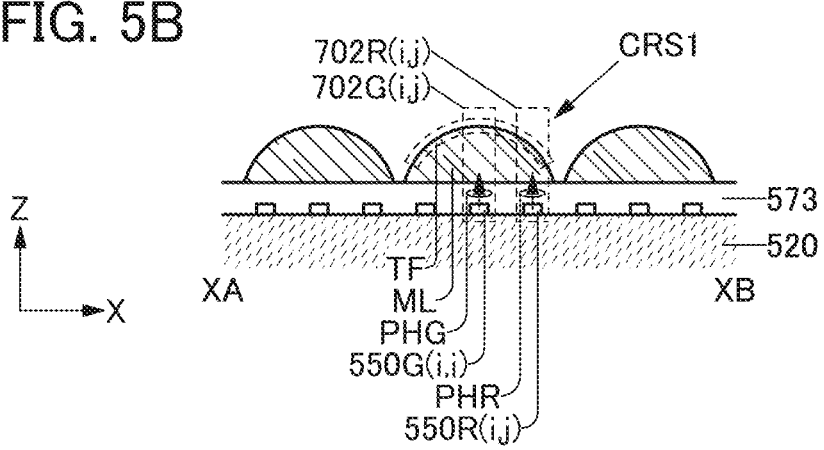
Figure 5C:
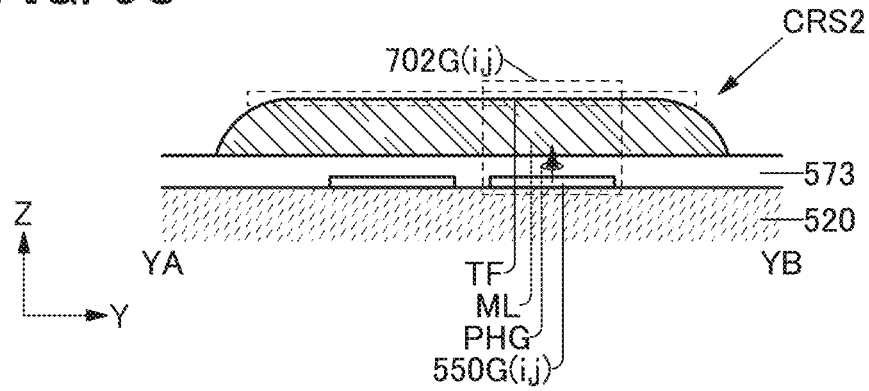

FIG. 5A is a top view illustrating part of a functional panel of one embodiment of the present invention, FIG. 5B is a cross-sectional view taken along the cutting-plane line XA-XB in FIG. 5A, and FIG. 5C is a cross-sectional view taken along the cutting-plane line YA-YB in FIG. 5A.

Figure 6A:
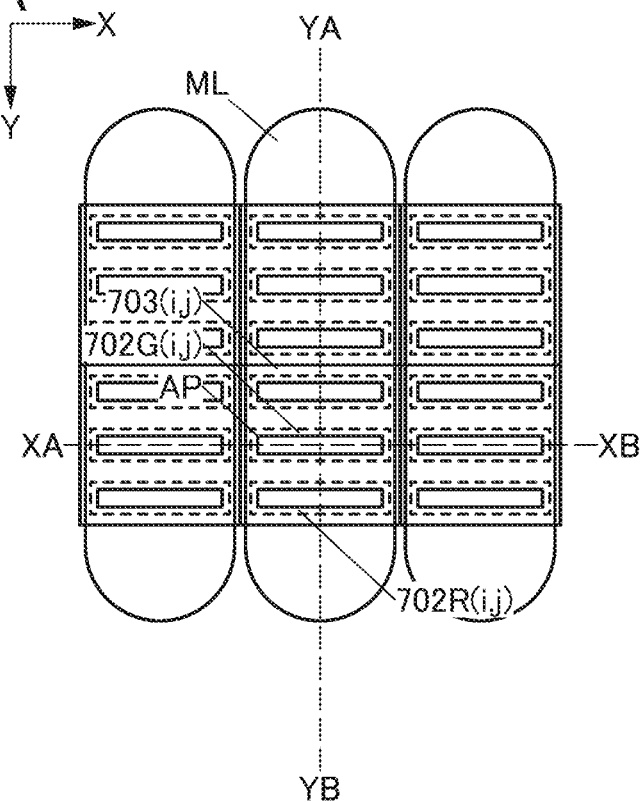
FIG. 6A to FIG. 6C are diagrams illustrating a structure of a functional panel of an embodiment.
Figure 6B:
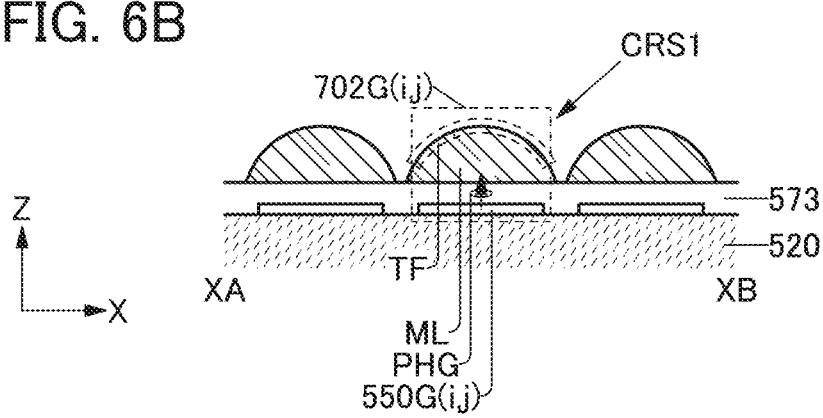
Figure 6C:
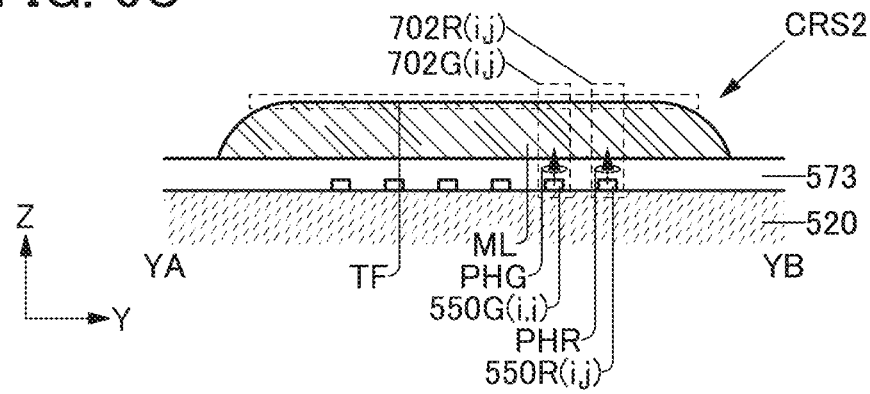

FIG. 6A is a top view illustrating part of a functional panel of one embodiment of the present invention, FIG. 6B is a cross-sectional view taken along the cutting-plane line XA-XB in FIG. 6A, and FIG. 6C is a cross-sectional view taken along the cutting-plane line YA-YB in FIG. 6A.

Figure 7A:
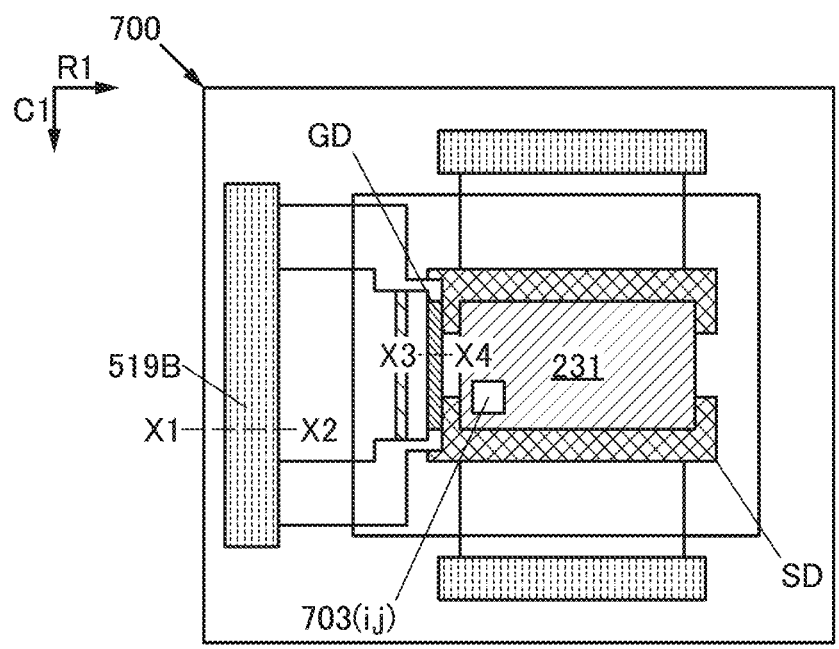
FIG. 7A to FIG. 7C are diagrams illustrating a structure of a functional panel of an embodiment.
Figure 7B:
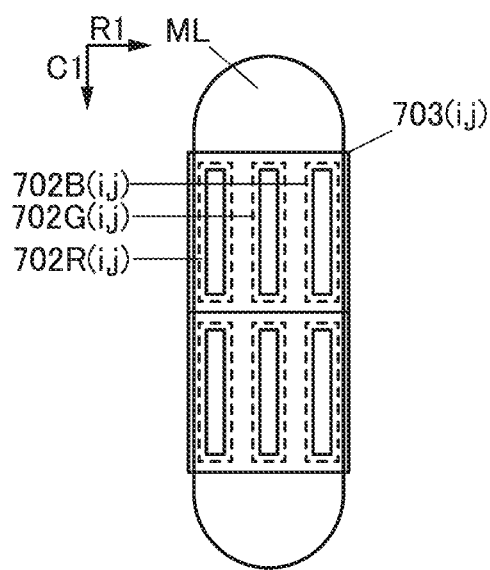
Figure 7C:
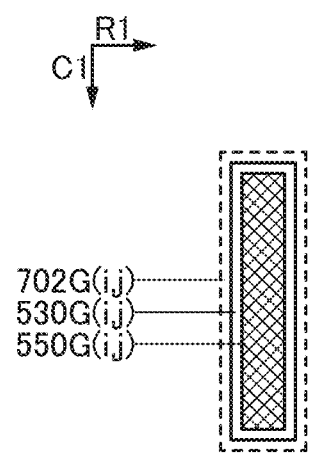

FIG. 7A is a top view of a functional panel of one embodiment of the present invention, FIG. 7B is a diagram illustrating part of FIG. 7A, and FIG. 7C is a diagram illustrating part of FIG. 7B.

Note that in this specification, an integer variable of 1 or more is sometimes used in reference numerals. For example, (p) where p is an integer variable of 1 or more is sometimes used in part of a reference numeral that specifies any of p components at a maximum. As another example, (m,n) where m and n are each an integer variable of 1 or more is sometimes used in part of a reference numeral that specifies any of m×n components at a maximum.

Structure Example 1 of Functional Panel 700

The functional panel described in this embodiment includes the optical element ML, an insulating film 573, and a region AP (see FIG. 1A and FIG. 3A). The functional panel includes a base material 770 and a functional layer 520.

Structure Example of Optical Element ML

The optical element ML has a refractive index N1, and the optical element ML is a convex lens (see FIG. 1B and FIG. 3A). For example, a material with a refractive index greater than or equal to 1.5 and less than or equal to 1.8 can be used for the optical element ML. Specifically, a material with a refractive index of 1.56 can be used for the optical element ML.

The optical element ML has a surface TF and a surface BF, and the optical element ML has a cross section CRS1 on a plane XZ.

The surface TF form a first curve in the cross section CRS1, and the first curve has a radius of curvature R1 (see FIG. 3A).

The surface BF faces the surface TF, and the surface BF is irradiated with light PH. The surface BF has a region overlapping with the surface TF, and the light PH emitted to the surface BF is collected toward the surface TF side.

Structure Example of Insulating Film 573

The insulating film 573 is interposed between the optical element ML and the region AP, and the insulating film 573 is in contact with the surface BF. For example, a material having the same refractive index as the material used for the optical element ML can be used for the insulating film 573. Specifically, a material with a refractive index greater than or equal to 1.5 and less than or equal to 1.8, for example, a material with a refractive index of 1.56 can be used for the insulating film 573.

Structure Example of Region AP

The region AP overlaps with the surface BF, the region AP faces the surface BF, and the region AP emits the light PH. A distance L1 is a distance between the region AP and the surface BF. Alternatively, the surface BF is interposed between the region AP and the surface TF. For example, a region from which light of a light-emitting element is emitted can be used as the region AP.

The distance L1 has a relationship represented by Formula (i) with the radius of curvature R1 and the refractive index N1. Note that the distance L1 is greater than or equal to 0.01 μm and less than or equal to 100 μm, preferably greater than or equal to 0.1 μm and less than or equal to 20 μm.

[Formula 3]

$$L1 \leq 5 \times R1/(N1 - 1) \tag{i}$$

For example, when the distance L1 is 2 μm, the radius of curvature R1 is 1.2 μm, and the refractive index N1 is 1.56, the luminance in front of the region AP can be 1.27 times as high as that in the case where the optical element ML does not exist.

Thus, the light PH emitted from the region AP can be collected toward the front direction of the region AP. Alternatively, the light PH emitted from the region AP can be efficiently used. As a result, a novel functional panel that is highly convenient, useful, or reliable can be provided.

Structure Example 2 of Functional Panel 700

Another structure of the functional panel described in this embodiment is described with reference to FIG. 3B. Note that including a sealant 705 is a point different from the functional panel described with reference to FIG. 1 and FIG. 3A. Different portions are described in detail here, and the above description is referred to for portions that can use similar structures.

The functional panel includes the optical element ML, the insulating film 573, the sealant 705, and the region AP (see FIG. 3B). The functional panel includes the base material 770.

Structure Example of Sealant 705

The sealant 705 is in contact with the surface TF, the sealant 705 has a refractive index N2, and the refractive index N2 is lower than the refractive index N1. For example, a material with a refractive index greater than or equal to 1.2 and less than or equal to 1.5 can be used for the sealant 705. Specifically, a material with a refractive index of 1.4 can be used for the optical element ML. Alternatively, the sealant 705 has a function of bonding the surface TF and the base material 770.

Structure Example 1 of Region AP

The region AP overlaps with the surface BF, the region AP faces the surface BF, and the region AP emits the light PH. The distance L1 is a distance between the region AP and the surface BF. Alternatively, the surface BF is interposed between the region AP and the surface TF.

The distance L1 has a relationship represented by Formula (i) with the radius of curvature R1, the refractive index N1, and the refractive index N2.

[Formula 4]

$$L1 \leq 5 \times R1 \times N2/(N1 - N2) \tag{ii}$$

For example, when the distance L1 is 3 μm, the radius of curvature R1 is 1.2 μm, the refractive index N1 is 1.56, and the refractive index N2 is 1.40, the luminance in front of the region AP can be 1.51 times as high as that in the case where the optical element ML does not exist.

Thus, the optical element ML can be protected from breakage or damage associated with the use of the sealant 705. Alternatively, the light PH emitted from the region AP can be collected toward the front direction of the region AP. Alternatively, the light PH emitted from the region AP can be used efficiently. As a result, a novel functional panel that is highly convenient, useful, or reliable can be provided.

Structure Example 3 of Functional Panel 700

In the functional panel of one embodiment of the present invention, the surface BF of the optical element ML has an area S1 and the region AP has an area S2. Note that the area S1 is larger than or equal to the area S2.

Thus, light PH emitted from the region AP can enter the optical element ML efficiently. Alternatively, light PH emitted from the region AP can be collected toward the front direction of the region AP. Alternatively, light PH emitted from the region AP can be used efficiently. As a result, a novel functional panel that is highly convenient, useful, or reliable can be provided.

Structure Example 4 of Functional Panel 700

The functional panel of one embodiment of the present invention includes a pixel 702G(i,j) (see FIG. 4A).

Structure Example of Pixel 702G(i,j)

The pixel 702G(i,j) includes an element 550G(i,j), and the element 550G(i,j) emits light PHG (see FIG. 4B and FIG. 4C). Note that a coloring film CF can be used for part of the insulating film 573.

Structure Example 2 of Region AP

The region AP includes the element 550G(i,j), and the light PH includes the light PHG.

Thus, the light PHG emitted from the pixel 702G(i,j) can efficiently enter the optical element ML. Alternatively, the light PHG emitted from the region AP can be collected toward the front direction of the surface TF. Alternatively, the light PHG emitted from the region AP can be efficiently used. As a result, a novel functional panel that is highly convenient, useful, or reliable can be provided.

Structure Example 5 of Functional Panel 700

The functional panel of one embodiment of the present invention includes a pixel set 703(i,j) (see FIG. 5A and FIG. 6A).

Structure Example of Pixel 703(i,j)

The pixel set 703(i,j) includes a pixel 702G(i,j) and a pixel 702R(i,j).

Note that the pixel 702R(i,j) includes an element 550R (i,j), and the element 550R(i,j) emits light PHR (see FIG. 5B, FIG. 5C, FIG. 6B, and FIG. 6C). For example, the pixel 702G(i,j) emits green light PHG and the pixel 702R(i,j) emits red light PHR.

Structure Example 3 of Region AP

The region AP includes the element 550R(i,j), and the light PH includes the light PHR. For example, in the case where the light PH includes the green light PHG and the red light PHR, the light PH emits yellow light.

Thus, the light PHG and the light PHR emitted from the pixel set 703(i,j) can enter the optical element ML efficiently. Alternatively, the light PHG and the light PHR emitted from the region AP can be collected toward the front direction of the surface TF. Alternatively, the light PHG and the light PHR emitted from the region AP can be efficiently used. As a result, a novel functional panel that is highly convenient, useful, or reliable can be provided.

Structure Example 2 of Optical Element ML

The optical element ML has a cross section CRS2 on a plane YZ (see FIG. 4C, FIG. 5C, and FIG. 6C). Note that the plane YZ and the plane XZ intersect with each other at an axis Z. The surface TF forms a second curve in the cross section CRS2. Note that a plane including the region AP can be a plane XY, for example, and an axis intersecting with the plane XY can be the axis Z.

The second curve is longer than the first curve, and the second curve has a region. The region is flat or has the radius of curvature R2, and the radius of curvature R2 is larger than the radius of curvature R1. For example, a curve that has a flat region or a region with the radius of curvature R2 and has the radius of curvature R1 at an end portion can be used as the second curve. A cylindrical lens can be used for the optical element ML.

Thus, as compared with microfabrication in the direction in which one axis X extends, microfabrication in the direction in which another axis Y extends is easy. Alternatively, the optical element ML can be formed easily. Alternatively, the light PH emitted from the region AP can be collected toward the front direction of the region AP. Alternatively, the light PH emitted from the region AP can be efficiently used. As a result, a novel functional panel that is highly convenient, useful, or reliable can be provided.

Structure Example 6 of Functional Panel 700

The functional panel of one embodiment of the present invention includes a region 231, a driver circuit GD, a driver circuit SD, and a terminal 519B (see FIG. 7A). Note that the region 231 includes the optical element ML and the pixel set 703(i,j) (see FIG. 7B).

The pixel set 703(i,j) includes a pixel 702B(i,j), the pixel 702G(i,j), and the pixel 702R(i,j).

The pixel 702G(i,j) includes a pixel circuit 530G(i,j) and the element 550G(i,j) (see FIG. 7C). The element 550G(i,j) is electrically connected to the pixel circuit 530G(i,j).

Note that this embodiment can be combined with any of the other embodiments in this specification as appropriate.

Embodiment 2

In this embodiment, structures of a functional panel of one embodiment of the present invention are described with reference to FIG. 8 to FIG. 11.

Figure 8A:
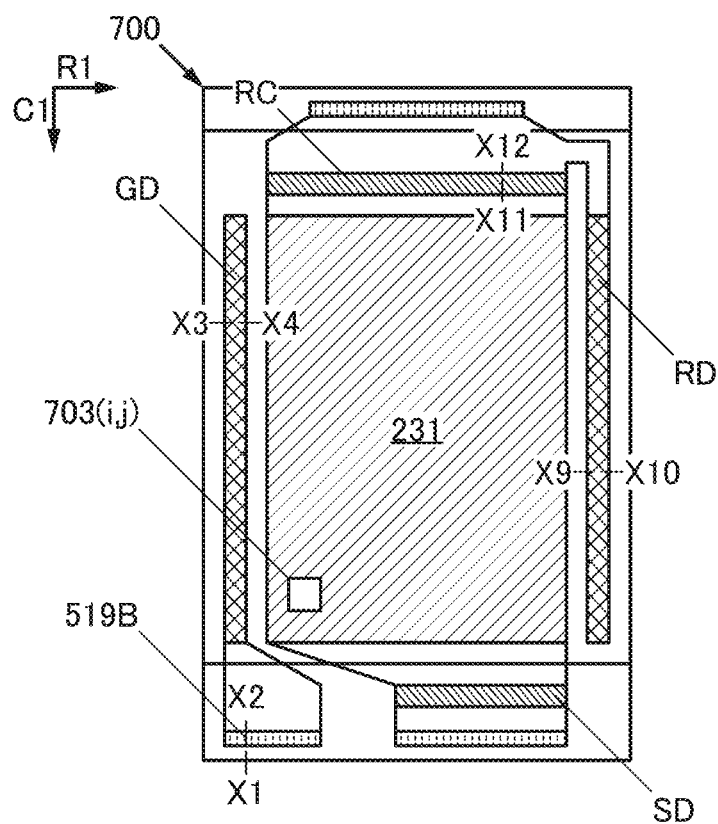
FIG. 8A and FIG. 8B are diagrams illustrating a structure of a functional panel of an embodiment.
Figure 8B:
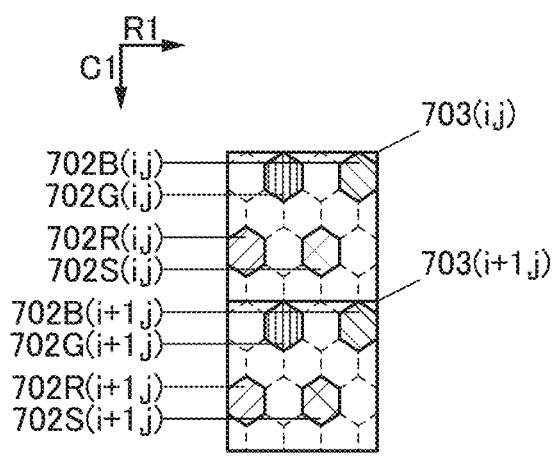

FIG. 8A is a top view illustrating the structure of the functional panel of one embodiment of the present invention, and FIG. 8B is a diagram illustrating part of FIG. 8A.

Figure 9A:
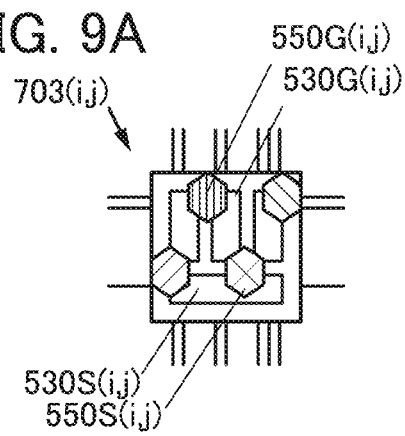
FIG. 9A to FIG. 9C are diagrams illustrating a structure of a functional panel of an embodiment.
Figure 9B:
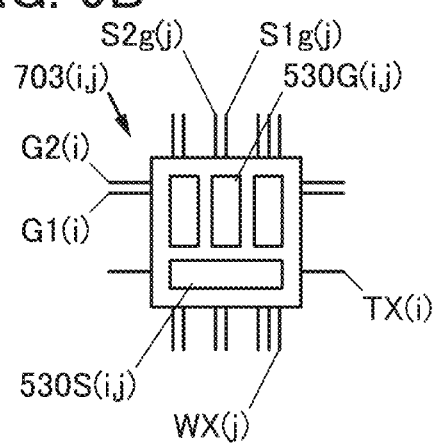
Figure 9C:
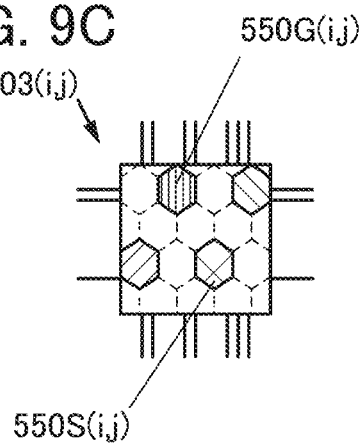

FIG. 9A is a diagram illustrating part of FIG. 8A, FIG. 9B is a diagram illustrating part of FIG. 9A, and FIG. 9C is a diagram illustrating another part of FIG. 9A.

Figure 10:
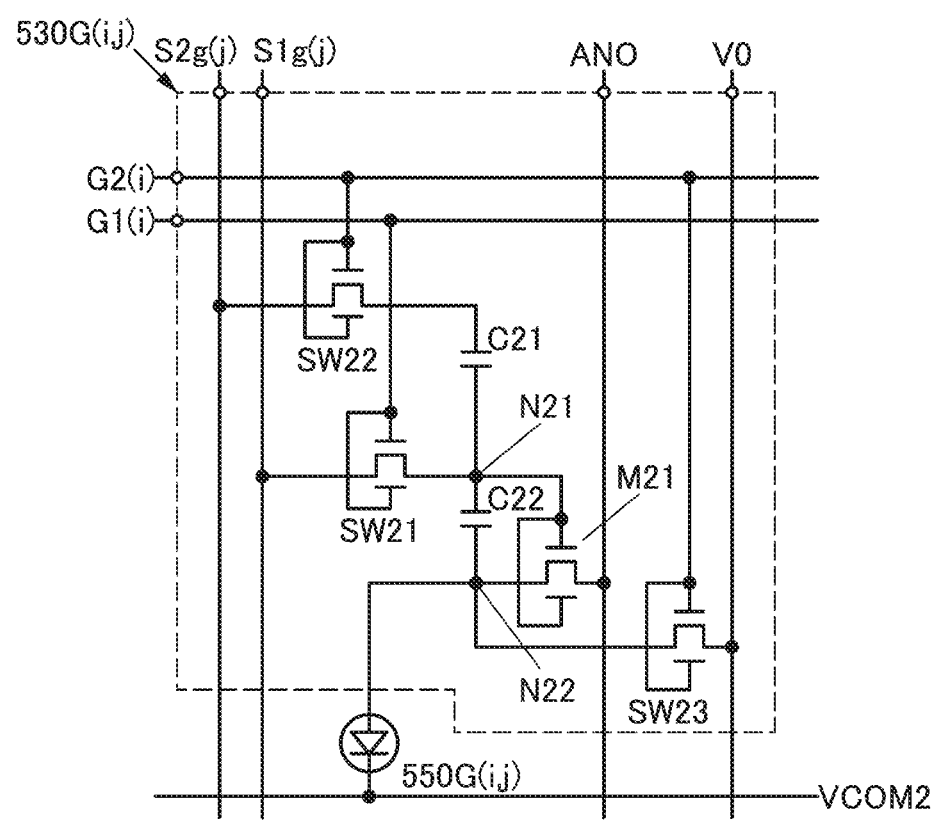
FIG. 10 is a circuit diagram illustrating a structure of a functional panel of an embodiment.

FIG. 10 is a diagram illustrating a structure of the functional panel of one embodiment of the present invention. FIG. 10 is a circuit diagram illustrating a structure of a pixel circuit.

Figure 11:
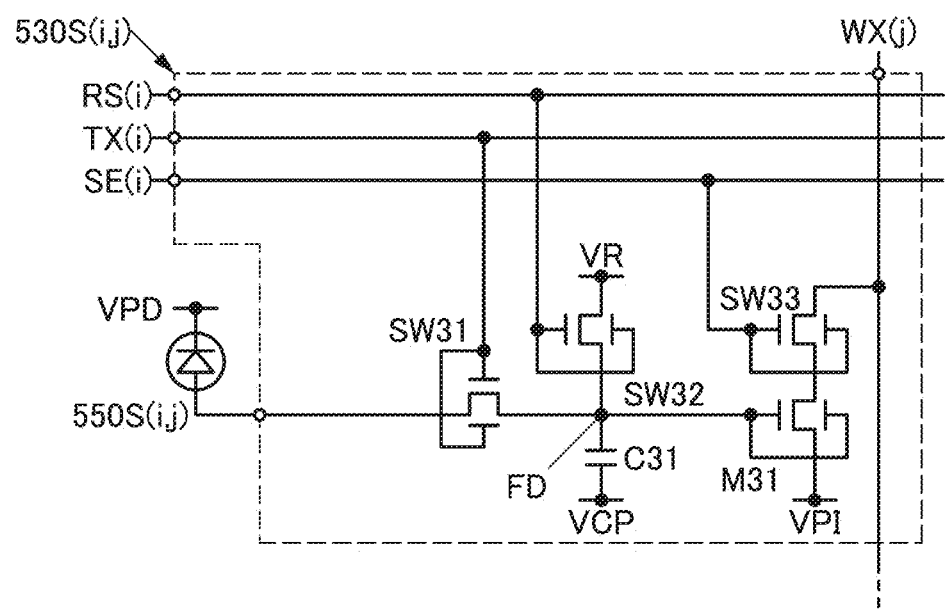
FIG. 11 is a circuit diagram illustrating a structure of a functional panel of an embodiment.

FIG. 11 is a diagram illustrating a structure of the functional panel of one embodiment of the present invention. FIG. 11 is a circuit diagram illustrating a structure of a pixel circuit.

Figure 12A:
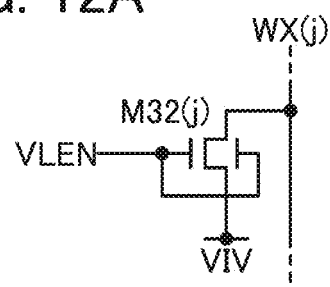
FIG. 12A and FIG. 12B are circuit diagrams illustrating a structure of a functional panel of an embodiment.
Figure 12B:
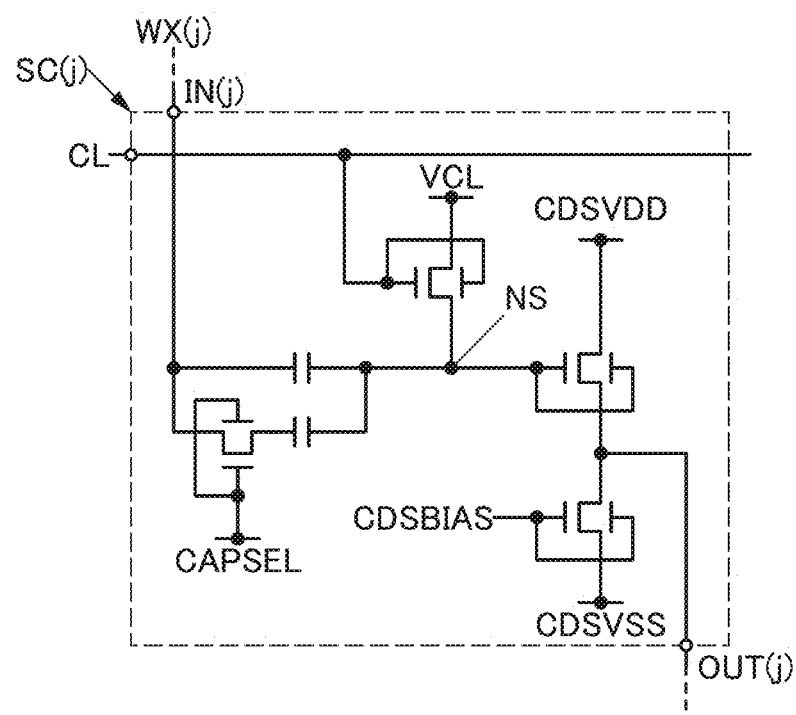

FIG. 12 illustrates a structure of the functional panel of one embodiment of the present invention. FIG. 12A is a circuit diagram illustrating part of an amplifier circuit that can be used in the functional panel of one embodiment of the present invention, and FIG. 12B is a circuit diagram of a sampling circuit that can be used in the functional panel of one embodiment of the present invention.

Structure Example 1 of Functional Panel 700

The functional panel 700 includes the pixel set 703(i,j) (see FIG. 8A).

The functional panel 700 includes a conductive film G1(i), a conductive film G2(i), a conductive film S1g(j), a conductive film S2g(j), a conductive film ANO, and a conductive film VCOM2 (see FIG. 10).

For example, the conductive film G1(i) is supplied with the first selection signal, the conductive film G2(i) is supplied with the second selection signal, the conductive film S1g(j) is supplied with the image signal, and the conductive film S2g(j) is supplied with the control signal.

Structure Example 1 of Pixel 703(i,j)

The pixel set 703(i,j) includes a pixel 702G(i,j) (see FIG. 8B). The pixel 702G(i,j) includes a pixel circuit 530G(i,j) and an element 550G(i,j) (see FIG. 9A).

Structure Example 1 of Pixel Circuit 530G(i,j)

The pixel circuit 530G(i,j) is supplied with the first selection signal, and the pixel circuit 530G(i,j) obtains an image signal on the basis of the first selection signal. For example, the first selection signal can be supplied using the conductive film G1(i) (see FIG. 9B). The image signal can be supplied using the conductive film S1g(j). Note that the operation of supplying the first selection signal and making the pixel circuit 530G(i,j) obtain the image signal can be referred to as "writing" (see FIG. 18).

Structure Example 2 of Pixel Circuit 530G(i,j)

The pixel circuit 530G(i,j) includes the switch SW21, the switch SW22, the transistor M21, the capacitor C21, and the node N21 (see FIG. 10). In addition, the pixel circuit 530G(i,j) includes the node N22, the capacitor C22, and the switch SW23.

The transistor M21 includes the gate electrode electrically connected to the node N21, the first electrode electrically connected to the element 550G(i,j), and the second electrode electrically connected to the conductive film ANO.

The switch SW21 includes a first terminal electrically connected to the node N21 and a second terminal electrically connected to the conductive film S1g(j), and has a function of controlling the conduction state or the non-conduction state on the basis of a potential of the conductive film G1(i).

The switch SW22 includes a first terminal electrically connected to the conductive film S2g(j), and has a function of controlling the conduction state or the non-conduction state on the basis of a potential of the conductive film G2(i).

The capacitor C21 includes a conductive film electrically connected to the node N21 and a conductive film electrically connected to a second electrode of the switch SW22.

Thus, an image signal can be stored in the node N21. A potential of the node N21 can be changed using the switch SW22. The intensity of light emitted from the element 550G(i,j) can be controlled with the potential of the node N21. As a result, a novel functional panel that is highly convenient or reliable can be provided.

Structure Example 1 of Element 550G(i,j)

The element 550G(i,j) is electrically connected to the pixel circuit 530G(i,j) (see FIG. 9A). The element 550G(i,j) includes an electrode 551G(i,j) electrically connected to the pixel circuit 530G(i,j), and an electrode 552 electrically connected to a conductive film VCOM2 (see FIG. 10 and FIG. 14A). Note that the element 550G(i,j) has a function of operating on the basis of the potential of the node N21.

For example, an organic electroluminescence element, an inorganic electroluminescence element, a light-emitting diode, a QDLED (Quantum Dot LED), or the like can be used as the element 550G(i,j).

Structure Example 2 of Functional Panel 700

The functional panel described in this embodiment includes a conductive film RS(i), a conductive film TX(i), a conductive film SE(i), a conductive film VR, a conductive film VCP, a conductive film VPI, and a conductive film WX(j) (see FIG. 11).

For example, the conductive film RS(i) is supplied with a third selection signal, the conductive film TX(i) is supplied with a fourth selection signal, and the conductive film SE(i) is supplied with a fifth selection signal.

Structure Example 2 of Pixel 703(i,j)

The pixel set 703(i,j) includes a pixel 702S(i,j) (see FIG. 8B). The pixel 702S(i,j) includes a pixel circuit 530S(i,j) and an element 550S(i,j) (see FIG. 9A).

Structure Example 1 of the Pixel Circuit 530S(i,j)

The pixel circuit 530S(i,j) includes a switch SW31, a switch SW32, a switch SW33, a transistor M31, a capacitor C31, and a node FD (see FIG. 11A).

The switch SW31 includes a first terminal electrically connected to the element 550S(i,j) and a second terminal electrically connected to the node FD, and has a function of controlling the conduction state or the non-conduction state on the basis of a potential of the conductive film TX(i).

The switch SW32 includes a first terminal electrically connected to the node FD and a second terminal electrically connected to the conductive film VR, and has a function of controlling the conduction state or the non-conduction state on the basis of a potential of the conductive film RS(i).

The capacitor C31 includes a conductive film electrically connected to the node FD and a conductive film electrically connected to the conductive film VCP.

The transistor M31 includes a gate electrode electrically connected to the node FD and a first electrode electrically connected to the conductive film VPI.

The switch SW33 includes a first terminal electrically connected to a second electrode of the transistor M31 and a second terminal electrically connected to a conductive film WX(j), and has a function of controlling the conduction state or the non-conduction state on the basis of a potential of the conductive film SE(i).

Thus, an imaging signal generated by the element 550S(i,j) can be transferred to the node FD using the switch SW31. The imaging signal generated by the element 550S(i,j) can be stored in the node FD using the switch SW31. Electrical continuity between the pixel circuit 530S(i,j) and the element 550S(i,j) can be broken by the switch SW31. A correlated double sampling method can be employed. Noise included in the imaging signal can be reduced. Thus, a novel functional panel that is highly convenient or reliable can be provided.

Structure Example 1 of Element 550S(i,j)

The element 550S(i,j) is electrically connected to the pixel circuit 530S(i,j) (see FIG. 9A). The element 550S(i,j) has a function of generating an imaging signal. For example, a heterojunction photoelectric conversion element, a bulk heterojunction photoelectric conversion element, or the like can be used as the element 550S(i,j).

Structure Example 3 of Pixel 703(i,j)

A plurality of pixels can be used in the pixel 703(i,j). For example, a plurality of pixels capable of displaying colors with different hues can be used. Note that the plurality of pixels can be referred to as subpixels. A set of subpixels can be referred to as a pixel.

This enables additive mixture or subtractive mixture of colors displayed by the plurality of pixels. It is possible to display a color of a hue that an individual pixel cannot display.

Specifically, a pixel 702B($i,j$) displaying blue, the pixel 702G($i,j$) displaying green, and a pixel 702R($i,j$) displaying red can be used in the pixel 703($i,j$). The pixel 702B($i,j$), the pixel 702G($i,j$), and the pixel 702R($i,j$) can each be referred to as a subpixel (see FIG. 8B).

A pixel displaying white or the like can be used in addition to the above set in the pixel 703($i,j$), for example. A pixel displaying cyan, a pixel displaying magenta, and a pixel displaying yellow can be used in the pixel 703($i,j$).

A pixel emitting infrared rays can be used in addition to the above set in the pixel 703($i,j$), for example. Specifically, a pixel that emits light including light with a wavelength of greater than or equal to 650 nm and less than or equal to 1000 nm can be used in the pixel 703($i,j$).

Structure Example 1 of Functional Panel 700

The functional panel described in this embodiment includes a driver circuit GD, a driver circuit SD, and a driver circuit RD (see FIG. 8A).

Structure Example of Driver Circuit GD

The driver circuit GD has a function of supplying a first selection signal and a second selection signal. For example, the driver circuit GD is electrically connected to a conductive film G1($i$) to supply the first selection signal, and is electrically connected to a conductive film G2($i$) to supply the second selection signal.

Structure Example of Driver Circuit SD

The driver circuit SD has a function of supplying an image signal and a control signal, and the control signal includes a first level and a second level. The driver circuit SD is electrically connected to a conductive film S1$g$($j$) to supply the image signal, and is electrically connected to a conductive film S2$g$($j$) to supply the control signal, for example.

Structure Example of Driver Circuit RD

The driver circuit RD has a function of supplying the third selection signal to the fifth selection signal. For example, the driver circuit RD is electrically connected to the conductive film RS($i$), supplies the third selection signal, is electrically connected to the conductive film TX($i$), supplies the fourth selection signal, is electrically connected to the conductive film SE($i$), and supplies the fifth selection signal.

Structure Example 4 of Functional Panel 700

The functional panel described in this embodiment includes a conductive film VLEN, a conductive film VIV, and a reading circuit RC (see FIG. 8A). Note that the reading circuit RC includes a reading circuit RC(j). The functional panel of one embodiment of the present invention includes a conductive film CL, a conductive film CAPSEL, a conductive film CDSBIAS, a conductive film CDSVDD, a conductive film CDSVSS, and a conductive film VCL.

Structure Example of Reading Circuit RC(j)

The reading circuit RC(j) includes an amplifier circuit and a sampling circuit SC(j) (see FIG. 12A and FIG. 12B).

Structure Example of Amplifier Circuit

The amplifier circuit includes a transistor M32($j$) (see FIG. 12A). The transistor M32($j$) includes a gate electrode electrically connected to the conductive film VLEN, a first electrode electrically connected to the conductive film WX(j), and a second electrode electrically connected to the conductive film VIV.

Note that the conductive film WX(j) connects the transistor M31 and the transistor M32 when the switch SW33 is in a conduction state (see FIG. 11 and FIG. 12A). Thus, a source follower circuit can be configured with the transistor M31 and the transistor M32. A potential of the conductive film WX(j) can be changed on the basis of a potential of the node FD.

Structure Example of Sampling Circuit SC(j)

The sampling circuit SC(j) includes a first terminal IN(j), a second terminal, and a third terminal OUT(j) (see FIG. 12B). In addition, a node NS is included.

The first terminal is electrically connected to the conductive film WX(j), the second terminal is electrically connected to the conductive film CL, and the third terminal OUT(j) has a function of supplying a signal that changes on the basis of a potential of the first terminal IN(j).

Thus, an imaging signal can be obtained from the pixel circuit 530S($i,j$). A correlated double sampling method can be employed, for example. A differential signal of the pixel circuit 530S($i,j$) can be obtained by the corresponding conductive film WX(j). Noise can be reduced. Thus, a novel functional panel that is highly convenient, useful, or reliable can be provided.

Note that this embodiment can be combined with any of the other embodiments in this specification as appropriate.

Embodiment 3

In this embodiment, structures of a functional panel of one embodiment of the present invention are described with reference to FIG. 13 to FIG. 16B.

Figure 13:
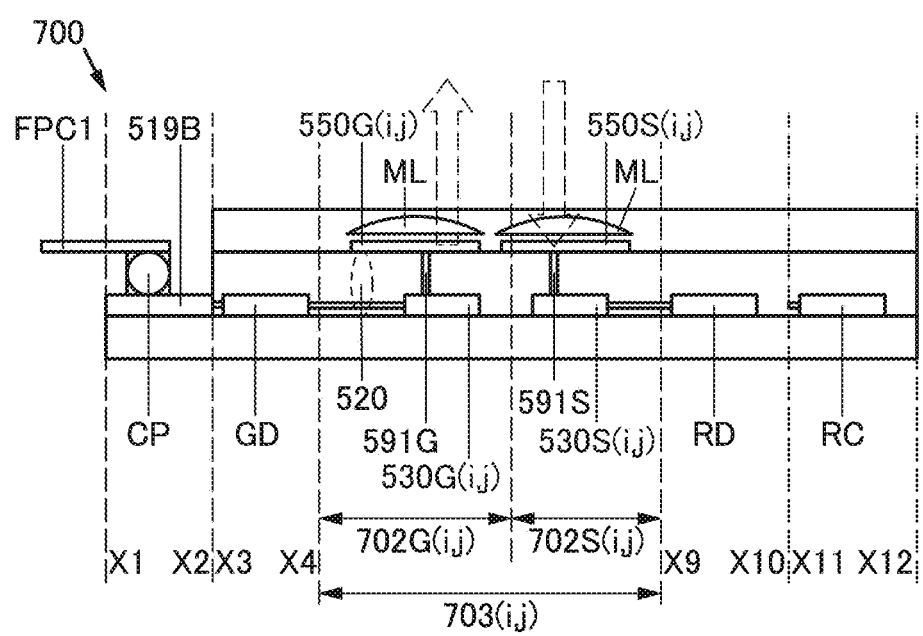
FIG. 13 is a cross-sectional view illustrating a structure of a functional panel of an embodiment.

FIG. 13 is a cross-sectional view taken along cutting lines X1-X2, X3-X4, X9-X10, and X11-X12 in FIG. 8A and in the pixel set 703($i,j$).

Figure 14A:
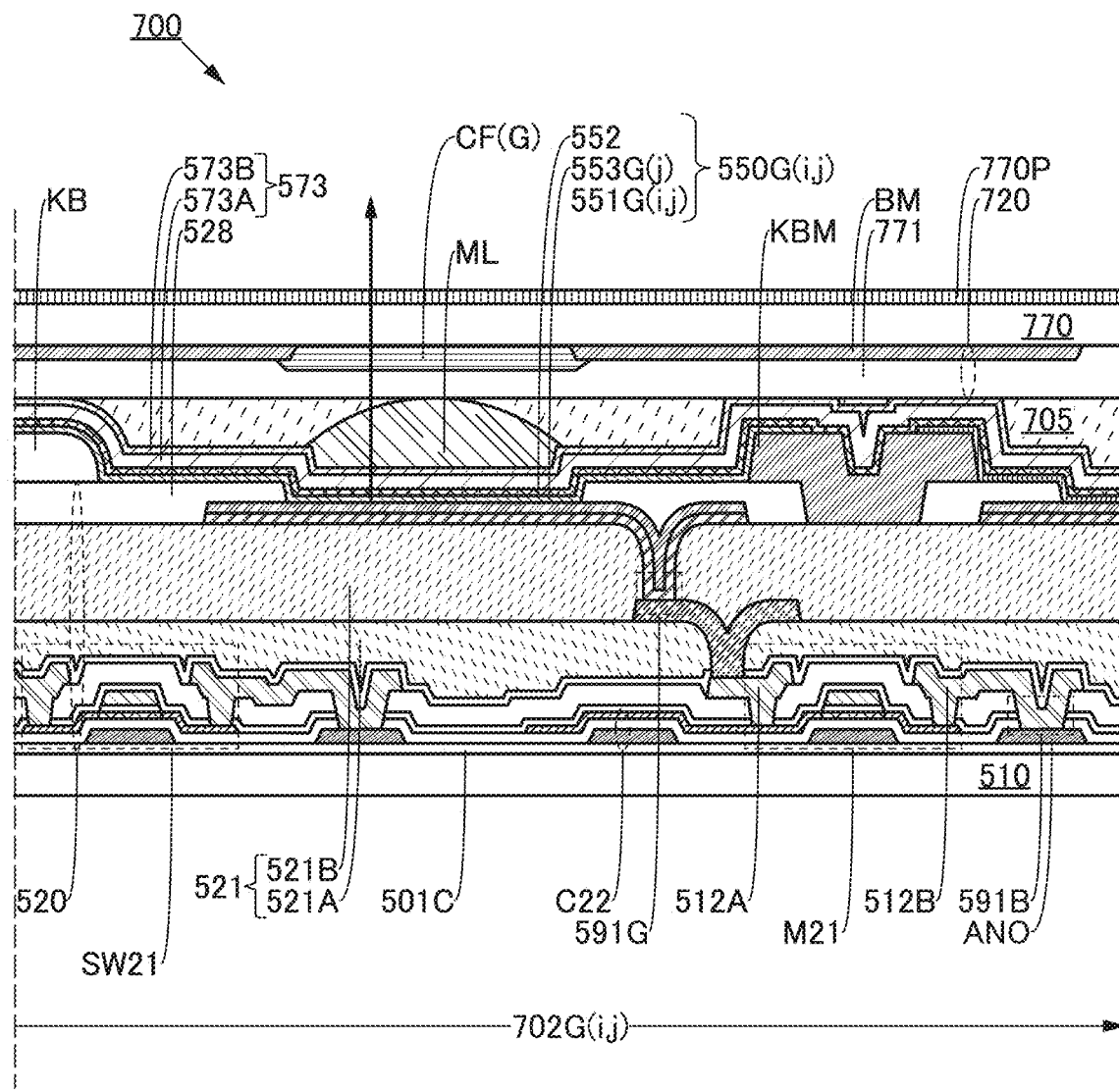
FIG. 14A and FIG. 14B are cross-sectional views illustrating a structure of a functional panel of an embodiment.
Figure 14B:
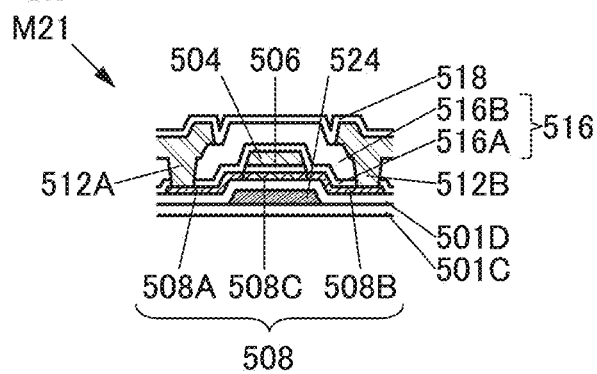

FIG. 14A is a cross-sectional view of the pixel 702G($i,j$) illustrated in FIG. 8B. FIG. 14B is a cross-sectional view illustrating part of FIG. 14A.

Figure 15A:
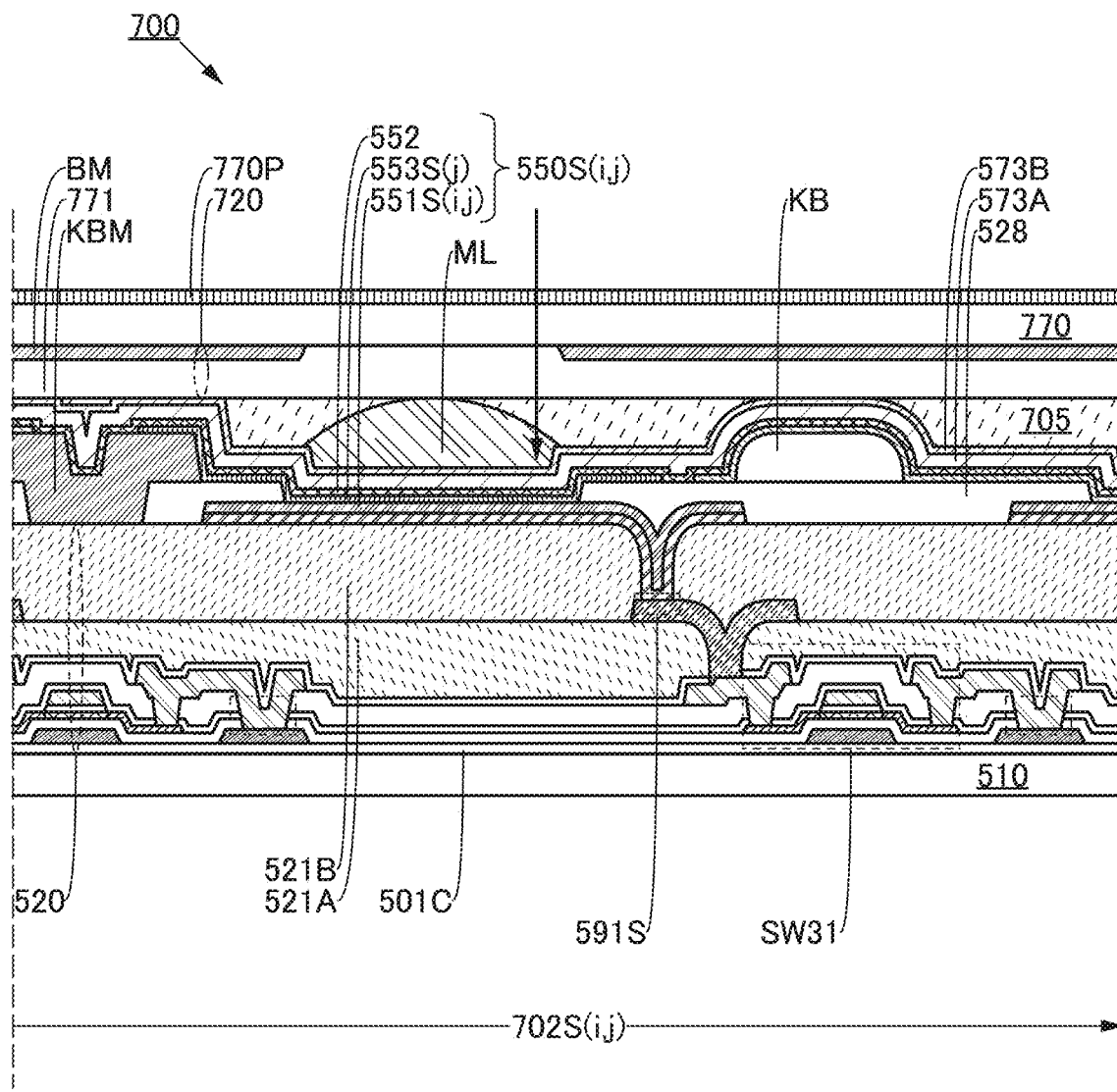
FIG. 15A and FIG. 15B are cross-sectional views illustrating a structure of a functional panel of an embodiment.
Figure 15B:
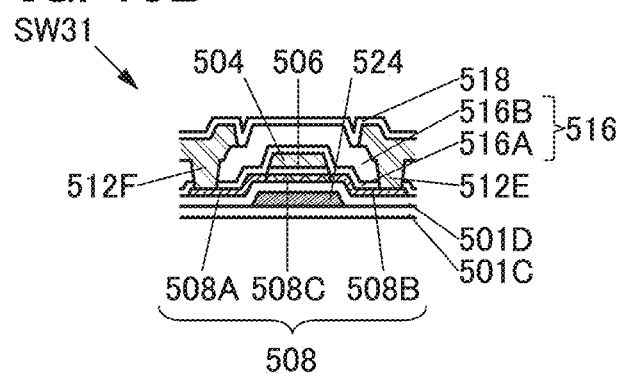

FIG. 15A is a cross-sectional view of the pixel 702S($i,j$) illustrated in FIG. 8B. FIG. 15B is a cross-sectional view illustrating part of FIG. 15A.

Figure 16A:
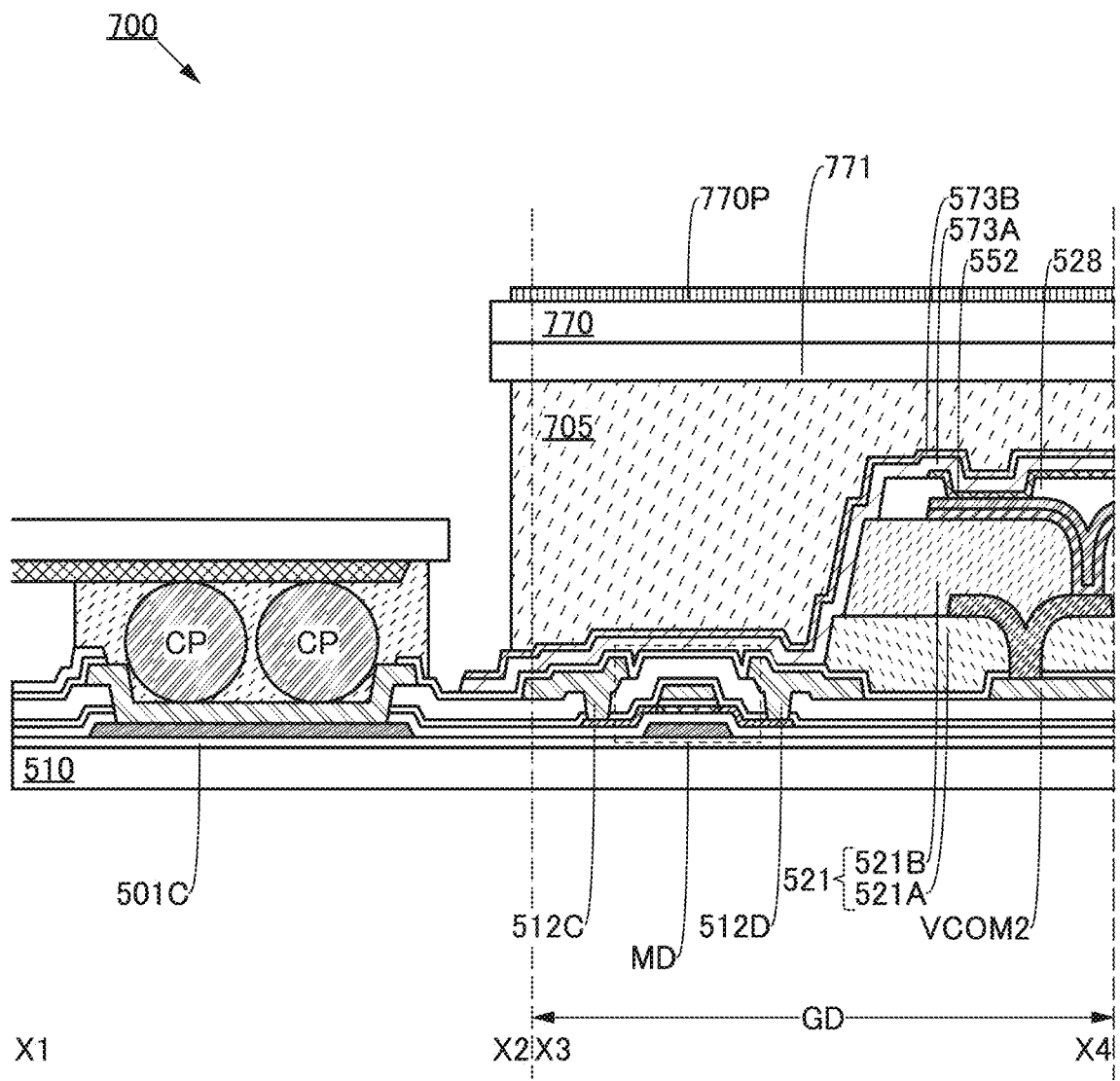
FIG. 16A and FIG. 16B are cross-sectional views illustrating a structure of a functional panel of an embodiment.
Figure 16B:
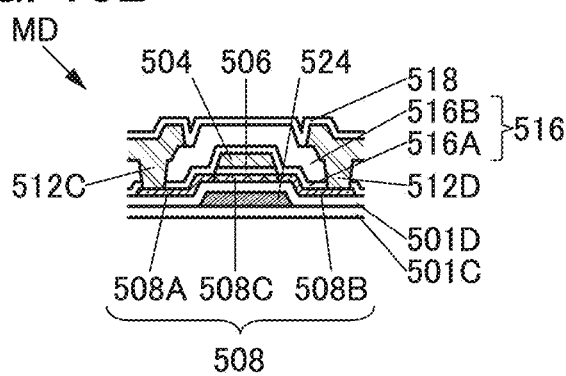

FIG. 16A is a cross-sectional view taken along the cutting line X1-X2 and the cutting line X3-X4 in FIG. 8A, and FIG. 16B is a diagram illustrating part of FIG. 16A.

Structure Example 1 of Functional Panel 700

The functional panel described in this embodiment includes a functional layer 520 (see FIG. 13).

Structure Example 1 of Functional Layer 520

The functional layer 520 includes the pixel circuit 530G (i,j) (see FIG. 13). The functional layer 520 includes, for example, the transistor M21 used in the pixel circuit 530G (i,j) (see FIG. 3 and FIG. 14A).

The functional layer 520 has an opening portion 591G. The pixel circuit 530G(i,j) is electrically connected to the element 550G(i,j) through the opening portion 591G (see FIG. 13 and FIG. 14A).

Structure Example 2 of Functional Layer 520

The functional layer 520 includes the pixel circuit 530S (i,j) (see FIG. 13). The functional layer 520 includes, for example, the transistor used as the switch SW31 in the pixel circuit 530S(i,j) (see FIG. 13 and FIG. 15A).

The functional layer 520 has an opening portion 591S, and the pixel circuit 530S(i,j) is electrically connected to the element 550S(i,j) through the opening portion 591S (see FIG. 13 and FIG. 15A).

Thus, the pixel circuit 530G(i,j) can be formed in the functional layer 520. The pixel circuit 530S(i,j) can be formed in the functional layer 520. A semiconductor film used in the pixel circuit 530S(i,j) can be formed in a step of forming a semiconductor film used in the pixel circuit 530G(i,j), for example. The manufacturing process can be simplified. Thus, a novel functional panel that is highly convenient, useful, or reliable can be provided.

Structure Example 3 of Functional Layer 520

The functional layer 520 includes a driver circuit GD (see FIG. 8A and FIG. 13). The functional layer 520 includes, for example, a transistor MD used in the driver circuit GD (see FIG. 13 and FIG. 16A).

The functional layer 520 includes a driver circuit RD and a reading circuit RC (see FIG. 13).

Thus, the semiconductor film used in the driver circuit GD can be formed in the step of forming the semiconductor film used in the pixel circuit 530G(i,j), for example. Semiconductor films used in the driver circuit RD and the reading circuit RC can be formed in the step of forming the semiconductor film used in the pixel circuit 530G(i,j), for example. The manufacturing process of the functional panel can be simplified. Thus, a novel functional panel that is highly convenient, useful, or reliable can be provided.

Structure Example of Transistor

A bottom-gate transistor, a top-gate transistor, or the like can be used in the functional layer 520. Specifically, a transistor can be used as a switch.

The transistor includes a semiconductor film 508, a conductive film 504, a conductive film 512A, and a conductive film 512B (see FIG. 14B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region interposed between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The semiconductor film 508 is interposed between a region of the conductive film 524 and the conductive film 504. The conductive film 524 has a function of a second gate electrode.

Note that the semiconductor film used in the transistor of the driver circuit can be formed in the step of forming the semiconductor film used in the transistor of the pixel circuit.

Structure Example 1 of Semiconductor Film 508

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a functional panel having less display unevenness than a functional panel using polysilicon for the semiconductor film 508, for example, can be provided. The size of the functional panel can be easily increased.

[Polysilicon]

For example, polysilicon can be used for the semiconductor film 508. In this case, the field-effect mobility of the transistor can be higher than that of a transistor using hydrogenated amorphous silicon for the semiconductor film 508, for example. The driving capability can be higher than that of a transistor using hydrogenated amorphous silicon for the semiconductor film 508, for example. The aperture ratio of the pixel can be higher than that in the case of using a transistor that uses hydrogenated amorphous silicon for the semiconductor film 508, for example.

The reliability of the transistor can be higher than that of a transistor using hydrogenated amorphous silicon for the semiconductor film 508, for example.

The temperature required for manufacture of the transistor can be lower than that required for a transistor using single crystal silicon, for example.

The semiconductor film used in the transistor of the driver circuit can be formed in the same step as the semiconductor film used in the transistor of the pixel circuit. The driver circuit can be formed over the same substrate where the pixel circuit is formed. The number of components included in an electronic device can be reduced.

[Single Crystal Silicon]

For example, single crystal silicon can be used for the semiconductor film 508. In this case, a functional panel can have higher resolution than a functional panel using hydrogenated amorphous silicon for the semiconductor film 508, for example. A functional panel having less display unevenness than a functional panel using polysilicon for the semiconductor film 508, for example, can be provided. Smart glasses or a head-mounted display can be provided, for example.

Structure Example 2 of Semiconductor Film 508

For example, a metal oxide can be used for the semiconductor film 508. In this case, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

The pixel circuit can hold the imaging signal for a longer time than a pixel circuit utilizing a transistor using amorphous silicon for a semiconductor film. Specifically, a fourth selection signal can be supplied at a frequency lower than 30 Hz, preferably lower than 1 Hz, further preferably less than once per minute. Accordingly, an image can be taken by a global shutter method. An image of a moving object can be taken while distortion is inhibited.

A transistor using an oxide semiconductor can be used, for example. Specifically, an oxide semiconductor containing indium, an oxide semiconductor containing indium, gallium, and zinc, an oxide semiconductor containing indium, gallium, zinc, and tin can be used for the semiconductor film.

A transistor having a lower leakage current in an off state than a transistor using amorphous silicon for a semiconductor film can be used, for example. Specifically, a transistor using an oxide semiconductor for a semiconductor film can be used as a switch or the like. In that case, a potential of a floating node can be held for a longer time than in a circuit in which a transistor using amorphous silicon is used as a switch.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing tantalum and nitrogen is interposed between a region of the film containing copper and the insulating film 506.

A stacked film in which a 400-nm-thick film containing silicon and nitrogen and a 200-nm-thick film containing silicon, oxygen, and nitrogen are stacked can be used as the insulating film 506, for example. Note that the film containing silicon, oxygen, and nitrogen is interposed between a region of the film containing silicon and nitrogen and the semiconductor film 508.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

Accordingly, flickering of a display can be inhibited. Power consumption can be reduced. A moving image with quick movements can be smoothly displayed. A photograph and the like can be displayed with a wide range of grayscale.

Thus, a novel functional panel that is highly convenient, useful, or reliable can be provided.

Structure Example 3 of Semiconductor Film 508

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

Structure Example of Capacitor

A capacitor includes one conductive film, a different conductive film, and an insulating film. The insulating film includes a region interposed between the one conductive film and the different conductive film.

For example, a conductive film used as the source electrode or the drain electrode of the transistor, a conductive film used as the gate electrode, and an insulating film used as the gate insulating film can be used for the capacitor.

Structure Example 2 of Functional Layer 520

The functional layer 520 includes an insulating film 521, an insulating film 518, an insulating film 516, the insulating film 506, an insulating film 501C, and the like (see FIG. 14A and FIG. 14B).

The insulating film 521 includes a region interposed between the pixel circuit 530G(i,j) and the element 550G(i, j).

The insulating film 518 includes a region interposed between the insulating film 521 and the insulating film 501C.

The insulating film 516 includes a region interposed between the insulating film 518 and the insulating film 501C.

The insulating film 506 includes a region interposed between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

The insulating film 521 may be formed using a photosensitive material. Specifically, a film formed using photosensitive polyimide, a photosensitive acrylic resin, or the like can be used as the insulating film 521.

Thus, the insulating film 521 can eliminate a level difference due to various components overlapping with the insulating film 521, for example.

[Insulating Film 518]

The material that can be used for the insulating film 521, for example, can be used for the insulating film 518.

For example, a material having a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

The material that can be used for the insulating film 521, for example, can be used for the insulating film 516.

Specifically, a film formed by a manufacturing method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region interposed between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the element 550G($i,j$), the element 550S($i,j$), or the like can be inhibited.

Structure Example 3 of Functional Layer 520

The functional layer 520 includes a conductive film, a wiring, and a terminal. A material having conductivity can be used for the wiring, an electrode, the terminal, the conductive film, and the like.

[Wiring and the Like]

For example, an inorganic conductive material, an organic conductive material, a metal, a conductive ceramic, or the like can be used for the wiring and the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring and the like. Alternatively, an alloy containing the above-described metal element, or the like can be used for the wiring and the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring and the like.

Specifically, a conductive oxide such as indium oxide, indium tin oxide, indium zinc oxide, zinc oxide, or zinc oxide to which gallium is added can be used for the wiring and the like.

Specifically, a film containing graphene or graphite can be used for the wiring and the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring and the like. Specifically, a nanowire containing silver can be used.

Specifically, a conductive polymer can be used for the wiring and the like.

Note that a terminal 519B can be electrically connected to a flexible printed circuit FPC1 using a conductive material, for example (see FIG. 13). Specifically, the terminal 519B can be electrically connected to the flexible printed circuit FPC1 using a conductive material CP.

Structure Example 2 of Functional Panel 700

The functional panel 700 includes a base material 510, a base material 770, and the sealant 705 (see FIG. 14A). In addition, the functional panel 700 includes a structure body KB.

<<Base Material 510 and Base Material 770>>

A material having a light-transmitting property can be used for the base material 510 or the base material 770.

For example, a flexible material can be used for the base material 510 or the base material 770. Thus, a flexible functional panel can be provided.

For example, a material with a thickness less than or equal to 0.7 mm and greater than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be manufactured.

For the base material 510 or the base material 770, an organic material, an inorganic material, a composite material of an organic material and an inorganic material, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Aluminosilicate glass, tempered glass, chemically tempered glass, sapphire, or the like can be suitably used for the base material 510 or the base material 770 that is provided on the side close to a user of the functional panel. Thus, the functional panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate or a polycrystalline semiconductor substrate of silicon or silicon carbide, a compound semiconductor substrate of silicon germanium or the like, an SOI substrate, or the like can be used as the base material 510 or the base material 770. Thus, a semiconductor element can be formed on the base material 510 or the base material 770.

For example, an organic material such as a resin, a resin film, or plastic can be used for the base material 510 or the base material 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base material 510 or the base material 770. For example, a resin film, a resin plate, a stacked-layer material, or the like containing any of these materials can be used. Thus, the weight can be reduced. The frequency of occurrence of breakage or the like due to dropping can be reduced, for example.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into a resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Diffusion of impurities contained in glass or a resin can be prevented. Diffusion of impurities that pass through a resin can be prevented.

Furthermore, paper, wood, or the like can be used for the base material 510 or the base material 770.

For example, a material having heat resistance high enough to withstand heat treatment in the manufacturing process can be used for the base material 510 or the base material 770. Specifically, a material having heat resistance to heat applied in the formation process of directly forming the transistor, the capacitor, or the like can be used for the base material 510 or the base material 770.

For example, a method in which an insulating film, a transistor, a capacitor, or the like is formed on a process substrate having heat resistance to heat applied in the manufacturing process, and the formed insulating film, transistor, capacitor, or the like is transferred to the base material 510 or the base material 770 can be used. Accordingly, an insulating film, a transistor, a capacitor, or the like can be formed on a flexible substrate, for example.

<<Sealant 705>>

The sealant 705 includes a region interposed between the functional layer 520 and the base material 770 and has a function of bonding the functional layer 520 and the base material 770 together (see FIG. 14A).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<<Structure Body KB>>

The structure body KB includes a region interposed between the functional layer 520 and the base material 770. The structure body KB has a function of providing a predetermined space between the functional layer 520 and the base material 770.

Note that this embodiment can be combined with any of the other embodiments in this specification as appropriate.

Embodiment 4

In this embodiment, structures of a functional panel of one embodiment of the present invention are described with reference to FIG. 14A to FIG. 15B.

Structure Example 1 of Functional Panel 700

The functional panel 700 includes the element 550G($i,j$) and the element 550S($i,j$) (see FIG. 13).

Structure Example 1 of Element 550G($i,j$)

The electrode 550G($i,j$) includes the electrode 551G($i,j$), the electrode 552, and a layer 553G($j$) containing a light-emitting material (see FIG. 14A). The layer 553G($j$) containing a light-emitting material includes a region interposed between the electrode 551G($i,j$) and the electrode 552.

Structure Example 1 of Layer 553G($j$) Containing Light-Emitting Material

A stacked-layer material can be used for the layer 553G($j$) containing a light-emitting material, for example.

For example, a material emitting blue light, a material emitting green light, a material emitting red light, a material emitting infrared rays, or a material emitting ultraviolet rays can be used for the layer 553G($j$) containing a light-emitting material.

Structure Example 2 of Layer 553G($j$) Containing Light-Emitting Material

A stacked-layer material stacked to emit white light can be used for the layer 553G($j$) containing a light-emitting material, for example.

Specifically, a plurality of materials emitting light with different hues can be used for the layer 553G($j$) containing a light-emitting material.

For example, a stacked-layer material in which a layer containing a light-emitting material containing a fluorescent material that emits blue light and a layer containing materials that are other than fluorescent materials and emit green light and red light are stacked can be used for the layer 553G($j$) containing a light-emitting material. A stacked-layer material in which a layer containing a light-emitting material containing a fluorescent material that emits blue light and a layer containing a material that is other than a fluorescent material and emits yellow light are stacked can be used for the layer 553G($j$) containing a light-emitting material.

Note that the layer 553G($j$) containing a light-emitting material can be used with a coloring film CF overlapping, for example. Thus, light of a predetermined hue can be extracted from white light.

Structure Example 3 of Layer 553G($j$) Containing Light-Emitting Material

A stacked-layer material stacked to emit blue light or ultraviolet rays can be used for the layer 553G($j$) containing a light-emitting material, for example. A color conversion layer can be used to overlap with the layer 553G($j$) containing a light-emitting material, for example.

Structure Example 4 of Layer 553G($j$) Containing Light-Emitting Material

The layer 553G($j$) containing a light-emitting material includes a light-emitting unit. The light-emitting unit includes one region where electrons injected from one side are recombined with holes injected from the other side. The light-emitting unit contains a light-emitting material, and the light-emitting material releases energy generated by recombination of electrons and holes as light. Note that a hole-transport layer and an electron-transport layer can be used in the light-emitting unit. The hole-transport layer is placed closer to the positive electrode than the electron-transport layer is, and has higher hole mobility than the electron-transport layer.

A plurality of light-emitting units and an intermediate layer can be used for the layer 553G($j$) containing a light-emitting material, for example. The intermediate layer includes a region interposed between two light-emitting units. The intermediate layer includes a charge-generation region, and the intermediate layer has functions of supplying holes to the light-emitting unit placed on the cathode side and supplying electrons to the light-emitting unit placed on the anode side. Furthermore, a structure including a plurality of light-emitting units and an intermediate layer is referred to as a tandem light-emitting element in some cases.

Accordingly, the current efficiency of light emission can be increased. The density of current flowing through the light-emitting element at the same luminance can be reduced. The reliability of the light-emitting element can be increased.

For example, a light-emitting unit containing a material emitting light with one hue and a light-emitting unit containing a material emitting light with a different hue can be stacked and used for the layer 553G($j$) containing a light-emitting material. A light-emitting unit containing a material emitting light with one hue and a light-emitting unit containing a material emitting light with the same hue can be stacked and used for the layer 553G($j$) containing a light-emitting material. Specifically, two light-emitting units each containing a material emitting blue light can be stacked and used.

For the layer 553G($j$) containing a light-emitting material, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used.

[Electrode 551G($i,j$) and Electrode 552]

The material that can be used for the wiring or the like, for example, can be used for the electrode 551G($i,j$) or the electrode 552. Specifically, a material having a visible-light-transmitting property can be used for the electrode 551G($i,j$) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material having a visible-light-transmitting property can be used.

For example, a metal film that transmits part of light and reflects another part of the light can be used for the electrode 551G($i,j$) or the electrode 552. The distance between the electrode 551G($i,j$) and the electrode 552 is adjusted using the layer 553G($j$) containing a light-emitting material, for example.

Thus, a microcavity structure can be provided in the element 550G($i,j$). Light of a predetermined wavelength can be extracted more efficiently than other light. Light with a narrow half width of a spectrum can be extracted. Light of a bright color can be extracted.

A film that efficiently reflects light, for example, can be used for the electrode 551G($i,j$) or the electrode 552. Specifically, a material containing silver, palladium, and the like or a material containing silver, copper, and the like can be used for the metal film.

The electrode 551G($i,j$) is electrically connected to the pixel circuit 530G($i,j$) through the opening portion 591G (see FIG. 15A). For example, the electrode 551G($i,j$) overlaps with the opening portion formed in the insulating film 528, and the insulating film 528 is at the periphery of the electrode 551G($i,j$).

Thus, a short circuit between the electrode 551G($i,j$) and the electrode 552 can be prevented.

Structure Example 1 of Element 550S($i,j$)

The element 550S($i,j$) includes an electrode 551S($i,j$), the electrode 552, and a layer 553S($j$) containing a photoelectric conversion material (see FIG. 15A). Note that the electrode 551S($i,j$) is electrically connected to the pixel circuit 530S($i,j$), and the electrode 552 is electrically connected to a conductive film VPD (see FIG. 11). The electrode 552 used in the element 550G($i,j$) can be used in the element 550S($i,j$).

Thus, the structure and the manufacturing process of the functional panel can be simplified.

For example, a heterojunction photoelectric conversion element, a bulk heterojunction photoelectric conversion element, or the like can be used as the element 550S(i,j).

Structure Example 1 of Layer 553S(j) Containing Photoelectric Conversion Material For example, a stacked-layer film in which a p-type semiconductor film and an n-type semiconductor film are stacked in contact with each other can be used as the layer 553S(j) containing a photoelectric conversion material. Note that the element 550S(i,j) in which a stacked-layer film with such a structure is used as the layer 553S(j) containing a photoelectric conversion material can be referred to as a PN photodiode.

For example, a stacked-layer film in which a p-type semiconductor film, an i-type semiconductor film, and an n-type semiconductor film are stacked such that the i-type semiconductor film is interposed between the p-type semiconductor film and the n-type semiconductor film can be used as the layer 553S(j) containing a photoelectric conversion material. Note that the element 550S(i,j) in which a stacked-layer film with such a structure is used as the layer 553S(j) containing a photoelectric conversion material can be referred to as a PIN photodiode.

For example, a stacked-layer film in which a p+-type semiconductor film, a p--type semiconductor film, a p-type semiconductor film, and an n-type semiconductor film are stacked such that the p--type semiconductor film is interposed between the p+-type semiconductor film and the n-type semiconductor film and the p-type semiconductor film is interposed between the p--type semiconductor film and the n-type semiconductor film can be used as the layer 553S(j) containing a photoelectric conversion material. Note that the element 550S(i,j) in which a stacked-layer film with such a structure is used as the layer 553S(j) containing a photoelectric conversion material can be referred to as an avalanche photodiode.

Structure Example 2 of Layer 553S(j) Containing Photoelectric Conversion Material For example, a semiconductor containing a Group 14 element can be used for the layer 553S(j) containing a photoelectric conversion material. Specifically, a semiconductor containing silicon can be used for the layer 553S(j) containing a photoelectric conversion material. For example, hydrogenated amorphous silicon, microcrystalline silicon, polysilicon, single crystal silicon, or the like can be used for the layer 553S(j) containing a photoelectric conversion material.

For example, an organic semiconductor can be used for the layer 553S(j) containing a photoelectric conversion material. Specifically, part of the layer used as the layer 553G(j) containing a light-emitting material can be used as part of the layer 553S(j) containing a photoelectric conversion material.

Specifically, a hole-transport layer used in the layer 553G(j) containing a light-emitting material can be used in the layer 553S(j) containing a photoelectric conversion material. An electron-transport layer used in the layer 553G(j) containing a light-emitting material can be used in the layer 553S(j) containing a photoelectric conversion material. The hole-transport layer and the electron-transport layer can be used in the layer 553S(j) containing a photoelectric conversion material.

Thus, in a step of forming the hole-transport layer used in the layer 553G(j) containing a light-emitting material, the hole-transport layer used in the layer 553S(j) containing a photoelectric conversion material can be formed. In a step of forming the electron-transport layer used in the layer 553G(j) containing a light-emitting material, the electron-transport layer used in the layer 553S(j) containing a photoelectric conversion material can be formed. The manufacturing process can be simplified.

For example, an electron-accepting organic semiconductor material such as fullerene (e.g., $C_{60}$ or $C_{70}$) or the derivative thereof can be used for the n-type semiconductor film.

For example, a fullerene derivative dissolved or dispersed in a first solvent can be used for the layer 553S(i,j) containing a photoelectric conversion material. Specifically, [6,6]-Phenyl-C71-butyric acid methyl ester (abbreviation: PC70BM), [6,6]-Phenyl-C61-butyric acid methyl ester (abbreviation: PC60BM), 1',1",4',4"-Tetrahydro-di[1,4]methanonaphthaleno[1,2:2',3',56,60:2",3"][5,6]fullerene-C60 (abbreviation: ICBA), or the like can be used for the layer 553S(i,j) containing a photoelectric conversion material.

For example, an electron-donating organic semiconductor material such as copper(II) phthalocyanine (CuPc) or tetraphenyldibenzoperiflanthene (DBP) can be used for the p-type semiconductor film.

For example, a π-conjugated organic high molecular material, an oligomer, or a low molecular material dissolved or dispersed in the first solvent can be used for the layer 553S(i,j) containing a photoelectric conversion material. Specifically, a polyphenylene-vinylene-based material, a polythiophene-based material, or the like can be used for the layer 553S(i,j) containing a photoelectric conversion material. Specifically, Poly ([2,6'-4,8-di(5-ethylhexylthienyl)benzo[1,2-b; 3,3-b]dithiophene]{3-fluoro-2[(2-ethylhexyl)carbonyl]thieno[3,4-b]thiophenediyl}) (abbreviation: PTB7-Th), Poly({4,8-bis[(2-ethylhexyl)oxy]benzo[1,2-b:4,5-b']dithiophene-2,6-diyl}{3-fluoro-2-[(2-ethylhexyl)carbonyl]thieno[3,4-b]thiophenediyl}) (abbreviation: PYB7), Poly(3-hexylthiophene-2,5-diyl) (abbreviation: P3HT), or the like can be used for the layer 553S(i,j) containing a photoelectric conversion material.

For example, a film obtained by co-evaporation of an electron-accepting semiconductor material and an electron-donating semiconductor material can be used as the i-type semiconductor film.

Structure Example 2 of Functional Panel 700

The functional panel 700 includes the insulating film 528 and an insulating film 573 (see FIG. 14A).

<<Insulating Film 528>>

The insulating film 528 includes a region interposed between the functional layer 520 and the base material 770, and the insulating film 528 has an opening portion in a region overlapping with the element 550G(i,j) and the element 550S(i,j) (see FIG. 14A).

The material that can be used for the insulating film 521, for example, can be used for the insulating film 528. Specifically, a silicon oxide film, a film containing an acrylic resin, a film containing polyimide, or the like can be used as the insulating film 528.

<<Insulating Film 573>>

The element 550G(i,j) and the element 550S(i,j) are interposed between a region of the insulating film 573 and the functional layer 520 (see FIG. 14A).

For example, a single film or a stacked film in which a plurality of films are stacked can be used as the insulating film 573. Specifically, a stacked film, in which an insulating film 573A which can be formed by a method that hardly damages the element 550G(i,j) and the element 550S(i,j) and a dense insulating film 573B with a few defects are stacked, can be used as the insulating film 573.

Thus, diffusion of impurities into the element 550G(i,j) and the element 550S(i,j) can be inhibited. The reliability of the element 550G(i,j) and the element 550S(i,j) can be increased.

Structure Example 3 of Functional Panel 700

The functional panel 700 includes a functional layer 720 (see FIG. 14A).

<<Functional Layer 720>>

The functional layer 720 includes a light-blocking film BM, the coloring film CF(G), and an insulating film 771. A color conversion layer can also be used.

<<Light-Blocking Film BM>>

The light-blocking film BM has an opening portion in a region overlapping with the pixel 702G(i,j). The light-blocking film BM has an opening portion in a region overlapping with the pixel 702S(i,j).

A material of a dark color can be used for the light-blocking film BM, for example. Thus, the display contrast can be increased.

<<Coloring Film CF(G)>>

The coloring film CF(G) includes a region interposed between the base material 770 and the element 550G(i,j). A material that selectively transmits light of a predetermined color, for example, can be used for the coloring film CF(G). Specifically, a material that transmits red light, green light, or blue light can be used for the coloring film CF(G).

Structure Example of Insulating Film 771

The insulating film 771 includes a region interposed between the base material 770 and the element 550G(i,j).

The light-blocking layer BM, the coloring layer CF(G), or color conversion are interposed between a region of the insulating film 771 and the base material 770. Thus, unevenness due to the thicknesses of the light-blocking layer BM, the coloring film CF(G), or the color conversion layer can be reduced.

<<Color Conversion Layer>>

The color conversion layer includes a region interposed between the base material 770 and the element 550G(i,j).

For example, a material that emits light with a wavelength longer than a wavelength of incident light can be used for the color conversion layer. For example, a material that absorbs blue light or ultraviolet rays, converts it into green light, and emits the green light, a material that absorbs blue light or ultraviolet rays, converts it into red light, and emits the red light, or a material that absorbs ultraviolet rays, converts it into blue light, and emits the blue light can be used for the color conversion layer. Specifically, a quantum dot with a diameter of several nanometers can be used for the color conversion layer. Thus, light having a spectrum with a narrow half width can be emitted. Light with high saturation can be emitted.

Structure Example 4 of Functional Panel 700

The functional panel 700 includes a light-blocking film KBM (see FIG. 14A).

<<Light-Blocking Film KBM>>

The light-blocking film KBM has an opening portion in a region overlapping with the pixel 702S(i,j). Moreover, the light-blocking film KBM includes a region interposed between the functional layer 520 and the base material 770, and has a function of providing a predetermined space between the functional layer 520 and the base material 770. A material of a dark color can be used for the light-blocking film KBM, for example. Thus, stray light that would enter the pixel 702S(i,j) can be reduced.

Structure Example 5 of Functional Panel 700

The functional panel 700 includes a functional film 770P or the like (see FIG. 14A).

<<Functional Film 770P and the Like>>

The functional film 770P includes a region overlapping with the element 550G(i,j).

An anti-reflection film, a polarizing film, a retardation film, a light diffusion film, a condensing film, or the like can be used as the functional film 770P, for example.

For example, an anti-reflection film with a thickness less than or equal to 1 μm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an oil repellent film inhibiting the attachment of a stain, an antireflective film (anti-reflection film), a non-glare film (anti-glare film), a hard coat film inhibiting generation of a scratch in use, a self-healing film that self-heals from generated scratches, or the like can be used as the functional film 770P.

Note that this embodiment can be combined with any of the other embodiments in this specification as appropriate.

Embodiment 5

In this embodiment, structures of a functional panel of one embodiment of the present invention are described with reference to FIG. 17A to FIG. 18.

Figure 17A:
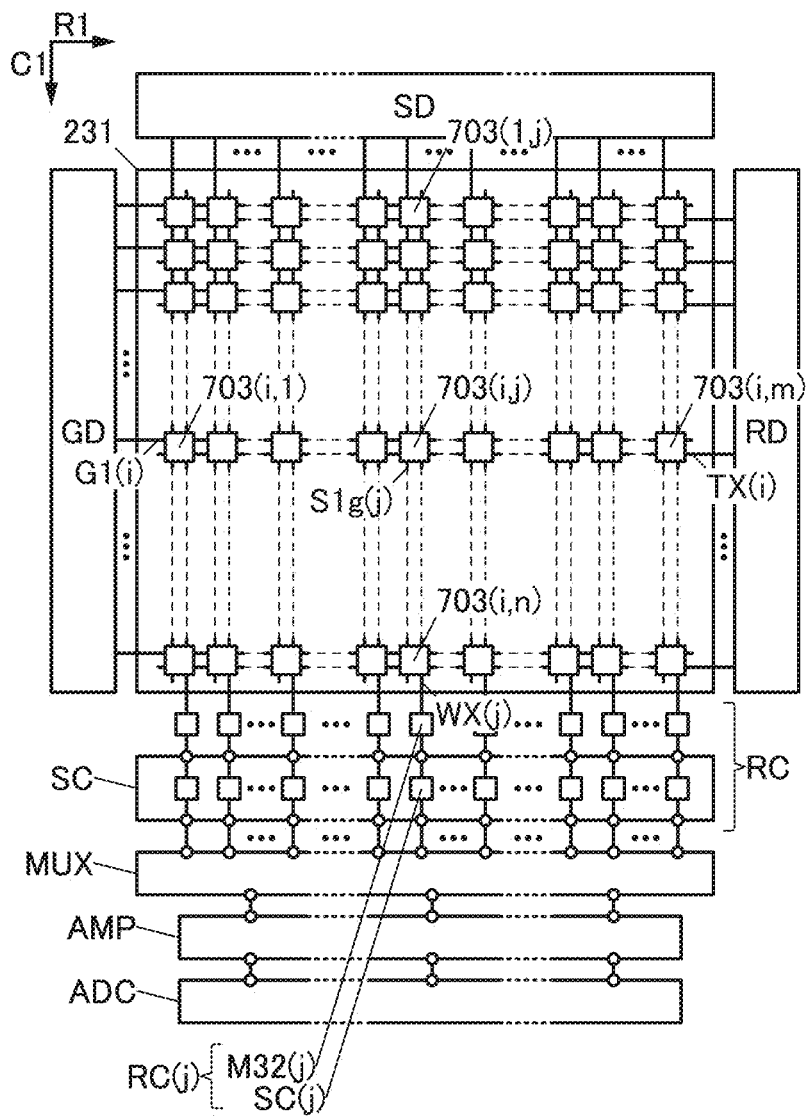
FIG. 17A and FIG. 17B are diagrams illustrating a structure of a functional panel of an embodiment.
Figure 17B:
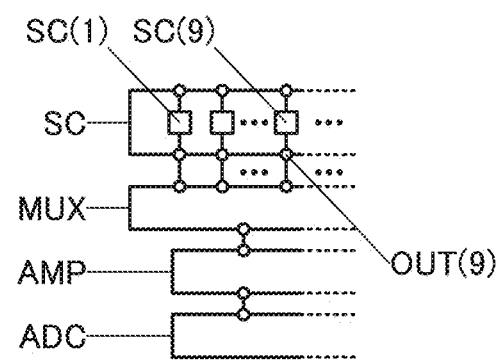

FIG. 17A is a block diagram illustrating a structure of the functional panel of one embodiment of the present invention, and FIG. 17B is a block diagram illustrating part of FIG. 17A.

Figure 18:
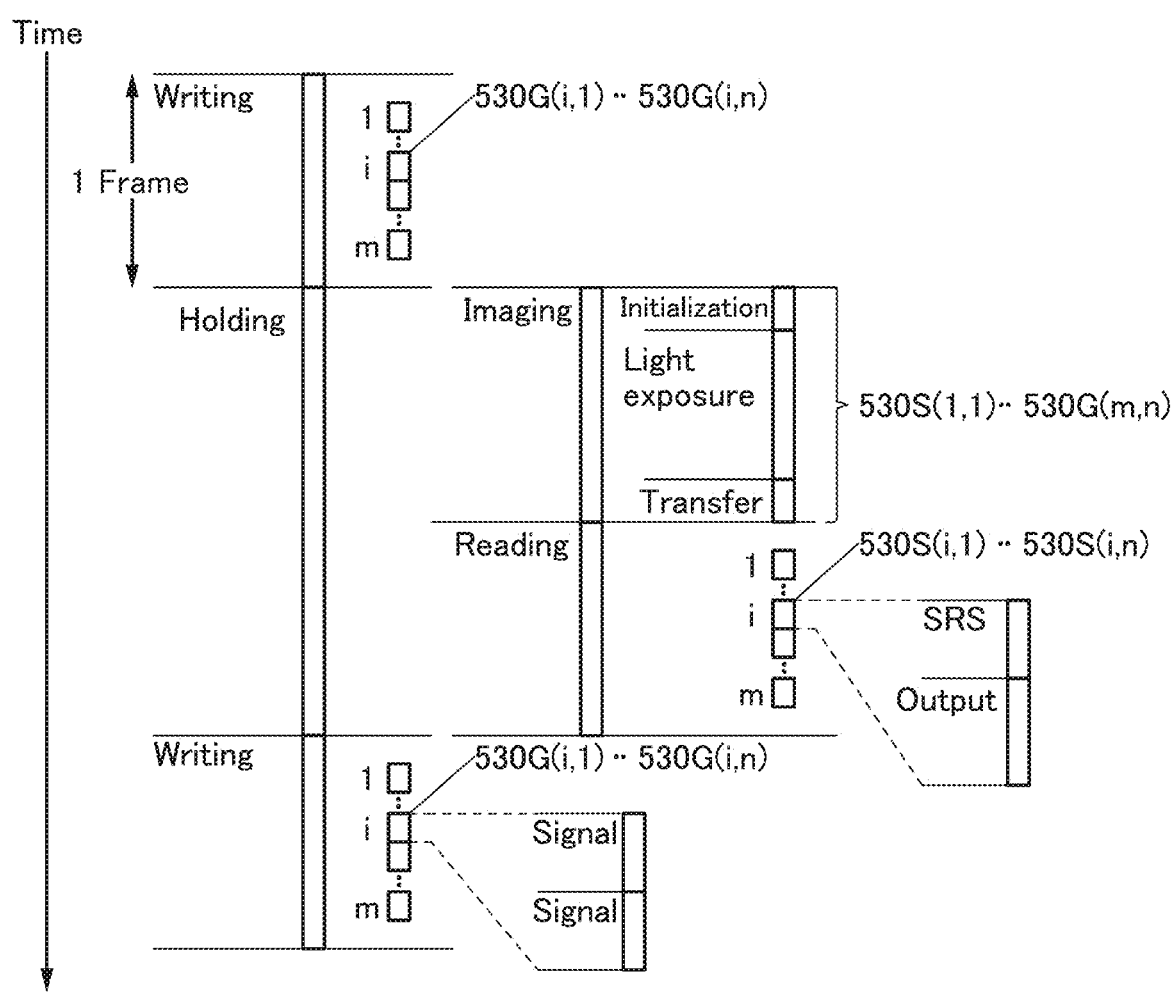
FIG. 18 is a diagram showing an operation of a functional panel of an embodiment.

FIG. 18 is a diagram showing an operation of the functional panel of one embodiment of the present invention.

Structure Example 1 of Functional Panel 700

The functional panel 700 described in this embodiment includes a region 231 (see FIG. 17A).

Structure Example 1 of Region 231

The region 231 includes a group of pixel sets 703(i,1) to 703(i,n) and a different group of pixel sets 703(1,j) to 703(m,j). The region 231 also includes the conductive film G1(i), the conductive film TX(i), the conductive film S1g(j), and the conductive film WX(j).

The group of pixel sets 703(i,1) to 703(i,n) is provided in the row direction (the direction indicated by an arrow R1 in the drawing), and the group of pixel sets 703(i,1) to 703(i,n) includes the pixel set 703(i,j).

Furthermore, the group of pixel sets 703(i,1) to 703(i,n) is electrically connected to the conductive film G1(i). The group of pixel sets 703(i,1) to 703(i,n) is electrically connected to the conductive film TX(i).

The different group of pixel sets 703(1,j) to 703(m,j) is provided in the column direction (the direction indicated by an arrow C1 in the drawing) intersecting the row direction, and the different group of pixel sets 703(1,j) to 703(m,j) includes the pixel set 703(i,j).

The different group of pixel sets 703(1,j) to 703(m,j) is electrically connected to the conductive film S1g(j). The other group of pixel sets 703(1,j) to 703(m,j) is electrically connected to the conductive film WX(j).

Thus, image data can be supplied to a plurality of pixels. Alternatively, imaging data can be obtained from a plurality of pixels. Thus, a novel functional panel that is highly convenient, useful, or reliable can be provided.

Structure Example 2 of Region 231

The region 231 includes 500 or more groups of pixel sets per inch. Furthermore, the region 231 includes 1000 or more groups of pixel sets per inch, preferably 5000 or more groups of pixel sets per inch, further preferably 10000 or more groups of pixel sets per inch. Note that the group of pixel sets include the pixel set 703(i,j).

Structure Example 3 of Region 231

The region 231 includes a plurality of pixels arranged in a matrix. For example, the region 231 includes 7600 or more pixels in the row direction, and the region 231 includes 4300 or more pixels in the column direction. Specifically, 7680 pixels are provided in the row direction and 4320 pixels are provided in the column direction.

This enables display of a high-resolution image. As a result, a novel functional panel that is highly convenient or reliable can be provided.

Structure Example 4 of Region 231

The diagonal size of the region 231 is greater than or equal to 40 inches, preferably greater than or equal to 60 inches, further preferably greater than or equal to 80 inches. The diagonal size of the region 231 is preferably, for example, less than or equal to 150 inches, in which case the weight can be light.

This enables display of a realistic image. As a result, a novel functional panel that is highly convenient or reliable can be provided.

Structure Example 2 of Functional Panel 700

The functional panel 700 of one embodiment of the present invention includes a group of sampling circuits SC, a multiplexer MUX, an amplifier circuit AMP, and an analog-digital converter circuit ADC (see FIG. 17A). Note that the group of sampling circuits SC includes a sampling circuit SC(j).

The sampling circuit SC(j) can be provided for each conductive film WX(j). A differential signal of the pixel circuit 530S(i,j) can be obtained by the corresponding conductive film WX(j). The operating frequency of the sampling circuit SC(j) can be low. Noise can be reduced. As a result, a novel functional panel that is highly convenient or reliable can be provided.

Structure Example of Multiplexer MUX

The multiplexer MUX has a function of selecting one sampling circuit from a group of sampling circuits to obtain an imaging signal. For example, the multiplexer MUX selects the sampling circuit SC(j) to obtain the imaging signal.

Specifically, the multiplexer MUX is electrically connected to a sampling circuit SC(1) to a sampling circuit SC(9), and selects one sampling circuit SC to obtain an imaging signal (see FIG. 17B). For example, the multiplexer MUX is electrically connected to a third terminal OUT(9) of the sampling circuit SC(9).

The multiplexer MUX is electrically connected to the amplifier circuit AMP and has a function of supplying the obtained imaging signal.

Thus, a predetermined pixel can be selected from a plurality of pixels arranged in the row direction. Alternatively, imaging data can be obtained from a predetermined pixel. Alternatively, the number of imaging signals obtained concurrently can be reduced with use of a plurality of multiplexers. Alternatively, an analog-digital converter circuit ADC in which the number of input channels is smaller than the number of pixels arranged in the row direction can be used. As a result, a novel functional panel that is highly convenient, useful, or reliable can be provided.

Structure Example of Amplifier Circuit AMP

The amplifier circuit AMP can amplify the imaging signal and supply the amplified signal to the analog-digital converter circuit ADC.

Note that the functional layer 520 includes the multiplexer MUX and the amplifier circuit AMP.

Accordingly, for example, in the step of forming the semiconductor film used in the pixel circuit 530G(i,j), semiconductor films used in the multiplexer MUX and the amplifier circuit AMP can be formed. The manufacturing process of the functional panel can be simplified. Thus, a novel functional panel that is highly convenient, useful, or reliable can be provided.

Structure Example of Analog-Digital Converter Circuit ADC

The analog-digital converter circuit ADC has a function of converting an analog imaging signal to a digital signal. This can suppress deterioration of an imaging signal due to transmission.

Structure Example 3 of Functional Panel 700

The functional panel 700 of one embodiment of the present invention includes the driver circuit GD, the driver circuit RD, and one pixel set 703(i,j). The driver circuit GD has a function of supplying the first selection signal, and the driver circuit RD has a function of supplying the fourth selection signal and the fifth selection signal.

Structure Example 1 of Pixel 703(i,j)

The pixel set 703(i,j) is supplied with the fourth selection signal and the fifth selection signal in a period during which the first selection signal is not supplied (see FIG. 18). In addition, the pixel circuit 530S($i,j$) obtains an imaging signal on the basis of the fourth selection signal, and supplies the imaging signal on the basis of the fifth selection signal.

Note that for example, the first selection signal can be supplied with use of the conductive film G1($i$), the fourth selection signal can be supplied with use of the conductive film TX(i), and the fifth selection signal can be supplied with use of the conductive film SE(i) (see FIG. 11).

The operation of supplying the fourth selection signal and making the pixel circuit 530S($i,j$) obtain an imaging signal can be referred to as "imaging" (see FIG. 18). The operation of reading an imaging signal from the pixel circuit 530S($i,j$) can be referred to as "reading". The operation of supplying a predetermined voltage to the element 550S($i,j$) can be referred to as "initialization", the operation of exposing the initialized element 550S($i,j$) to light in a predetermined period as "light exposure", and the operation of reflecting a voltage that has been changed along with the light exposure on the pixel circuit 530S($i,j$) as "transfer". Moreover, in the figure, SRS corresponds to the operation of supplying a reference signal used in a correlated double sampling method, and "output" corresponds to the operation of supplying an imaging signal.

For example, image data of one frame can be written in 16.7 ms. Specifically, the operation can be performed at a frame rate of 60 Hz. Note that an image signal can be written to the pixel circuit 530G($i,j$) in 15.2 µs.

For example, image data of one frame can be held in a period corresponding to 16 frames. Imaging data of one frame can be imaged and read in a period corresponding to 16 frames.

Specifically, it is possible to perform the initialization in 15 µs, the light exposure in a period from 1 ms to 5 ms, and the transfer in 150 µs. Moreover, the reading can be performed in 250 ms.

Accordingly, imaging can be performed in a period during which the first selection signal is not supplied. Noise in imaging can be inhibited. An imaging signal can be read in the period during which the first selection signal is not supplied. Noise in reading can be inhibited. As a result, a novel functional panel that is highly convenient, useful, or reliable can be provided.

Structure Example 2 of Pixel 703($i,j$)

The pixel 703($i,j$) is supplied with the fourth selection signal in a period during which one image signal is held. For example, in a period during which the pixel circuit 530G($i,j$) holds one image signal, the pixel 703($i,j$) can emit light using the element 550G($i,j$) on the basis of the image signal (see FIG. 18). The pixel circuit 530S($i,j$) is supplied with the fourth selection signal after the pixel circuit 530G($i,j$) obtains one image signal on the basis of the first selection signal by the time when the pixel circuit 530G($i,j$) is supplied with the first selection signal again.

Accordingly, the intensity of light emitted from the element 550G($i,j$) can be controlled using the image signal. Light having a controlled intensity can be emitted to an object. The object can be imaged using the element 550S($i,j$). The object can be imaged using the element 550S($i,j$) while the intensity of emitted light is controlled. The influence of a change from one image signal to another image signal held in the pixel circuit 530G($i,j$) on an imaging signal can be eliminated. As a result, a novel functional panel that is highly convenient, useful, or reliable can be provided.

Note that this embodiment can be combined with any of the other embodiments in this specification as appropriate.

Embodiment 6

In this embodiment, structures of display devices of one embodiment of the present invention are described with reference to FIG. 19A to FIG. 19D.

Figure 19A:
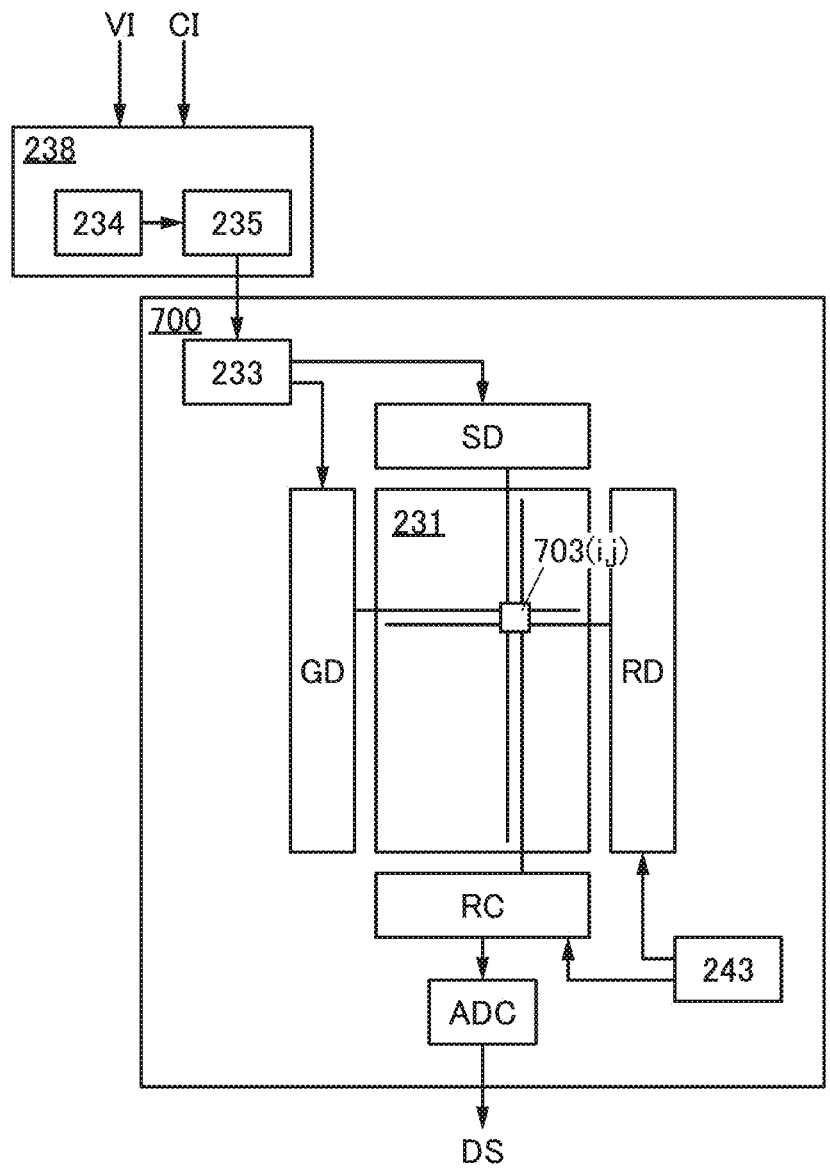
FIG. 19A to FIG. 19D are diagrams illustrating structures of display devices of an embodiment.
Figure 19B:
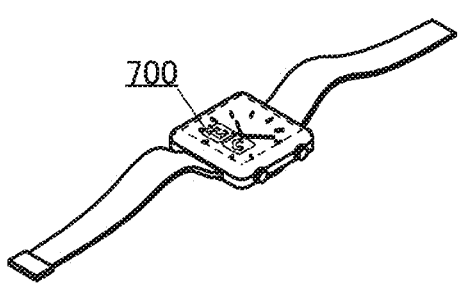
Figure 19C:
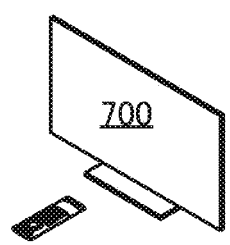
Figure 19D:
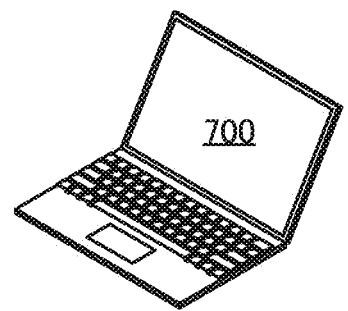

FIG. 19A is a block diagram of the display device of one embodiment of the present invention, and FIG. 19B to FIG. 19D are projection views illustrating appearances of the display devices of one embodiment of the present invention.

Structure Example of Display Device

The display device described in this embodiment includes the functional panel 700 and a control portion 238 (see FIG. 19A).

Structure Example 1 of Control Portion 238

The control portion 238 is supplied with image data VI and control data CI. For example, a clock signal, a timing signal, or the like can be used as the control data CI.

The control portion 238 generates data on the basis of the image data VI and the control portion 238 generates a control signal on the basis of the control data CI. Furthermore, the control portion 238 supplies the data and the control signal.

The data includes a grayscale of 8 bits or more, preferably 12 bits or more, for example. In addition, a clock signal, a start pulse, or the like of a shift register used for a driver circuit can be used as the control signal, for example.

Structure Example 2 of Control Portion 238

For example, a decompression circuit 234 and an image processing circuit 235 can be used in the control portion 238.
<<Decompression Circuit 234>>
The decompression circuit 234 has a function of decompressing the image data VI supplied in a compressed state. The decompression circuit 234 includes a memory portion. The memory portion has a function of storing decompressed image data, for example.
<<Image Processing Circuit 235>>
The image processing circuit 235 includes a memory region, for example. The memory region has a function of storing data included in the image data VI, for example.

The image processing circuit 235 has a function of generating the data by correcting the image data VI on the basis of a predetermined characteristic curve and a function of supplying the data, for example.

Structure Example 1 of Functional Panel 700

The functional panel 700 is supplied with the data and the control signal. For example, the functional panel 700 described in any one of Embodiment 1 to Embodiment 5 can be used.

Structure Example 3 of Pixel 703($i,j$)

The pixel 703($i,j$) performs display on the basis of the data.

Thus, the image data VI can be displayed using the element 550G($i,j$). Thus, a novel display device that is highly convenient, useful, or reliable can be provided. For example, an information terminal (see FIG. 19B), a video display system (see FIG. 19C), a computer (see FIG. 19D), or the like can be provided.

Structure Example 2 of Functional Panel 700

The functional panel 700 includes a driver circuit and a control circuit, for example.

<<Driver Circuit>>

The driver circuit operates on the basis of the control signal. Using the control signal enables a synchronized operation of a plurality of driver circuits (see FIG. 19A).

For example, the driver circuit GD can be used in the functional panel 700. The driver circuit GD is supplied with the control signal and has a function of supplying the first selection signal.

For example, the driver circuit SD can be used in the functional panel 700. The driver circuit SD is supplied with the control signal and the data and can supply an image signal.

For example, the driver circuit RD can be used in the functional panel 700. The driver circuit RD is supplied with the control signal and can supply the third selection signal to the fifth selection signal.

For example, the reading circuit RC can be used in the functional panel 700. The reading circuit RC is supplied with the control signal, and can read an imaging signal by a correlated double sampling method, for example.

<<Control Circuit>>

The control circuit has a function of generating and supplying the control signal. For example, a clock signal or a timing signal can be used as the control signal.

Specifically, the control circuit formed over a rigid substrate can be used in the functional panel. The control circuit formed over the rigid substrate and the control portion 238 can be electrically connected to each other using a flexible printed circuit.

A timing controller 233 can be used as a control circuit, for example. With the use of a control circuit 243, operation of the driver circuit RD can be synchronized with operation of the reading circuit RC.

Note that this embodiment can be combined with any of the other embodiments in this specification as appropriate.

Embodiment 7

In this embodiment, a structure of an input/output device of one embodiment of the present invention is described with reference to FIG. 20 to FIG. 22D.

Figure 20:
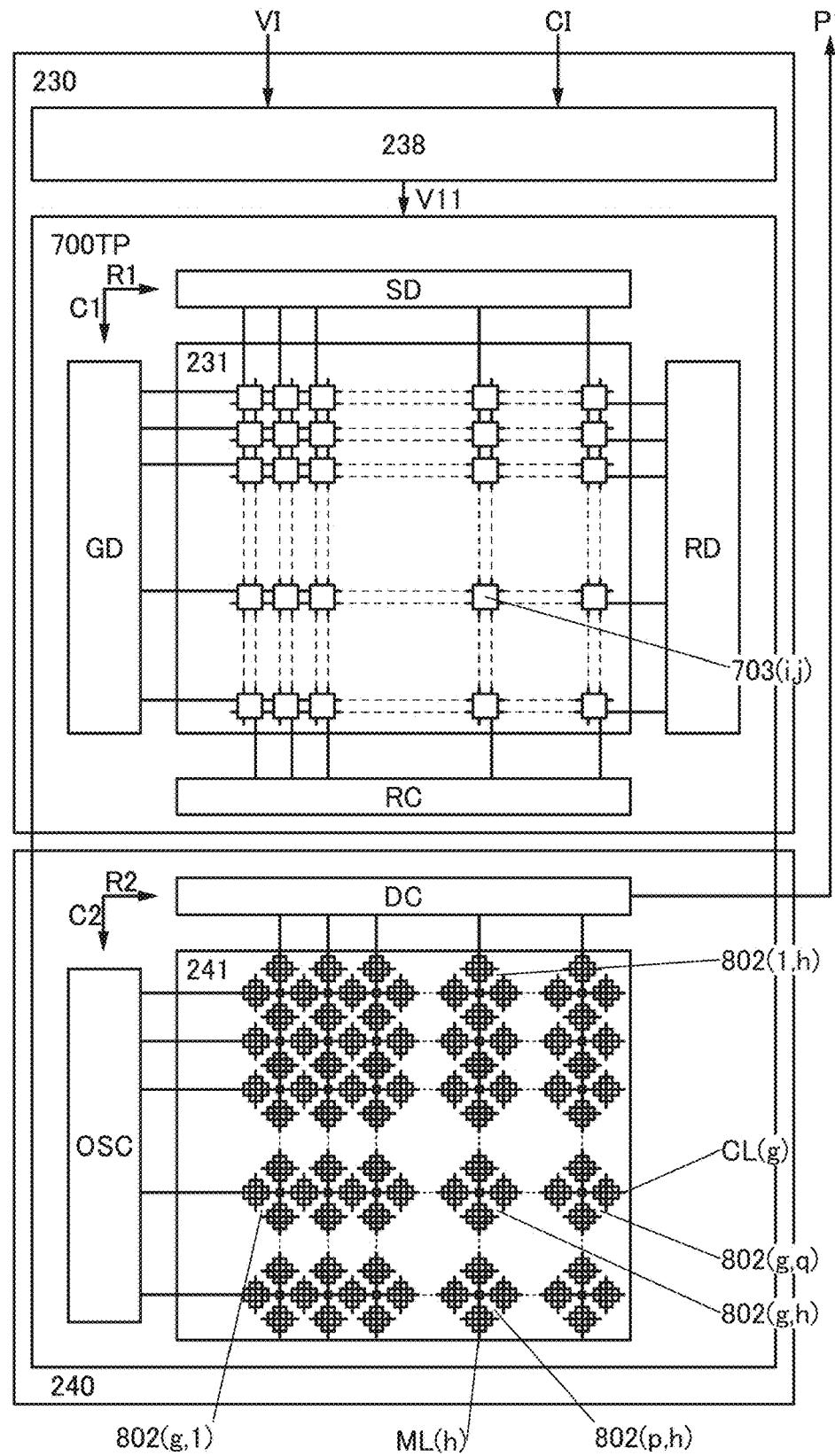
FIG. 20 is a block diagram illustrating a structure of an input/output device of an embodiment.

FIG. 20 is a block diagram illustrating the structure of the input/output device of one embodiment of the present invention.

Figure 21A:
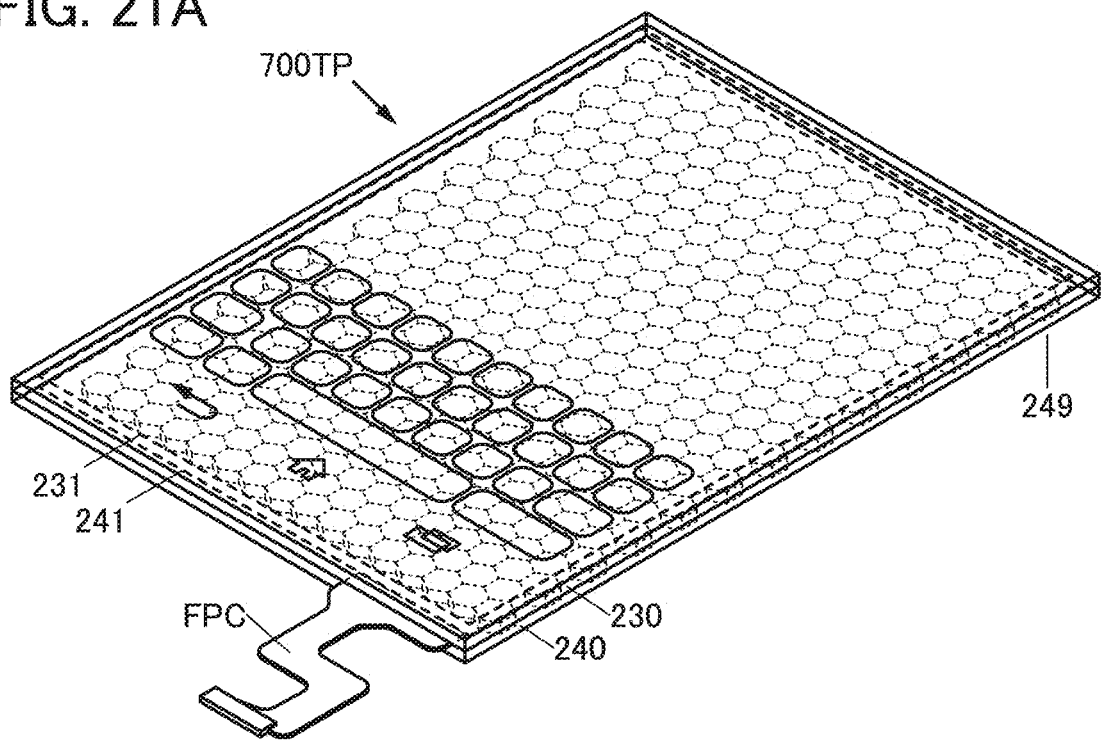
FIG. 21A to FIG. 21D are diagrams illustrating a structure of an input/output device of an embodiment.
Figure 21B:
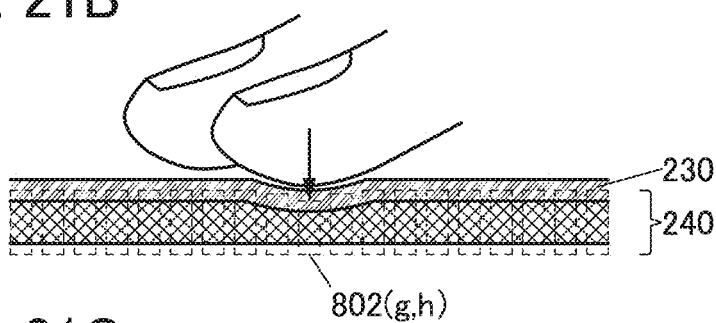
Figure 21C:
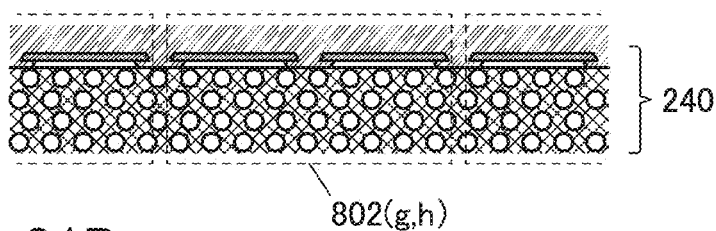
Figure 21D:
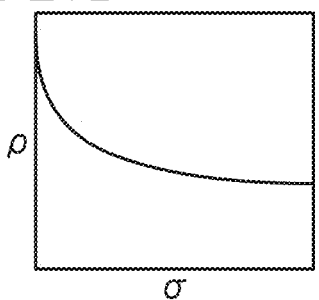

FIG. 21A is a perspective view of the input/output device of one embodiment of the present invention, FIG. 21B and FIG. 21C are cross-sectional views illustrating part of FIG. 21A, and FIG. 21D shows an electric resistance-stress curve which schematically shows characteristics of a sensor.

Figure 22A:
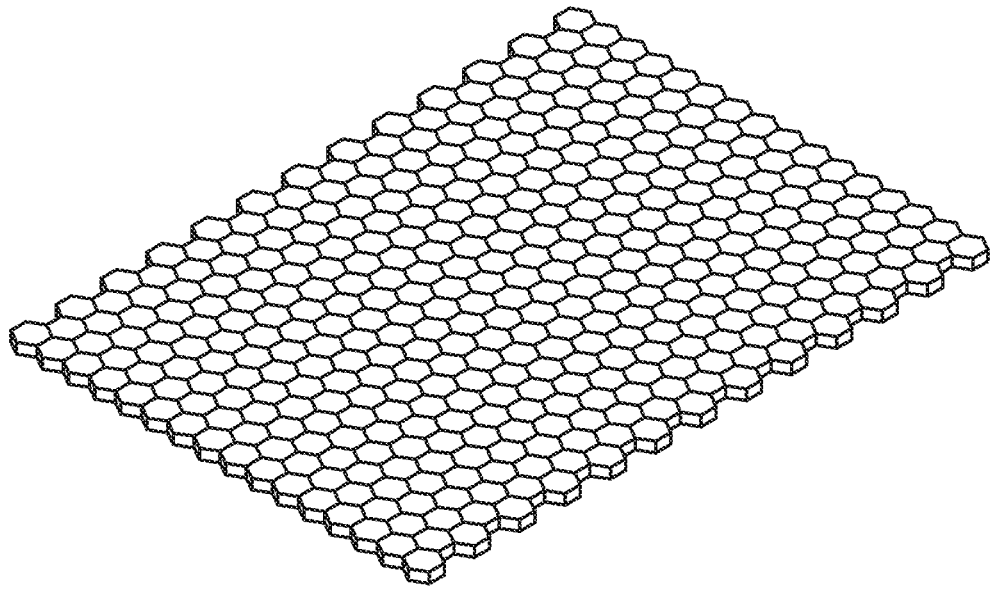
FIG. 22A to FIG. 22D are diagrams illustrating a structure of an input/output device of an embodiment.
Figure 22B:
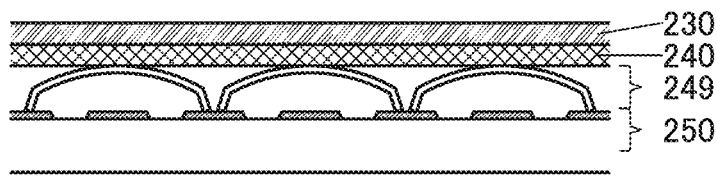
Figure 22C:
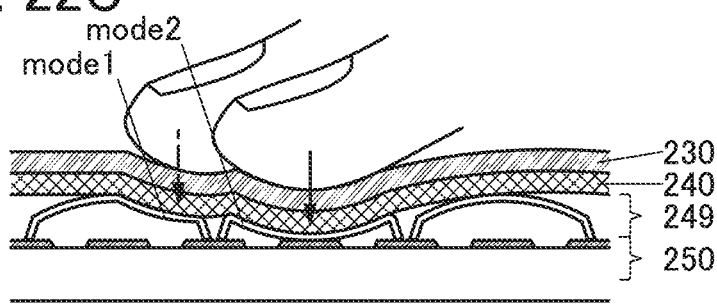
Figure 22D:
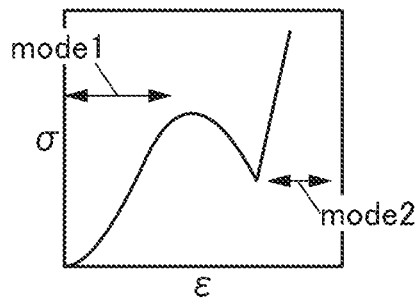

FIG. 22A is a perspective view of a component used for the input/output device of one embodiment of the present invention, FIG. 22B and FIG. 22C are cross-sectional views illustrating part of FIG. 21A, and FIG. 22D shows stress-distortion curve which schematically shows characteristics of a component in which snap-through buckling occurs.

Structure Example 1 of Input/Output Device

The input/output device described in this embodiment includes an input portion 240 and a display portion 230 (see FIG. 20).

Structure Example 1 of Display Portion 230

The display portion 230 includes the functional panel 700. For example, the functional panel 700 described in any one of Embodiment 1 to Embodiment 5 can be used for the display portion 230. Note that a panel including the input portion 240 and the display portion 230 can be referred to as a functional panel 700TP.

Structure Example 1 of Input Portion 240

The input portion 240 includes a sensing region 241. The input portion 240 sensing an object approaching the sensing region 241.

The sensing region 241 includes a region overlapping with the pixel 703($i,j$).

Thus, an object approaching the region overlapping with the display portion 230 can be sensed while image data is displayed using the display portion 230. A finger or the like approaching the display portion 230 can be used as a pointer to input position data. Position data can be associated with image data displayed on the display portion 230. Thus, a novel input/output device that is highly convenient, useful, or reliable can be provided.

Structure Example 1 of Sensing Region 241

The sensing region 241 includes one or a plurality of sensors, for example.

The sensing region 241 includes a group of sensors 802($g,1$) to 802($g,q$) and a different group of sensors 802($1,h$) to 802($p,h$). Note that g is an integer greater than or equal to 1 and less than or equal to p, h is an integer greater than or equal to 1 and less than or equal to q, and p and q are each an integer greater than or equal to 1.

The group of sensors 802($g,1$) to 802($g,q$) includes a sensor 802($g,h$), is provided in a row direction (the direction indicated by an arrow R2 in the drawing), and is electrically connected to a wiring CL(g). Note that the direction indicated by the arrow R2 may be the same as or different from the direction indicated by the arrow R1.

The different group of sensors 802($1,h$) to 802($p,h$) includes the sensor 802($g,h$), is provided in a column direction (the direction indicated by an arrow C2 in the drawing) intersecting the row direction, and is electrically connected to a wiring ML(h).

<<Sensor>>

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a senor that senses a stylus pen can be used in combination.

This allows determination of the kind of a pointer. Different instructions can be associated with sensing data depending on the kind of a pointer that has been determined.

Specifically, in the case where it is determined that a finger is used as a pointer, sensing data can be associated with a gesture. In the case where it is determined that a stylus pen is used as a pointer, sensing data can be associated with drawing processing.

Specifically, a finger can be sensed using a capacitive, pressure-sensitive, or optical proximity sensor. A stylus pen can be sensed using an electromagnetic inductive or optical proximity sensor.

Structure Example 2 of Input Portion 240

The input portion 240 includes an oscillation circuit OSC and a sensing circuit DC (see FIG. 20).

The oscillation circuit OSC supplies a search signal to the sensor 802(*g,h*). For example, a rectangular wave, a sawtooth wave, a triangular wave, or a sine wave can be used as the search signal.

The sensor 802(*g,h*) generates and supplies a sensing signal that changes on the basis of the search signal and the distance to a pointer approaching the sensor 802(*g,h*).

The sensing circuit DC supplies input data on the basis of the sensing signal.

Accordingly, the distance from an approaching pointer to the sensing region 241 can be sensed. The position in the sensing region 241 where the pointer comes the closest can be sensed.

Structure Example 3 of Region 231

The region 231 is provided closer to the side where the pointer approaches than the sensing region 241 is, and the region 231 has flexibility (see FIG. 21A and FIG. 21B). For example, an image indicating a keyboard can be displayed on the region 231 (see FIG. 21A).

Structure Example 2 of Sensor

The sensor 802(*g,h*) has a function of sensing the pushing depth, and the sensor 802(*g,h*) senses a pointer through the region 231 (see FIG. 21B).

For example, the sensor 802(*g,h*) senses the pushing depth toward the sensor 802(*g,h*) with the pointer. Specifically, the sensor 802(*g,h*) senses the pushing depth from a plane including the region 231 to a plane including the sensing region 241 with a finger or a stylus pen (see FIG. 21C).

For example, a pressure sensor can be used as the sensor 802(*g,h*). Specifically, an element whose electric resistance changes in accordance with a pressure can be used as the sensor 802(*g,h*) (see FIG. 21D). Thus, the sensor 802(*g,h*) can sense the pushing depth.

Structure Example 2 of Input/Output Device

The input/output device described in this embodiment includes a component 249 (see FIG. 21A and FIG. 22A to FIG. 22C).

Structure Example of Component 249

The component 249 overlaps with the sensing region 241 and has elasticity.

For example, an elastic body can be used for the component 249. Specifically, a spring, a plate spring, a rubber, a sponge, or the like can be used.

Thus, the sensor 802(*g,h*) can sense the pushing depth. Alternatively, a user can feel the force corresponding to the pushing depth with the pointer.

For example, the component in which snap-through buckling occurs can be used for the component 249. Specifically, as the component 249, a dome-shaped component can be used, for example (see FIG. 22B).

The component 249 has a mode 1 in which the component 249 is stable in a region with small distortion ε and a mode 2 in which the component 249 is stable in a region with large distortion ε (see FIG. 22C and FIG. 22D). The component 249 changes from the mode 1 to the mode 2 at the buckling point (see FIG. 22D). Furthermore, the component 249 reversibly changes from the mode 2 to the mode 1 when the distortion is eliminated.

Thus, the sensor 802(*g,h*) can sense the force σ corresponding to the pushing depth up to the buckling point. A user can obtain a sense of the force. When the force exceeds the buckling point, the user can have a click feeling. What is called a tactile switch can be provided. When the user releases the pushed pointer, the component in which snap-through buckling occurs can return to the original mode.

Note that the sensing region 241 can be provided to overlap with the component in which snap-through buckling occurs, the region 231 can be provided to overlap with the sensing region 241, and an image used for operation can be displayed at a position overlapping with the component in which snap-through buckling occurs. For example, a layout that is suitably used for a keyboard can be employed for the layout of the components in which snap-through buckling occurs. Alternatively, a layout that is suitably used for a home button can be employed for the layout of the components in which snap-through buckling occurs.

Thus, the displayed images used for operation can be pressed. The user can have a click feeling when pressing the images.

Furthermore, it is possible to use the component 249 including a region where a plurality of components in which snap-through buckling occurs are provided on the whole area. The sensing region 241 can be provided to overlap with the region, the region 231 can be provided to overlap with the sensing region 241, and the image used for operation can be displayed at a position overlapping with the region, the whole area of which is provided with the components.

Thus, images which are used for operation and can provide a click feeling by being pressed can be freely laid out.

Note that a sensing portion 250 may be provided to overlap with the input/output device described in this embodiment. For example, a pressure-sensitive switch can be used for the sensing portion 250. Specifically, a conductive material is used for a dome-shaped component in which snap-through buckling occurs, and the dome-shaped component can be used at a contact point with the pressure-sensitive switch. Thus, what is called a membrane switch can be provided. Alternatively, a switch that provides a click feeling can be provided. What is called a tactile switch can be provided.

Note that this embodiment can be combined with any of the other embodiments in this specification as appropriate.

Embodiment 8

In this embodiment, structures of a data processing device of one embodiment of the present invention will be described with reference to FIG. 23A to FIG. 27D.

Figure 23A:
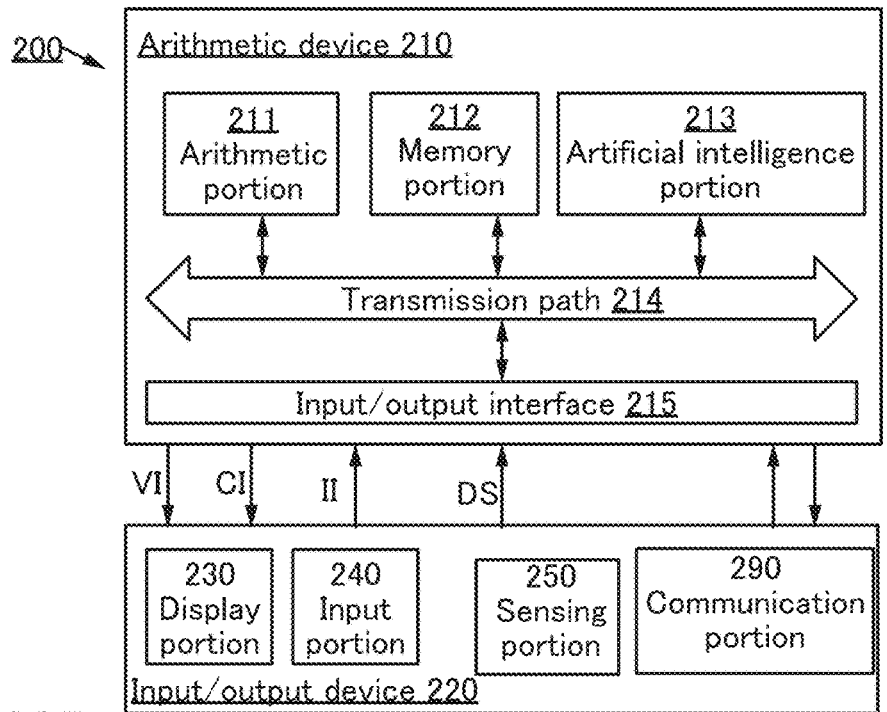
FIG. 23A to FIG. 23C are diagrams illustrating structures of data processing devices of an embodiment.
Figure 23B:
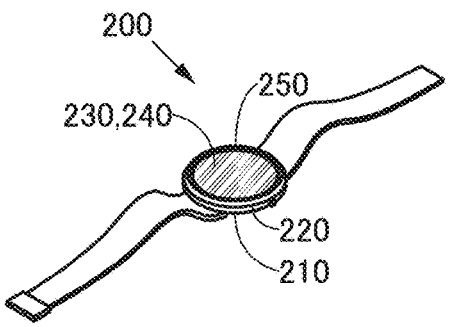
Figure 23C:
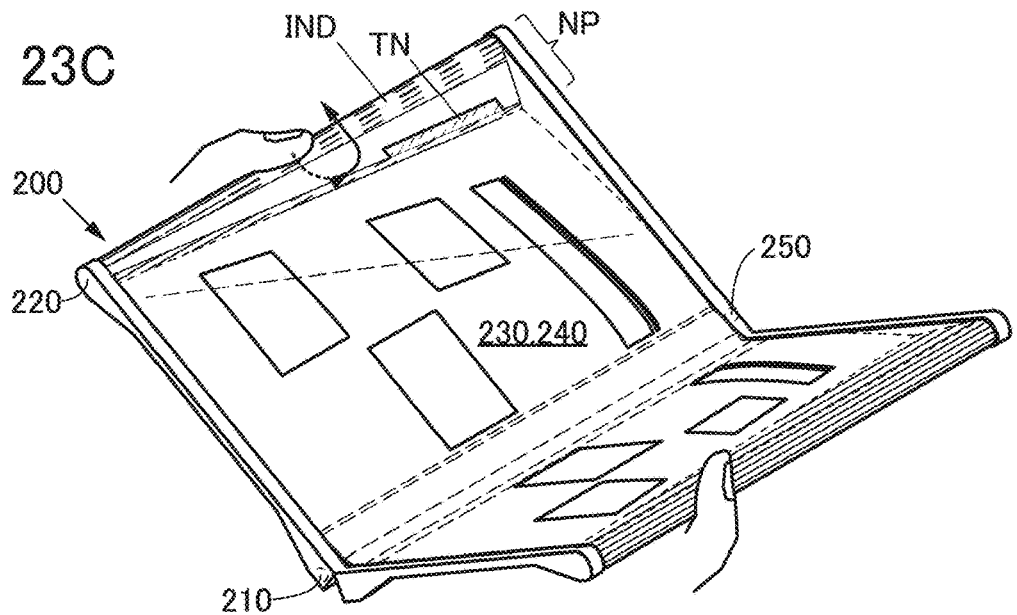

FIG. 23A is a block diagram illustrating a structure of the data processing device of one embodiment of the present invention. FIG. 23B and FIG. 23C are projection views illustrating examples of the appearance of the data processing device.

Figure 24A:
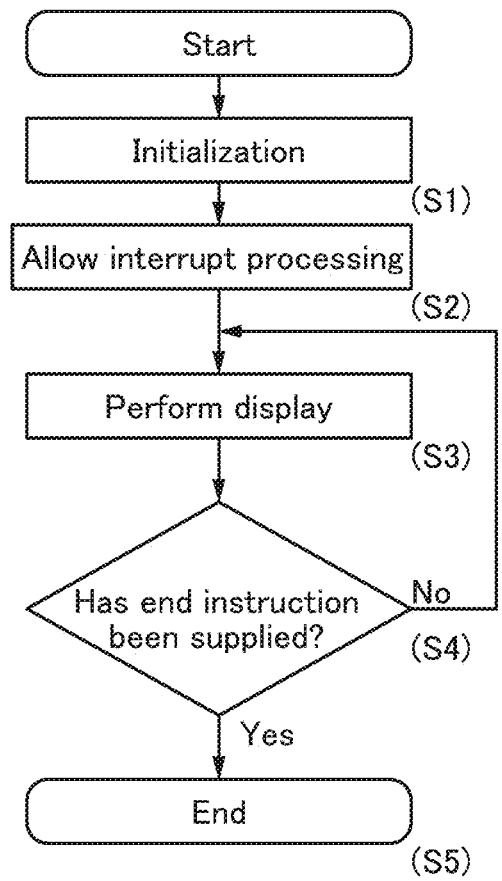
FIG. 24A and FIG. 24B are flow charts illustrating a driving method of a data processing device of an embodiment.
Figure 24B:
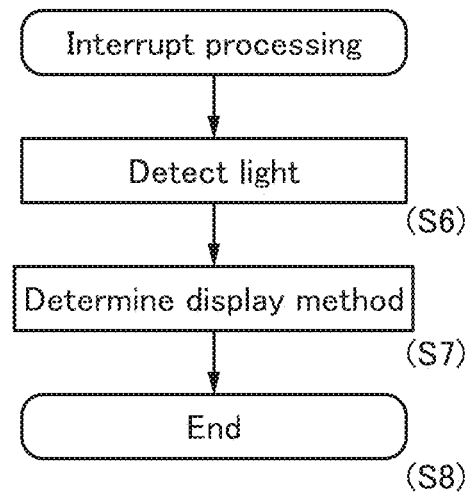

FIG. 24A is a flow chart showing main processing of the program of one embodiment of the present invention, and FIG. 24B is a flow chart showing interrupt processing.

Figure 25A:
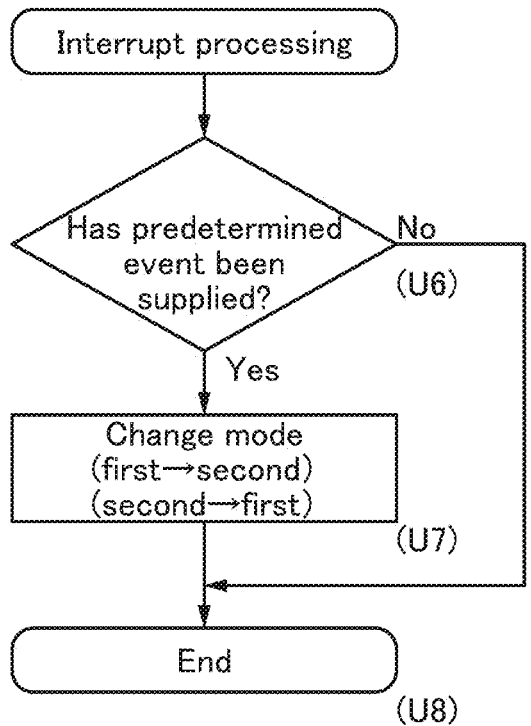
FIG. 25A to FIG. 25C are diagrams illustrating a driving method of a data processing device of an embodiment.
Figure 25B:
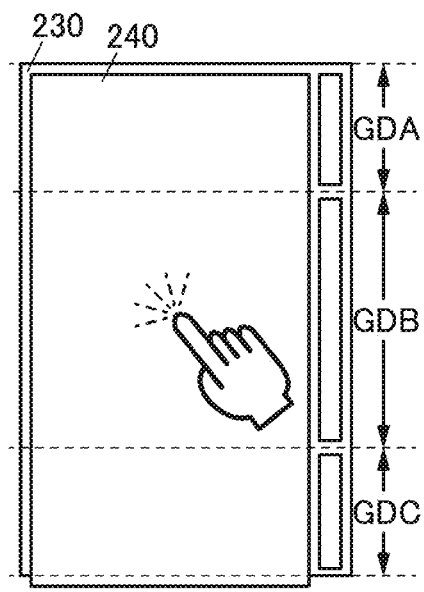
Figure 25C:
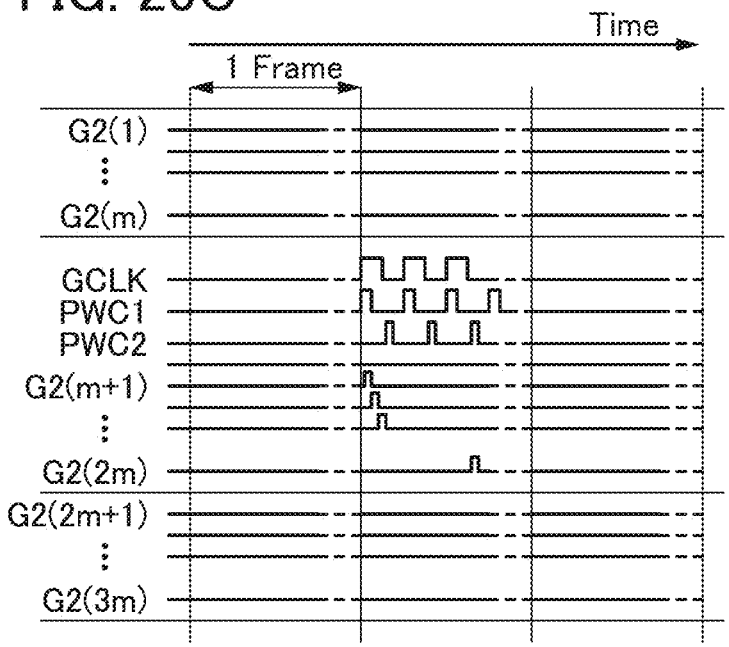

FIG. 25A is a flow chart showing interrupt processing of the program of one embodiment of the present invention. FIG. 25B is a schematic view illustrating handling of the data processing device, and FIG. 25C is a timing chart showing the operation of the data processing device of one embodiment of the present invention.

Figure 26A:
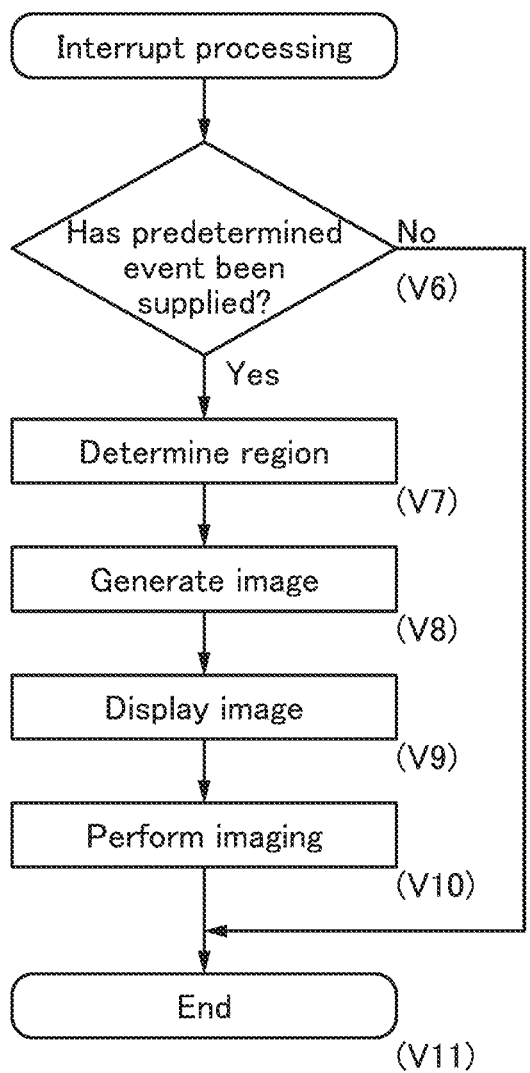
FIG. 26A to FIG. 26C are diagrams illustrating a driving method of a data processing device of an embodiment.
Figure 26B:
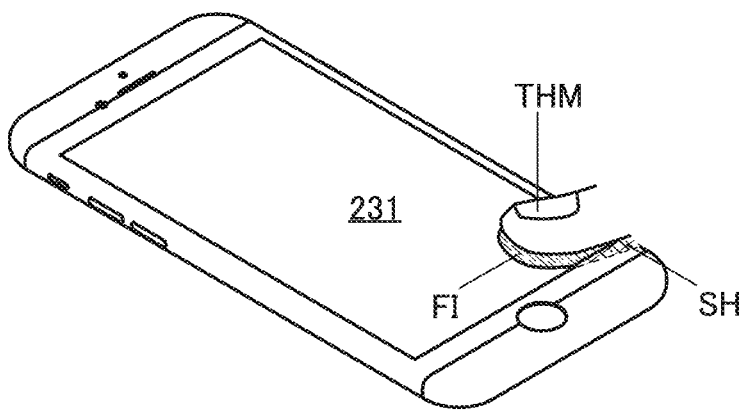
Figure 26C:

FIG. 26A is a flow chart showing interrupt processing different from the interrupt processing shown in FIG. 24B. FIG. 26B is a schematic view illustrating operation of the program shown in FIG. 26A, and FIG. 26C is a schematic view of a taken image of a fingerprint.

Figure 27A:
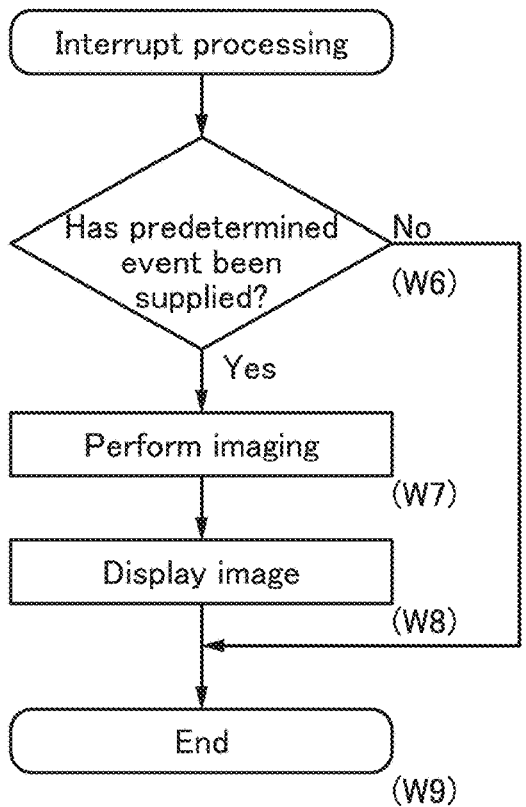
FIG. 27A to FIG. 27D are diagrams illustrating a driving method of a data processing device of an embodiment.
Figure 27B:
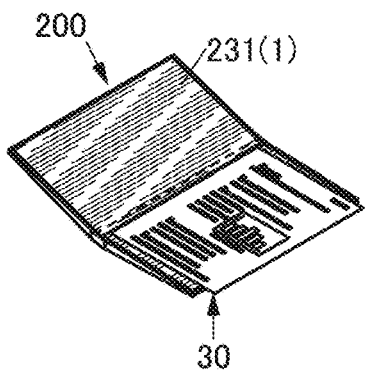
Figure 27C:
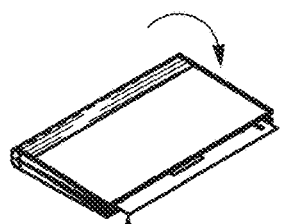
Figure 27D:
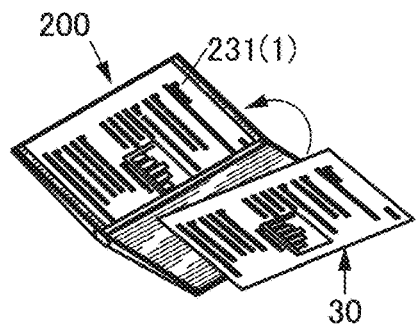

FIG. 27A is a flow chart showing interrupt processing different from the interrupt processing shown in FIG. 24B. FIG. 27B to FIG. 27D are schematic views illustrating operation of the program shown in FIG. 27A.

Structure Example 1 of Data Processing Device

The data processing device described in this embodiment includes an arithmetic device 210 and an input/output device 220 (see FIG. 23A). Note that the input/output device 220 is electrically connected to the arithmetic device 210. A data processing device 200 can include a housing (see FIG. 23B and FIG. 23C).

Structure Example 1 of Arithmetic Device 210

The arithmetic device 210 is supplied with input data II or sensing data DS. The arithmetic device 210 generates the control data CI and the image data VI on the basis of the input data II or the sensing data DS, and supplies the control data CI and the image data VI.

The arithmetic device 210 includes an arithmetic portion 211 and a memory portion 212. The arithmetic device 210 also includes a transmission path 214 and an input/output interface 215.

The transmission path 214 is electrically connected to the arithmetic portion 211, the memory portion 212, and the input/output interface 215.
<<Arithmetic Portion 211>>
The arithmetic portion 211 has a function of executing a program, for example.
<<Memory Portion 212>>
The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.
<<Input/Output Interface 215 and Transmission Path 214>>
The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

Structure Example of Input/Output Device 220

The input/output device 220 supplies the input data II and the sensing data DS. The input/output device 220 is supplied with the control data CI and the image data VI (see FIG. 23A).

As the input data II, for example, a scan code of a keyboard, position data, data on button handling, sound data, or image data can be used. As the sensing data DS, for example, illuminance data, attitude data, acceleration data, bearing data, pressure data, temperature data, humidity data, or the like of the environment where the data processing device 200 is used, or the like can be used.

As the control data CI, for example, a signal controlling the luminance of display of the image data VI, a signal controlling the color saturation, or a signal controlling the hue can be used. A signal that changes display of part of the image data VI can be used as the control data CI.

The input/output device 220 includes the display portion 230, the input portion 240, and the sensing portion 250. For example, the input/output device described in Embodiment 7 can be used as the input/output device 220. The input/output device 220 can include a communication portion 290.

Structure Example of Display Portion 230

The display portion 230 displays the image data VI on the basis of the control data CI. For example, the display device described in Embodiment 6 can be used for the display portion 230.

Structure Example of Input Portion 240

The input portion 240 generates the input data II. For example, the input portion 240 has a function of supplying position data P1.

For example, a human interface or the like can be used as the input portion 240 (see FIG. 23A). Specifically, a keyboard, a mouse, a touch sensor, a microphone, a camera, or the like can be used as the input portion 240.

A touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of a finger in contact with the touch panel and can determine that a predetermined gesture is supplied when the analysis results meet predetermined conditions. Thus, the user can supply a predetermined operation instruction associated with a predetermined gesture in advance by using the gesture.

For instance, the user can supply a "scroll instruction" for changing the display position of image data by using a gesture of moving a finger in contact with the touch panel along the touch panel.

The user can supply a "dragging instruction" for pulling out and displaying a navigation panel NP at an edge portion of the region 231 by using a gesture of moving a finger in contact with the edge portion of the region 231 (see FIG. 23C). Moreover, the user can supply a "leafing through instruction" for displaying index images IND, some parts of other pages, or thumbnail images TN of other pages in a predetermined order on the navigation panel NP so that the user can flip through these images, by using a gesture of moving the position where a finger presses hard. The instruction can be supplied by using the finger press pressure. Consequently, the user can turn the pages of an e-book reader like flipping through the pages of a paper book. The user can search a certain page with the aid of the thumbnail images TN or the index images IND.

Structure Example of Sensing Portion 250

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, illuminance data, attitude data, acceleration data, bearing data, pressure data, temperature data, humidity data, or the like can be supplied.

For example, a photosensor, an attitude sensor, an acceleration sensor, a direction sensor, a GPS (Global positioning System) signal receiving circuit, a pressure-sensitive switch, a pressure sensor, a temperature sensor, a humidity sensor, a camera, or the like can be used as the sensing portion 250.

<<Communication Portion 290>>

The communication portion 290 has a function of supplying data to a network and obtaining data from the network.

<<Housing>

Note that the housing has a function of storing the input/output device 220 or the arithmetic device 210. The housing has a function of supporting the display portion 230 or the arithmetic device 210.

Thus, the control data CI can be generated on the basis of the input data II or the sensing data DS. The image data VI can be displayed on the basis of the input data II or the sensing data DS. The data processing device is capable of operating with knowledge of the intensity of light that the housing of the data processing device receives in the environment where the data processing device is used. The user of the data processing device can select a display method. Thus, a novel data processing device that is highly convenient, useful, or reliable can be provided.

Note that in some cases, these components cannot be clearly distinguished from each other and one component may also serve as another component or may include part of another component. For example, a touch panel in which a touch sensor overlaps with a display panel is an input portion as well as a display portion.

Structure Example 2 of Arithmetic Device 210

The arithmetic device 210 includes an artificial intelligence portion 213 (see FIG. 23A).

The artificial intelligence portion 213 is supplied with the input data II or the sensing data DS, and the artificial intelligence portion 213 infers the control data CI on the basis of the input data II or the sensing data DS. Moreover, the artificial intelligence portion 213 supplies the control data CI.

In this manner, the control data CI for display that can be felt suitable can be generated. Display that can be felt suitable is possible. The control data CI for display that can be felt comfortable can be generated. Display that can be felt comfortable is possible. Thus, a novel data processing device that is highly convenient, useful, or reliable can be provided.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate and use the control data CI for displaying extracted part in the color, design, font, or the like different from those of another part, and the data.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for displaying a boundary between extracted part of the image and another part. Specifically, the artificial intelligence portion 213 can generate the control data CI for displaying a rectangle surrounding the extracted part of the image.

[Inference Using Sensing Data DS]

Specifically, the artificial intelligence portion 213 can generate an inference R1 using the sensing data DS. The artificial intelligence portion 213 can generate the control data CI on the basis of the inference R1 so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. The artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. A clock signal, a timing signal, or the like that is supplied to a control portion 248 included in the input portion 240 can be used as the control data CI.

Structure Example 2 of Data Processing Device

Another structure of the data processing device of one embodiment of the present invention is described with reference to FIG. 24A and FIG. 24B.
<<Program>>

The program of one embodiment of the present invention includes the following steps (see FIG. 24A).
[First Step]

In a first step, setting is initialized (see (S1) in FIG. 24A).

For example, predetermined image data that is to be displayed on start-up, a predetermined mode for displaying the image data, and data for determining a predetermined display method for displaying the image data are obtained from the memory portion 212. Specifically, one still image data or another moving image data can be used as the predetermined image data. Furthermore, a first mode or a second mode can be used as the predetermined mode.
[Second Step]

In a second step, interrupt processing is allowed (see (S2) in FIG. 24A). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can be executed any time after the program is started up.
[Third Step]

In a third step, image data is displayed by a predetermined mode or a predetermined display method selected in the first step or the interrupt processing (see (S3) in FIG. 24A). Note that the predetermined mode determines a mode for displaying the data, and the predetermined display method determines a method for displaying the image data. For example, the image data VI can be used as data to be displayed.

One method for displaying the image data VI can be associated with the first mode, for example. Another method for displaying the image data VI can be associated with the second mode. Thus, a display method can be selected on the basis of the selected mode.
<<First Mode>>

Specifically, a method for supplying selection signals to a scan line at a frequency of 30 Hz or higher, preferably 60 Hz or higher, to perform display on the basis of the selection signals can be associated with the first mode.

For example, when selection signals are supplied at a frequency of 30 Hz or higher, preferably 60 Hz or higher, the movement of a displayed moving image can be smooth.

For example, when an image is refreshed at a frequency of 30 Hz or higher, preferably 60 Hz or higher, an image that changes so as to smoothly follow the user's operation can be displayed on the data processing device 200 which is being operated by the user.
<<Second Mode>>

Specifically, a method for supplying selection signals to a scan line at a frequency lower than 30 Hz, preferably lower than 1 Hz, further preferably less than once a minute, to perform display on the basis of the selection signals can be associated with the second mode.

The supply of selection signals at a frequency lower than 30 Hz, preferably lower than 1 Hz, further preferably less than once a minute enables display with a flicker or flickering inhibited. Furthermore, the power consumption can be reduced.

For example, in the case where the data processing device 200 is used for a clock, the display can be refreshed at a frequency of once a second, once a minute, or the like.

In the case where a light-emitting element is used as a display element, for example, the light-emitting element can be made to emit light in a pulsed manner so that the image data is displayed. Specifically, an organic EL element can be made to emit light in a pulsed manner, and its afterglow can be used for display. The organic EL element has excellent frequency characteristics; thus, time for driving the light-emitting element can be shortened and the power consumption can be reduced in some cases. Heat generation is inhibited; thus, the deterioration of the light-emitting element can be suppressed in some cases. When the duty ratio is set to be lower than or equal to 20%, afterimages included in the display can be reduced.
[Fourth Step]

In a fourth step, selection is performed such that the program proceeds to a fifth step when an end instruction has been supplied, whereas the program proceeds to the third step when the end instruction has not been supplied (see (S4) in FIG. 24A).

For example, the end instruction supplied in the interrupt processing may be used for the determination.
[Fifth Step]

In the fifth step, the program ends (see (S5) in FIG. 24A).
<<Interrupt Processing>>

The interrupt processing includes a sixth step to an eighth step described below (see FIG. 24B).
[Sixth Step]

In the sixth step, the illuminance of the environment where the data processing device 200 is used is sensed using the sensing portion 250, for example (see (S6) in FIG. 24B). Note that color temperature or chromaticity of ambient light may be sensed instead of the illuminance of the environment.
[Seventh Step]

In the seventh step, a display method is determined on the basis of the sensed illuminance data (see (S7) in FIG. 24B). For example, a display method is determined such that the brightness of display is not too dark or too bright.

Note that in the case where the color temperature of the ambient light or the chromaticity of the ambient light is sensed in the sixth step, the color of display may be adjusted.
[Eighth Step]

In the eighth step, the interrupt processing ends (see (S8) in FIG. 24B).

Structure Example 3 of Data Processing Device

Another structure of the data processing device of one embodiment of the present invention is described with reference to FIG. 25.

FIG. 25A is a flow chart showing a program of one embodiment of the present invention. FIG. 25A is a flow chart showing interrupt processing different from the interrupt processing shown in FIG. 24B.

Note that the structure example 3 of the data processing device is different from the interrupt processing described with reference to FIG. 24B in that the interrupt processing includes a step of changing a mode on the basis of a supplied predetermined event. Different portions are described in detail here, and the above description is referred to for portions that can use similar structures.

<<Interrupt Processing>>

The interrupt processing includes a sixth step to an eighth step described below (see FIG. 25A).

[Sixth Step]

In the sixth step, the program proceeds to the seventh step when a predetermined event has been supplied, whereas the program proceeds to the eighth step when the predetermined event has not been supplied (see (U6) in FIG. 25A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 25A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including a driver circuit GDA, a driver circuit GDB, and a driver circuit GDC supplies a selection signal can be changed (see FIG. 25B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 25B and FIG. 25C). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a conductive film G2(m+1) to a conductive film G2(2m) on the basis of the signal GCLK, the signal PWC1, the signal PWC2, and the like.

Thus, for example, the driver circuit GDB can supply a selection signal without supply of selection signals from the driver circuit GDA and the driver circuit GDC. The display of the region where a selection signal is supplied from the driver circuit GDB can be refreshed without any change in the display of regions where selection signals are supplied from the driver circuit GDA and the driver circuit GDC. Power consumed by the driver circuits can be reduced.

[Eighth Step]

In the eighth step, the interrupt processing ends (see (U8) in FIG. 25A). Note that in a period during which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the end instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that position data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 23C). Materials distributed in a conference room in, for example, a company can be received and used for a conference material.

Structure Example 4 of Data Processing Device

Another structure of the data processing device of one embodiment of the present invention is described with reference to FIG. 26.

Note that the structure example 4 of the data processing device described with reference to FIG. 26A is different from the structure example described with reference to FIG. 24B in the interrupt processing. Specifically, the interrupt processing includes the step of determining a region, the step of generating an image, the step of displaying the image, and the step of imaging on the basis of a supplied predetermined event. Different portions are described in detail here, and the above description is referred to for portions that can use similar structures.

<<Interrupt Processing>>

The interrupt processing includes a sixth step to an eleventh step (see FIG. 26A).

[Sixth Step]

In the sixth step, the program proceeds to the seventh step when a predetermined event has been supplied, whereas the program proceeds to the eleventh step when the predetermined event has not been supplied (see (V6) in FIG. 26A).

The predetermined event can be supplied using the sensing portion 250, for example. Specifically, a motion such as lifting of the data processing device can be used as the predetermined event. For example, a motion of the data processing device can be sensed using an angular sensor or an acceleration sensor. Touch of a finger or approach of an object can be sensed using a touch sensor.

[Seventh Step]

In the seventh step, a first region SH is determined (see (V7) in FIG. 26A).

For example, a region where an object such as a finger touches or approaches the input/output device 220 of one embodiment of the present invention can be the first region SH. A region that is set in advance by the user or the like can be used as the first region SH.

Specifically, an image of a finger THM or the like that touches or approaches the functional panel of one embodiment of the present invention is taken using the pixel 703(i,j) and subjected to image processing, whereby the first region SH can be determined (see FIG. 26B).

For example, an image of a shadow caused when external light is blocked by touch or approach of an object such as the finger THM is taken using the pixel 703(i,j) in the functional panel of one embodiment of the present invention and subjected to image processing, whereby the first region SH can be determined.

With the use of the pixel 703(i,j) in the functional panel of one embodiment of the present invention, an object such as the finger THM that touches or approaches the functional panel is irradiated with light, and an image of light reflected by the object is taken using the pixel 703(i,j) and subjected to image processing, whereby the first region SH can be determined.

A region where an object such as the finger THM touches can be determined as the first region SH by a touch sensor.

[Eighth Step]

In the eighth step, an image FI including a second region and a third region is generated on the basis of the first region SH (see (V8) in FIG. 26A and FIG. 26B). For example, the shape of the first region SH is used as the shape of the second region, and a region excluding the first region SH is used as the third region.

[Ninth Step]

In the ninth step, the image FI is displayed such that the second region overlaps with the first region SH (see (V9) in FIG. 26A and FIG. 26B).

For example, an image signal is generated from the image FI and supplied to the region 231, and light is emitted from the pixel 703(i,j). In a period during which the first selection signal is supplied to the G1(i), the generated image signal is supplied to the conductive film S1g(j), and the image signal can be written to the pixel 703(i,j). The generated image signal is supplied to the conductive film S1g(j) and the conductive film S2g(j), and an enhanced image signal can be written to the pixel 703(i,j). The use of an enhanced image signal enables display with higher luminance.

Thus, the image FI can be displayed to overlap with a region of the region 231 which the object such as a finger touches or a region SH which the object approaches. The region where the object such as a finger touches can be irradiated with light using the pixel 703(i,j). The touching or approaching object such as the finger THM can be illuminated with a light. The object such as a finger can be led to touch or approach the region that is determined in advance by the user or the like.

[Tenth Step]

In the tenth step, the object that touches or approaches the first region SH is imaged while the image FI is displayed (see (V10) in FIG. 26A and FIG. 26B).

For example, an image of the finger THM or the like approaching the region 231 is taken while the finger or the like is irradiated with light. Specifically, an image of a fingerprint FP of the finger THM touching the region 231 can be taken (see FIG. 26C).

For example, the supply of the first selection signal can be stopped while an image is displayed with the pixel 703(i,j). For example, imaging can be performed using the pixel 703(i,j) while the supply of the selection signal to the pixel circuit 530G(i,j) is stopped.

Accordingly, the touching or approaching object such as a finger can be imaged while the object is illuminated. Imaging can be performed in a period during which the first selection signal is not supplied. Noise in imaging can be inhibited. A clear image of a fingerprint can be obtained. An image that can be used for the authentication of the user can be obtained. In any area of the region 231, an image of the fingerprint of the finger touching the region 231 can be taken clearly. Thus, a novel data processing device that is highly convenient, useful, or reliable can be provided.

[Eleventh Step]

In the eleventh step, the interrupt processing ends (see (V11) in FIG. 26A).

Structure Example 5 of Data Processing Device

Another structure of the data processing device of one embodiment of the present invention is described with reference to FIG. 27.

<<Interrupt Processing>>

The interrupt processing includes a sixth step to a ninth step (see FIG. 27A).

[Sixth Step]

In the sixth step, the program proceeds to the seventh step when a predetermined event has been supplied, whereas the program proceeds to the ninth step when the predetermined event has not been supplied (see (W6) in FIG. 27A).

For example, an object 30 is placed in a certain position in the data processing device 200, and a predetermined event can be supplied with use of the input portion 240 (see FIG. 27B). Specifically, the contact or approach of a finger or the like is sensed with use of a touch sensor in a region 231(1) and can be used for the predetermined event. For example, a touch sensor placed to overlap with a place where an image associated with the interrupt processing is displayed can be used. Specifically, an image associated with the interrupt processing is displayed in the region 231(1) and the input portion 240 placed to overlap with the region 231(1) can be used.

[Seventh Step]

In the seventh step, imaging is performed using the region 231(1) (see (W7) in FIG. 27A).

For example, when an object 30 approaches or adheres closely to the region 231, a still image is captured (see FIG. 27C). Specifically, a still image is captured when the intensity of external light entering the region 231 becomes smaller than a predetermined value. Alternatively, a still image is captured when an image taken in the region 231 does not show a change exceeding a predetermined level for a predetermined period. Alternatively, a still image is captured after the housing of the data processing device 200 is closed.

[Eighth Step]

In the eighth step, display is performed using the region 231(1) (see (W8) in FIG. 27A).

For example, the still image captured in the seventh step is displayed in the region 231 (see FIG. 27D).

[Ninth Step]

In the ninth step, the interrupt processing ends (see (W9) in FIG. 27A).

Accordingly, the touching or approaching object such as a finger can be imaged while being illuminated. A clear image with reduced distortion can be obtained. Information printed on a print or the like can be duplicated to electronic data. Thus, a novel data processing device that is highly convenient, useful, or reliable can be provided.

Embodiment 9

In this embodiment, structures of data processing devices of one embodiment of the present invention are described with reference to FIG. 28A to FIG. 30B.

Figure 28A:
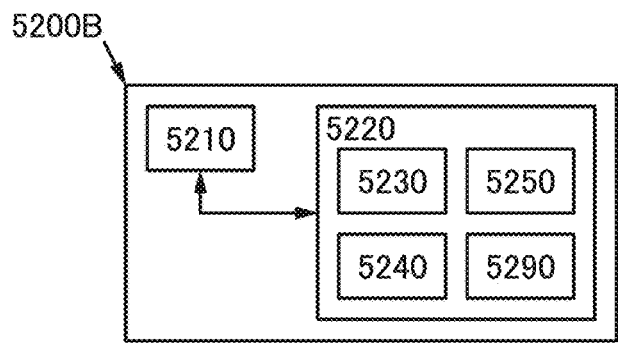
FIG. 28A to FIG. 28E are diagrams illustrating structures of data processing devices of an embodiment.
Figure 30A:
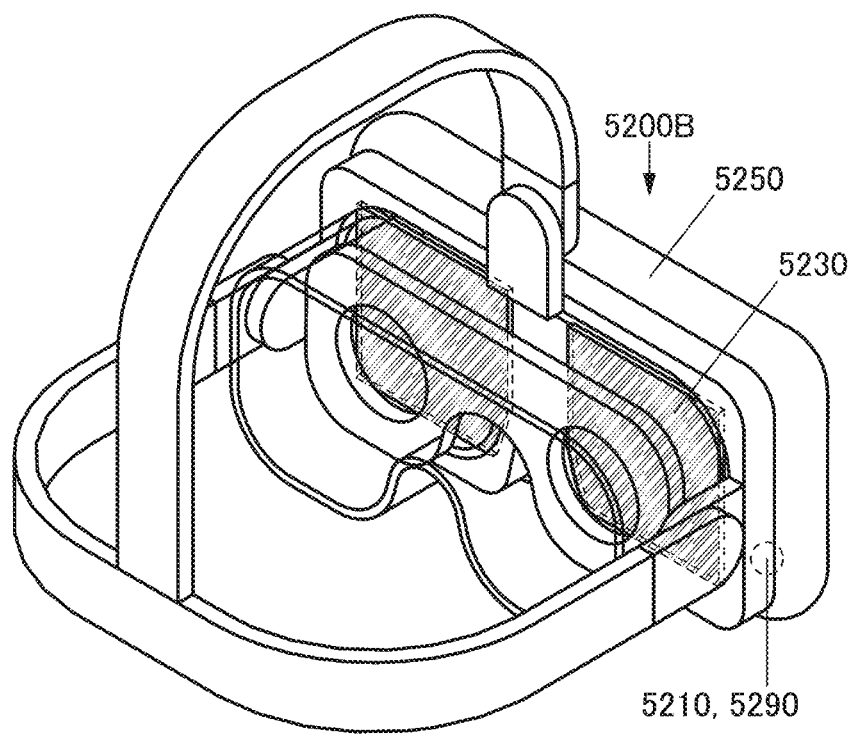
FIG. 30A and FIG. 30B are diagrams illustrating structures of data processing devices of an embodiment.
Figure 30B:
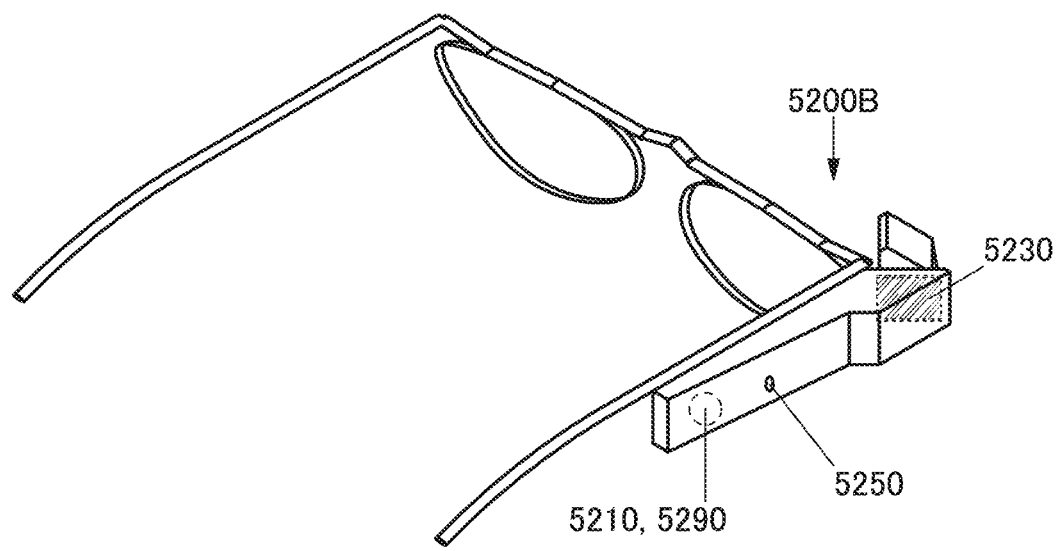

FIG. 28A is a block diagram of the data processing device, and FIG. 28B to FIG. 28E are perspective views illustrating structures of the data processing devices. In addition, FIG. 29A to FIG. 29E are perspective views illustrating structures of the data processing devices. FIG. 30A and FIG. 30B are perspective views illustrating structures of the data processing devices.

<Data Processing Device>

A data processing device 5200B described in this embodiment includes an arithmetic device 5210 and an input/output device 5220 (see FIG. 28A).

The arithmetic device 5210 has a function of being supplied with operation data and has a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image data. For example, the display panel described in any one of Embodiment 1 to Embodiment 5 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

Structure Example 1 of Data Processing Device

Figure 28B:
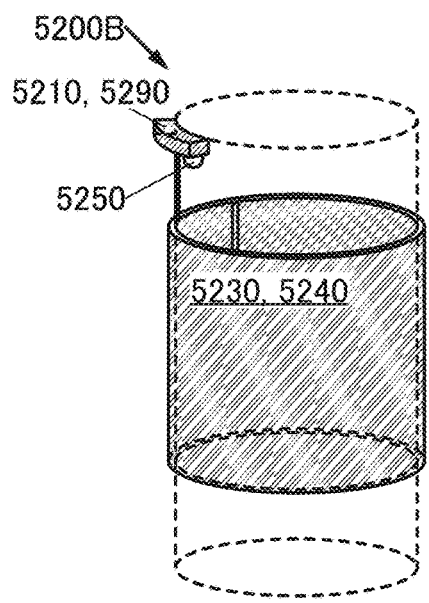

For example, the display portion 5230 can have an outer shape along a cylindrical column or the like (see FIG. 28B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

Structure Example 2 of Data Processing Device

Figure 28C:
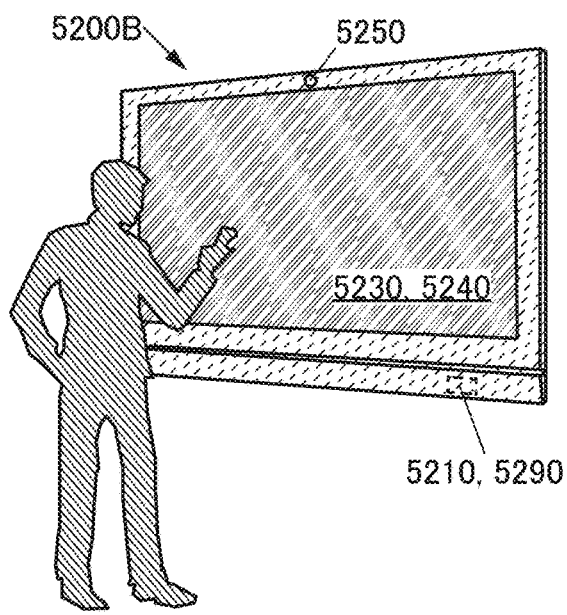

For example, the data processing device has a function of generating image data on the basis of the path of a pointer used by a user (see FIG. 28C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

Structure Example 3 of Data Processing Device

Figure 28D:
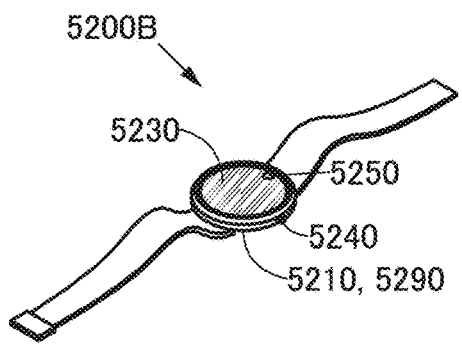

The data processing device can receive data from another device and display the data on the display portion 5230 (see FIG. 28D). Several options can be displayed. The user can choose some from the options and send a reply to a transmitter of the data. For example, the data processing device has a function of changing its display method in accordance with the illuminance of a usage environment. Thus, the power consumption of a smartwatch can be reduced, for example. A smartwatch can display an image to be suitably used even in an environment under strong external light, e.g., outdoors in fine weather, for example.

Structure Example 4 of Data Processing Device

Figure 28E:
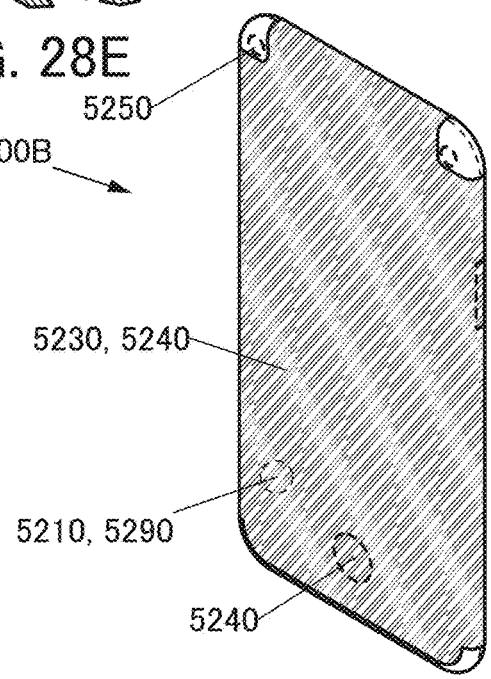

For example, the display portion 5230 has a surface gently curved along a side surface of a housing (see FIG. 28E). The display portion 5230 includes a display panel, and the display panel has a function of performing display on the front surface, the side surfaces, the top surface, and the rear surface, for example. Thus, for example, a mobile phone can display data not only on its front surface but also on its side surfaces, its top surface, and its rear surface.

Structure Example 5 of Data Processing Device

For example, the data processing device can receive data via the Internet and display the data on the display portion

5230 (see FIG. 29A). A created message can be checked on the display portion 5230. The created message can be sent to another device. The data processing device has a function of changing its display method in accordance with the illuminance of a usage environment, for example. Thus, the power consumption of a smartphone can be reduced. A smartphone can display an image to be suitably used even in an environment under strong external light, e.g., outdoors in fine weather, for example.

Structure Example 6 of Data Processing Device

A remote controller can be used as the input portion 5240 (see FIG. 29B). For example, the data processing device can receive data from a broadcast station or via the Internet and display the data on the display portion 5230. An image of a user can be taken using the sensing portion 5250. The image of the user can be transmitted. The data processing device can obtain a viewing history of the user and provide it to a cloud service. The data processing device can obtain recommendation data from a cloud service and display the data on the display portion 5230. A program or a moving image can be displayed on the basis of the recommendation data. The data processing device has a function of changing its display method in accordance with the illuminance of a usage environment, for example. Accordingly, for example, a television system can display an image to be suitably used even when irradiated with strong external light that enters a room in fine weather.

Structure Example 7 of Data Processing Device

For example, the data processing device can receive educational materials via the Internet and display them on the display portion 5230 (see FIG. 29C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can perform display using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

Structure Example 8 of Data Processing Device

The data processing device includes, for example, a plurality of display portions 5230 (see FIG. 29D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display an object in such a manner that an image is favorably viewed even in an environment under strong external light, e.g., outdoors in fine weather.

Structure Example 9 of Data Processing Device

For example, the data processing device of this embodiment is used as a master and another data processing device is used as a slave, whereby the other data processing device can be controlled (see FIG. 29E). As another example, part of image data can be displayed on the display portion 5230 and another part of the image data can be displayed on a display portion of another data processing device. An image signal can be supplied. With the communication portion 5290, data to be written can be obtained from an input portion of another data processing device. Thus, a large display region can be utilized by using a portable personal computer, for example.

Structure Example 10 of Data Processing Device

The data processing device includes, for example, the sensing portion 5250 that senses an acceleration or a direction (see FIG. 30A). The sensing portion 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

Structure Example 11 of Data Processing Device

The data processing device includes, for example, an imaging device and the sensing portion 5250 that senses an acceleration or a direction (see FIG. 30B). The sensing portion 5250 can supply data on the position of the user or the direction in which the user faces. The data processing device can generate image data in accordance with the position of the user or the direction in which the user faces. Accordingly, the data can be shown together with a real-world scene, for example. An augmented reality image can be displayed on a glasses-type data processing device.

Note that this embodiment can be combined with any of the other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load).

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope.

As another expression, it can be expressed as "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2". Alternatively, it can be expressed as "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, it can be expressed as "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

ANO: conductive film, AP: region, BM: light-blocking layer, C21: capacitor, C22: capacitor, C31: capacitor, CAPSEL: conductive film, CDSBIAS: conductive film, CDSVDD: conductive film, CDSVSS: conductive film, CL: conductive film, CRS1: cross section, CRS2: cross section, FD: node, G1: conductive film, G2: conductive film, GCLK: signal, IN: terminal, M21: transistor, M31: transistor, M32: transistor, MD: transistor, ML: optical element, ML(h): wiring, N21: node, N22: node, OUT: terminal, P1: position data, PWC1: signal, PWC2: signal, RS: conductive film, S1g: conductive film, S2g: conductive film, SE: conductive film, SH: region, SW21: switch, SW22: switch, SW23: switch, SW31: switch, SW32: switch, SW33: switch, TX: conductive film, VCOM2: conductive film, VCP: conductive film, VIV: conductive film, VLEN: conductive film, VPI: conductive film, VPD: conductive film, VR: conductive film, WX: conductive film, FPC1: flexible printed circuit board, 30: object, 200: data processing device, 210: arithmetic device, 211: arithmetic portion, 212: memory portion, 213: artificial intelligence portion, 214: transmission path, 215: input/output interface, 220: input/output device, 230: display portion, 231: region, 233: timing controller, 234: decompression circuit, 235: image processing circuit, 238: control portion, 240: input portion, 241: sensing region, 243: control circuit, 248: control portion, 249: component, 250: sensing portion, 290: communication portion, 501C: insulating film, 501D: insulating film, 504: conductive film, 506: insulating film, 508: semiconductor film, 508A: region, 508B: region, 508C: region, 510: base, 512A: conductive film, 512B: conductive film, 516: insulating film, 518: insulating film, 519B: terminal, 520: functional layer, 521: insulating film, 524: conductive film, 528: insulating film, 530G: pixel circuit, 530S: pixel circuit, 550G: element, 550R: element, 550S: element, 551G: electrode, 551S: electrode, 552: electrode, 553G: layer, 553S: layer, 573: insulating film, 573A: insulating film, 573B: insulating film, 591G: opening portion, 591S: opening portion, 700: functional panel, 700TP: functional panel, 702B: pixel, 702G: pixel, 702R: pixel, 702S: pixel, 703: pixel, 705: sealant, 720: functional layer, 770: base, 770P: functional film, 771: insulating film, 802: sensor, 5200B: data processing device, 5210: arithmetic device, 5220: input/output device, 5230: display portion, 5240: input portion, 5250: sensing portion, 5290: communication portion This application is based on Japanese Patent Application Serial No. 2019-187631 filed on Oct. 11, 2019, the entire contents of which are hereby incorporated herein by reference.

The invention claimed is:
1. A functional panel comprising:
a convex lens;
an insulating film;
a first region configured to emit first light of a first light emitting element; and
a second region configured to emit second light of a second light emitting element,
wherein the insulating film is interposed between the convex lens and at least one of the first region and the second region,
wherein the convex lens and the first region overlap each other,
wherein the convex lens and the second region overlap each other,
wherein the convex lens has a first length in a first direction,
wherein the convex lens has a second length in a second direction,
wherein the second direction is perpendicular to the first direction,
wherein the first length is larger than the second length,
wherein the first region and the second region are aligned in the first direction,
wherein the convex lens has a first refractive index N1,
wherein the convex lens comprises a first surface and a second surface,
wherein the convex lens comprises a first cross section on a first plane,
wherein the first surface forms a first curve in the first cross section,
wherein the first curve has a first radius of curvature R1,
wherein the insulating film is in contact with the second surface,
wherein a distance L1 is a distance between the first region and the second surface,
wherein the distance L1 has a relationship represented by Formula (i) with the first radius of curvature R1 and the first refractive index N1, and
wherein the Formula (i) is $L1 \leq 5 \times R1/(N1-1)$.
2. The functional panel according to claim 1,
wherein a top surface of the convex lens comprises a flat region.
3. The functional panel according to claim 1, further comprising a sealant,
wherein the sealant is in contact with the first surface,
wherein the sealant has a second refractive index N2,
wherein the second refractive index N2 is lower than the first refractive index N1,
wherein the distance L1 has a relationship represented by Formula (ii) with the first radius of curvature R1, the first refractive index N1, and the second refractive index N2, and
wherein the Formula (ii) is $L1 \leq 5 \times R1 \times N2/(N1-N2)$.
4. The functional panel according to claim 1,
wherein the first refractive index N1 is greater than or equal to 1.5 and less than or equal to 1.8.
5. The functional panel according to claim 1,
wherein the distance L1 is greater than or equal to 0.01 μm and less than or equal to 100 μm.
6. The functional panel according to claim 1,
wherein the distance L1 is greater than or equal to 0.1 μm and less than or equal to 20 μm.
7. The functional panel according to claim 1, further comprising a coloring film between the convex lens and the insulating film.
8. The functional panel according to claim 1,
wherein a color of the first light is different from a color of the second light.
9. A functional panel comprising:
a convex lens;
an insulating film;
a first region configured to emit first light of a first light emitting element; and
a second region configured to emit second light of a second light emitting element,
wherein the insulating film is interposed between the convex lens and at least one of the first region and the second region, wherein the convex lens and the first region overlap each other,
wherein the convex lens and the second region overlap each other,
wherein the convex lens has a first length in a first direction,
wherein the convex lens has a second length in a second direction,
wherein the second direction is perpendicular to the first direction,
wherein the first length is larger than the second length,
wherein the first region and the second region are aligned in the second direction,
wherein the convex lens has a first refractive index N1,
wherein the convex lens comprises a first surface and a second surface,
wherein the convex lens comprises a first cross section on a first plane,
wherein the first surface forms a first curve in the first cross section,
wherein the first curve has a first radius of curvature R1,
wherein the insulating film is in contact with the second surface,
wherein a distance L1 is a distance between the first region and the second surface,
wherein the distance L1 has a relationship represented by Formula (i) with the first radius of curvature R1 and the first refractive index N1, and
wherein the Formula (i) is $L1 \leq 5 \times R1/(N1-1)$.

10. The functional panel according to claim 9, further comprising a sealant,
wherein the sealant is in contact with the first surface,
wherein the sealant has a second refractive index N2,
wherein the second refractive index N2 is lower than the first refractive index N1,
wherein the distance L1 has a relationship represented by Formula (ii) with the first radius of curvature R1, the first refractive index N1, and the second refractive index N2, and
wherein the Formula (ii) is $L1 \leq 5 \times R1 \times N2/(N1-N2)$.

11. The functional panel according to claim 9,
wherein the first refractive index N1 is greater than or equal to 1.5 and less than or equal to 1.8.

12. The functional panel according to claim 9,
wherein the distance L1 is greater than or equal to 0.01 μm and less than or equal to 100 μm.

13. The functional panel according to claim 9,
wherein the distance L1 is greater than or equal to 0.1 μm and less than or equal to 20 μm.

14. The functional panel according to claim 9, further comprising a coloring film between the convex lens and the insulating film.

15. The functional panel according to claim 9,
wherein a color of the first light is different from a color of the second light.

16. The functional panel according to claim 9,
wherein a top surface of the convex lens comprises a flat region.

* * * * *